US012684795B2

(12) United States Patent
Chan et al.

(10) Patent No.: US 12,684,795 B2
(45) Date of Patent: Jul. 14, 2026

(54) METHOD FOR FORMING A FET DEVICE

(71) Applicant: IMEC VZW, Leuven (BE)

(72) Inventors: Boon Teik Chan, Wilsele (BE); Naoto Horiguchi, Leuven (BE); Julien Ryckaert, Schaerbeek (BE)

(73) Assignee: Imec vzw, Leuven (BE)

( * ) Notice: Subject to any disclaimer, the term of this patent is extended or adjusted under 35 U.S.C. 154(b) by 541 days.

(21) Appl. No.: 18/061,065

(22) Filed: Dec. 2, 2022

(65) Prior Publication Data

US 2023/0178630 A1 Jun. 8, 2023

(30) Foreign Application Priority Data

Dec. 3, 2021 (EP) .................................... 21212150

(51) Int. Cl.
| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |

(Continued)

(52) U.S. Cl.
CPC ........... *H10D 30/014* (2025.01); *H10D 30/43* (2025.01); *H10D 30/6735* (2025.01);

(Continued)

(58) Field of Classification Search
CPC .. H10D 30/014; H10D 30/6735; H10D 30/43; H10D 84/85; H10D 62/121;

(Continued)

(56) References Cited

U.S. PATENT DOCUMENTS

| | | | |
|---|---|---|---|
| 11,164,942 B1 | 11/2021 | Weckx et al. | |
| 2016/0111337 A1 | 4/2016 | Hatcher et al. | |

(Continued)

FOREIGN PATENT DOCUMENTS

WO 2021/232916 A1 11/2021

OTHER PUBLICATIONS

Extended European Search Report for European Patent Application No. 21212150.3, mailed May 10, 2022.

(Continued)

*Primary Examiner* — Jessica S Manno
*Assistant Examiner* — Andrew Chung
(74) *Attorney, Agent, or Firm* — McDonnell Boehnen Hulbert & Berghoff LLP

(57) ABSTRACT

A method for forming a FET device is provided. The method includes: forming a fin structure comprising a layer stack comprising channel layers and non-channel layers alternating the channel layers; etching each of first and second fin parts from each of first and second opposite sides of the fin structure such that a set of source cavities extending through the first fin part is formed in a first set of layers of the layer stack, and such that a set of drain cavities extending through the second fin part is formed in the first set of layers of the layer stack; filling the source and drain cavities with a dummy material; while masking the fin structure from the second side: removing the dummy material by etching from the first side, and subsequently, forming a source body and a drain body, each comprising a respective common body portion and a set of prongs protruding from the respective common body portion into the source and drain cavities, respectively; and while masking the fin structure from the first side: etching a third fin part from the second side such that a set of gate cavities extending through the third fin part is formed in a second set of layers, and subsequently, forming a gate body comprising a common gate body portion and a set of gate prongs protruding from the common gate body portion into the gate cavities.

15 Claims, 34 Drawing Sheets

(51) Int. Cl.

| | |
|---|---|
| *H10D 64/01* | (2025.01) |
| *H10D 84/01* | (2025.01) |
| *H10D 84/03* | (2025.01) |
| *H10D 84/85* | (2025.01) |
| *H10P 30/20* | (2026.01) |
| *H10P 30/22* | (2026.01) |
| *H10P 50/00* | (2026.01) |
| *H10P 50/24* | (2026.01) |

(52) U.S. Cl.
CPC ......... *H10D 62/121* (2025.01); *H10D 62/151* (2025.01); *H10D 64/017* (2025.01); *H10D 84/0167* (2025.01); *H10D 84/017* (2025.01); *H10D 84/038* (2025.01); *H10D 84/85* (2025.01); *H10P 30/204* (2026.01); *H10P 30/21* (2026.01); *H10P 30/22* (2026.01); *H10P 50/242* (2026.01); *H10P 50/691* (2026.01)

(58) Field of Classification Search
CPC .............. H10D 62/151; H10D 64/017; H10D 84/0167; H10D 84/017; H10D 84/038; H10D 30/019–0198; H01L 21/26513; H01L 21/266; H01L 21/3065; H01L 21/308
See application file for complete search history.

(56) References Cited

U.S. PATENT DOCUMENTS

| | | |
|---|---|---|
| 2019/0122937 A1 | 4/2019 | Cheng et al. |
| 2021/0082766 A1 | 3/2021 | Miura et al. |

OTHER PUBLICATIONS

Weckx et al., "Novel Forksheet Device Architecture as Ultimate Logic Scaling Device Towards 2nm," 2019 IEEE International Electron Devices Meeting (IEDM), IEEE, Dec. 7, 2019, XP033714586.

C-C'

A-A'

C-C'                                              1010

A-A'          1010

C-C´

A-A´

METHOD FOR FORMING A FET DEVICE

CROSS-REFERENCE

This application claims priority from European patent application no. EP 21212150.3, filed Dec. 3, 2021, which is incorporated by reference in its entirety.

TECHNICAL FIELD

The present disclosure relates to a method for forming a field-effect transistor (FET) device.

BACKGROUND OF THE PRESENT DISCLOSURE

Moore's law, that sets the footprint area of a transistor to scale by a factor 2, i.e. the transistor gate length L to scale by a factor $\sqrt{2}$, every 2 years, has been the driving force of the electronic industry, scaling the length of a transistor to its limits. Today, the minimal distance between the gate of two subsequent transistors, a measure known as contacted poly pitch (CPP) or gate pitch (CGP), has been scaled to approximately 50 nm. Device parameters limiting further CPP scaling include gate length, source/drain contact area and gate spacer width.

SUMMARY OF THE PRESENT DISCLOSURE

An objective of the present disclosure is to provide a method for forming a semiconductor device, in particular a FET device, with a novel design which may enable further CPP scaling. Additional and alternative objectives may be understood from the following.

According to an aspect, a method is provided for forming a FET device, the method comprising:

forming a fin structure comprising a layer stack comprising channel layers and non-channel layers alternating the channel layers, the fin structure comprising a first fin part, a second fin part and a third fin part intermediate the first and second fin parts;

etching each of the first and second fin parts laterally from each of first and second opposite sides of the fin structure such that a set of source cavities extending through the first fin part is formed in a first set of layers of the layer stack, and such that a set of drain cavities extending through the second fin part is formed in the first set of layers of the layer stack;

filling the source and drain cavities with a dummy material;

while masking the fin structure from the second side:

removing the dummy material from the source and drain cavities by etching from the first side, and subsequently (e.g. while still masking the fin structure from the second side), forming a source body and a drain body, each comprising a respective common body portion along the first side and a set of prongs protruding from the respective common body portion into the source and drain cavities, respectively, and abutting the channel layers; and while masking the fin structure from the first side:

etching the third fin part laterally from the second side such that a set of gate cavities extending through the third fin part is formed in a second set of layers of the layer stack, the second set of layers being different from the first set of layers, and subsequently (e.g. while still masking the fin structure from the first side), forming a gate body comprising a common gate body portion along the second side and a set of gate prongs protruding from the common gate body portion into the gate cavities.

The method of the present aspect enables fabrication of a FET device comprising a common gate body portion and common source and drain body portions wherein the common gate body portion is located on opposite sides (i.e. laterally opposite sides) with respect to the common source and drain body portions. In other words, the common gate body portion may be laterally/horizontally offset with respect to the common source and drain body portions. Meanwhile, the gate prongs may be offset vertically with respect to the source and drain prongs. In other words, the source and drain prongs and the gate prongs may be located at different vertical levels (e.g. above an underlying substrate). In a conventional FET, the source/drain terminals and the gate terminal are separated by a spacer of a certain minimum length $L_S$, in order to sufficiently electrically separate the gate from the source/drain, that appears twice in the CPP of a conventional FET device. This separation may be reduced or even omitted in a device formed in accordance with the method according to the present aspect.

The opposite-side arrangement of the source/drain and gate body portions is facilitated by removing the dummy material and forming the source/drain bodies while masking the fin structure from the second side, and by forming the gate cavities and the gate body while masking the fin structure from the first side. Deposition of source/drain body material at the second side and of gate material at the first side may accordingly be counteracted.

As used herein, the phrase "masking the fin structure from a first/second side" will be understood as covering the fin structure from the first/second side such that the processing may be applied selectively to the opposite side (e.g. second/first) of the fin structure, e.g. such that etching from, forming of a source/drain or gate body, or material deposition at the opposite side is counteracted or prevented.

During the etching of the first and second fin parts to form the source and drain cavities, the third fin part may be masked from both the first and second sides. During the removing of the dummy material and the forming of the source and drain bodies, the third fin part may be masked from both the first and second sides. During the etching of the third fin part, and the forming of the gate body, the first and second fin parts may be masked from both the first and second sides.

The method may comprise forming a first mask structure for masking the fin structure, the masking structure covering the third fin part from the first and the second side, and defining openings exposing each of the first and second fin parts from each of the first and second sides. The method may subsequently comprise, while masking the fin structure using the first mask structure, conducting said etching of each of the first and second fin parts to form the source and drain cavities. The first and second fin parts may accordingly be laterally etched back from the first and second sides through the openings in the first mask structure.

The method may comprise forming a second mask structure for masking the fin structure, the masking structure covering the first, second and third fin parts from the second side, the third fin part from the first side, and defining openings exposing the first and second fin parts from the first side. The method may subsequently comprise, while masking the fin structure using the second mask structure, conducting said removing of the dummy material, and conducting said forming of the source body and drain body. The dummy material in the source/drain cavities of the first and second fin parts may accordingly be laterally etched back from the first side through the openings in the second mask structure. Correspondingly, the respective common body portions of the source and drain bodies may be formed along the first side of the first and second fin parts.

The method may comprise forming a third mask structure for masking the fin structure, the masking structure covering the first, second and third fin parts from the first side, the first and second fin parts from the second side, and defining an opening exposing the third fin part from the second side. The method may subsequently comprise, while masking the fin structure using the second mask structure, conducting said etching of the third fin part, and conducting said forming of the gate body. The third fin part may accordingly be laterally etched back from the second side through the opening in the third mask structure. Correspondingly, the common gate body portion may be formed along the second side of the third fin part.

To facilitate the lateral processing (e.g. etching) of the fin parts, each of the first, second and third mask structures may further cover the fin structure (e.g. each of the first, second and third fin parts) from above.

The mask structures may be provided in various ways:

According to some embodiments, the first mask structure may be provided by depositing a cover material deposited along the first and second sides of the fin structure and defining openings or trenches therein to expose the first and second fin parts from each of the first and second sides. For example, the cover material may be a conformally deposited material, e.g. forming a liner layer. The cover material may also be an insulating material or a process material deposited to embed the fin structure. As used herein the term "trench" is to be understood as an opening or hole formed in a deposited material, e.g. the cover material.

According to some embodiments, the second mask structure may be provided by depositing a cover material deposited along the first and second sides of the fin structure and defining openings or trenches therein to expose the first and second fin parts from the first side. For example, the cover material may be a conformally deposited material, e.g. forming a liner layer. The cover material may also be an insulating material or a process material deposited to embed the fin structure.

According to some embodiments, the third mask structure may be provided by depositing a cover material deposited along the first and second sides of the fin structure and defining a trench therein to expose the third part from the second side. For example, the cover material may be an insulating material or a process material deposited to embed the fin structure.

The fin structure may further comprise a capping layer of a hardmask material (e.g. a top-most layer of the layer stack). The capping layer may accordingly mask the fin structure from above during each of the processing steps. The capping layer may, for instance, form part of any of the mask structures mentioned herein.

By laterally etching a fin part from the first and/or second side, cavities extending through (e.g., completely through along a width dimension of the fin structure) and across the fin part may be formed. A "lateral" etching is hereby to be understood as an etching oriented within a plane of extension of the layers of the stack.

As may be appreciated, a lateral etching may typically be achieved by an isotropic etching process. An isotropic etching may have a tendency to cause a curved or rounded etch front of a layer being etched. Consequently, a dimension of an isotropically etched cavity may vary along a width dimension of the fin structure. According to the method, the first and the second fin parts are etched laterally from each of the first and second sides, e.g. simultaneously. A variation of the dimension of the source and drain cavities may thus be reduced compared to a one-sided cavity etch. This may, in turn, facilitate control of channel length in the finished FET device.

By further filling the source and drain cavities with a dummy material, and, while masking the fin structure (e.g. the first, second and third fin parts) from the second side, removing the dummy material by etching from the first side and subsequently forming the source and drain bodies, the merits of the two-sided etching of the first and second fin parts may be preserved while counteracting forming of the source and drain bodies along the second side.

The method of the present aspect may be used to form a FET device of either a first type or a second type. To form the first type of FET device, the non-channel layers may comprise first non-channel layers and second non-channel layers alternating the first non-channel layers, wherein the first set of layers (in which the source and drain cavities are formed) may be defined by the first non-channel layers, and the second set of layers (in which the gate cavities are formed) may be defined by the second non-channel layers. To form the second type of FET device, the first set of layers (in which the source and drain cavities are formed) may be defined by the channel layers, and the second set of layers (in which the gate cavities are formed) may be defined by the non-channel layers. Various embodiments of forming the first and second types of FET devices will be set out in the following.

As used herein, the term "horizontal" indicates an orientation or a direction in a horizontal plane, i.e. parallel to (a main plane of extension) of a substrate on which the fin structure is formed. The term "vertical" refers to a direction along a height direction of the fin, e.g. corresponding to the stacking direction of the layers of the layer stack, or equivalently normal to a (main plane of extension of) the substrate.

The wording "first/second sides of the fin structure" will be understood to indicate the opposite lateral sides of the fin structure, i.e. extending along a longitudinal dimension of the fin structure.

As used herein, the term "source/drain prong" refers to a portion (e.g. layer-shaped) of the source/drain body protruding from the common source/drain body portion to a respective free end. The term "gate prong" correspondingly refers to a portion (e.g. layer-shaped) of the gate body protruding from the common gate body portion to a respective free end.

When reference is made to a pair of a source prong and a drain prong (or shorter, a pair of source and drain prongs), reference is made to a source prong and a drain prong arranged in abutment with a same channel layer. The pair of source and drain prongs may in particular refer to source and drain prongs arranged at a same level over the substrate.

According to embodiments, the method may further comprise, subsequent to the filling of the source and drain cavities with the dummy material:

depositing a cover material along the first and second sides of the fin structure; and forming openings in the second cover material along the first and second fin parts to expose each of the first and second fin parts from only the first side.

The method may subsequently comprise conducting the removing of the dummy material and the forming of the source and drain bodies via the openings in the second cover material.

This allows exposing respective side surface portions of each of the first and second fin parts from only the first side, while the opposite side surface portions of the first and second fin parts remain covered, as well as opposite side surface portions of the third fin part.

The cover material may be conformally deposited. The second cover material may form a liner layer, covering the fin structure from the first and second sides and defining openings only along the first side, more specifically along the side surface portions of each of the first and second fin parts.

According to embodiments, the method may further comprise forming a gate trench along the third fin part to expose the third fin part from only the second side, wherein the gate trench is formed in an insulating material deposited along the first and second sides of the fin structure. The etching of the third fin part and the forming of the gate body may subsequently be conducted via the gate trench.

The forming of a gate trench allows the third fin part to be selectively accessed and etched to form the gate cavities from only the second side of the fin structure. The gate trench further facilitates forming of the gate body in that one or more gate materials may be deposited in the gate cavities and in the gate trench.

According to embodiments, the etching of the third fin part and the forming of the gate body may be conducted subsequent to forming the source and drain bodies, and wherein the method may comprise depositing the insulating material to embed the fin structure and the source and drain bodies.

According to embodiments, forming the source and drain bodies may comprise epitaxially growing a source/drain material in the set of source cavities and the set of drain cavities to form prongs therein, and further growing the source/drain material on the prongs such that the source/drain material merges to form a respective common body portion of the source and drain bodies. The common source and drain body portions may hence be formed as merged epitaxial semiconductor bodies.

According to embodiments, the method may further comprise subjecting the first and second fin parts to an ion implantation process while masking the third fin part from the ion implantation process. Doping of the third fin part may hence be counteracted while doping of the first and second parts may be allowed. Forming the set of source cavities and the set of drain cavities may accordingly comprises selectively etching doped material of the first set of layers of the layer stack.

By virtue of the ion implantation process, a longitudinal etch contrast/etch selectivity may be introduced in the layers. Thereby, a tendency of an isotropic etching of the various layers of the layer stack causing a curved or rounded etch front may be reduced. More specifically, the variable doping concentrations enables a reduced etch rate of the un-doped versus doped portions, or vice versa during the cavity etches.

According to embodiments for forming the first type of FET device, the channel layers may be of a channel material and the non-channel layers may be alternatingly first non-channel layers of a first layer material and second non-channel layers of a second layer material. The channel material, the first layer material and the second layer material hereby refers to different materials.

Accordingly, the etching of the first fin part and the second fin part to form the source and drain cavities may comprise selectively etching the first layer material (e.g. etching the first layer material selectively to the second layer material and the channel material). Further, the etching of the third fin part to form the gate cavities may comprise selectively etching the second layer material (e.g, etching the second layer material selectively to the first layer material and the channel material).

The source and drain prongs may thus be offset vertically from both the gate prongs and the channel layers. Accordingly, the gate prongs may be formed at first levels corresponding to the levels of the first non-channel layers, the source and drain prongs may be formed at second levels corresponding to the levels of the second non-channel layers, wherein the channel layers are located at levels intermediate the first and second levels.

The first layer material may be a first dielectric material. A (dielectric) first non-channel layer may hence be provided between each respective pair of source and drain prong. A dielectric first non-channel layer may also be denoted "first dielectric layer".

According to embodiments, forming the fin structure may comprise:

forming a preliminary fin structure comprising the channel layers and non-channel layers alternating the channel layers, the non-channel layers being alternatingly sacrificial layers of a sacrificial semiconductor material and the second non-channel layers of the second layer material;

forming a support structure in abutment with the preliminary fin structure; and while the support structure supports the preliminary fin structure, replacing the sacrificial layers with the first non-channel layers.

The sacrificial material hereby refers to a semiconductor material different from each of the channel material, the first layer material, the second layer material and the channel material.

Replacing the sacrificial layers with the first non-channel layers may comprise:

removing the sacrificial layers from the preliminary fin structure by selectively and laterally etching the sacrificial material, thereby forming longitudinal gaps in the preliminary fin structure, and filling the gaps with the first dielectric material.

According to some embodiments, forming the support structure may comprise: depositing a process material embedding the preliminary fin structure; and forming a trench in the process material, alongside the preliminary fin structure. The sacrificial layers may subsequently be removed from the preliminary fin structure by selectively etching (e.g. laterally) the sacrificial material from the trench in the process material, thereby forming the gaps in the preliminary fin structure.

The second layer material may be a second semiconductor material different from the channel material. The second semiconductor material may further be different from the above-mentioned sacrificial material. The preliminary fin structure may hence comprise a stack of semiconductor layers.

According to embodiments, the method may further comprise, prior to forming the source and drain cavities:

etching (e.g. selectively etching the second layer material) each of the first and second fin parts laterally from each of the first and second sides such that a set of (second) cavities extending through (e.g. completely through) the first and second fin parts is formed in the second non-channel layers, and filling the (second) cavities with a second dielectric material to form (second) dielectric layers in the (second) cavities.

Each gate prong may thus be formed at a location in the fin structure between a respective pair of second dielectric layers. Each second dielectric layer may provide (electric) insulation between mutually opposite surface portions of neighboring channel layers abutting different pairs of source and drain prongs.

During the etching of the first and second fin parts to form the second cavities, the third fin part may be masked from both the first and second sides.

The method may comprise forming a fourth mask structure for masking the fin structure, the masking structure covering the third fin part from the first and the second side, and defining openings exposing each of the first and second fin parts from each of the first and second sides. The method may subsequently comprise, while masking the fin structure using the fourth mask structure, conducting said etching of each of the first and second fin parts to form the second cavities. The first and second fin parts may accordingly be laterally etched back from the first and second sides through the openings in the fourth mask structure.

According to some embodiments, the etching of the third fin part to form the gate cavities may comprise selectively etching the second layer material from the second side to remove the second layer material remaining between the second dielectric layers.

As the second cavities are formed in a double-sided cavity etch (see above discussion regarding isotropic etching), a variation of the dimension of gate cavities along the width dimension of the fin structure may be reduced compared to a one-sided cavity etch, although the gate cavities are formed using a one-sided cavity etch. This may further facilitate control of channel length in the finished FET device.

According to some embodiments, the source and drain cavities may be etched to extend partly into the third fin part and/or the gate cavities may be etched to extend partly into the first and second fin parts.

Thereby, that the source cavities and the gate cavities may be formed to present a partial overlap as viewed along a vertical direction, and such that drain source cavities and the gate cavities present a partial overlap as viewed along the vertical direction.

This facilitates forming the gate prongs and source/drain prongs to, in a pairwise manner, overlap a first/second common region of each channel layer. The gate body may hence, in use of the FET device, be configured to, when the FET device is switched to an active state, induce, in each channel layer, an electrostatic doping in the first and second common regions and a channel region extending therebetween. This may be referred to as a "dynamic doping". The first and second common regions may have a respective first doping level when the FET device is inactive, and a respective electrostatically increased second doping level when the FET device is active. Thereby, the doping concentration in the first and second common regions of each channel layer may be effectively increased. A further function of the spacer in a conventional FET is to limit the amount of dopant diffusion into the channel region. The "dynamic doping" allows reducing chemical source and drain doping concentration, further reducing the need for a spacer. In other words, a lower (chemical) doping level of the first and second common regions of each channel layer may hence be used than for the (typically highly chemically doped) source and drain regions of the conventional FET. This may in turn reduce the degradation of the sub-threshold-swing (SS) as the gate length scales down. Moreover, a channel region may be induced to extend completely between the first and second common regions, thereby enabling a reduced short-channel effect (SCE) when down-scaling.

According to embodiments, the method may further comprise subjecting the first and second fin parts to an ion implantation process while masking the third fin part from the ion implantation process. Doping of the third fin part may thus be counteracted while doping of the first and second parts may be allowed. Forming the set of source cavities and the set of drain cavities may accordingly comprises selectively etching doped first layer material. Correspondingly, forming the set of gate cavities may comprise selectively etching non-doped second layer material.

By virtue of the ion implantation process, a longitudinal etch contrast/etch selectivity may be introduced in the layers. Thereby, a tendency of an isotropic etching of the first non-channel layers causing a curved or rounded etch front may be reduced. More specifically, the variable doping concentrations enables a reduced etch rate of the un-doped versus doped portions, or vice versa during the cavity etches.

Correspondingly, according to embodiments comprising forming second cavities in the first and second fin parts, as set out above, the forming of the second cavities may comprise selectively etching doped second layer material of the first and second fin parts.

According to embodiments for forming the second type of FET device, the non-channel layers may be of a first layer material and the channel layers may be of a channel material.

Accordingly, the etching of the first fin part and the second fin part to form the source and drain cavities may comprise selectively etching the channel material (e.g, etching the channel material selectively to the first layer material). Forming the set of gate cavities may comprise selectively etching the first layer material (e.g, etching the first layer material selectively to the channel material).

The first layer material may be a first dielectric material. Each gate prong may thus be formed between a respective pair of (dielectric) first layer portions.

According to embodiments, forming the fin structure may comprise:

forming a preliminary fin structure comprising the channel layers and sacrificial layers alternating the channel layers, the sacrificial layers being formed of a sacrificial semiconductor material;

forming a support structure in abutment with the preliminary fin structure; and while the support structure supports the preliminary fin structure, replacing the sacrificial layers with the non-channel layers.

The sacrificial material hereby refers to a semiconductor material different from each of the channel material and the first dielectric material.

Replacing the sacrificial layers with the non-channel layers may comprise:

removing the sacrificial layers from the preliminary fin structure by selectively and laterally etching the sacrificial material, thereby forming longitudinal gaps in the preliminary fin structure, and filling the gaps with the first dielectric material.

According to some embodiments, forming the support structure may comprise: depositing a process material embedding the preliminary fin structure; and forming a trench in the process material, alongside the preliminary fin structure. The sacrificial layers may be subsequently removed from the preliminary fin structure by selectively etching (e.g. laterally) the sacrificial material from the trench in the process material, thereby forming the gaps in the preliminary fin structure.

According to embodiments, the method may further comprise subjecting the first and second fin parts to an ion implantation process while masking the third fin part from the ion implantation process. Doping of the third fin part may thus be counteracted while doping of the first and second parts may be allowed. Forming the set of source cavities and the set of drain cavities may accordingly comprise selectively etching doped channel material. Correspondingly, forming the set of gate cavities may comprise selectively etching non-doped portions of the first layer material (e.g. the first dielectric).

By virtue of the ion implantation process, a longitudinal etch contrast/etch selectivity may be introduced in the layers. Thereby, a tendency of an isotropic etching of the second sacrificial layers causing a curved or rounded etch front may be reduced. More specifically, the variable doping concentrations enables a reduced etch rate of the un-doped versus doped portions, or vice versa during the cavity etches.

BRIEF DESCRIPTION OF THE DRAWINGS

The above, as well as additional objects, features and benefits of the present disclosure, will be better understood through the following illustrative and non-limiting detailed description, with reference to the appended drawings. In the drawings like reference numerals will be used for like elements unless stated otherwise.

FIGS. 4a-4b show cross sections of a layer stack 1000 along respective vertical planes C-C' and A-A'. The layer stack 1000 is formed on a substrate 1102. The substrate 1102 may, for instance, be a substrate in accordance with any of the examples provided in connection with substrate 102 of FIG. 1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

FIGS. 20a-20b show a cover material deposited along the first and second sides 1010a, 1010b of the fin structure 1010, thereby forming a mask layer or cover layer 1050 embedding the fin structure 1010. An opening or trench 1051 (e.g. "dummy removal trench") is formed in the cover layer 1050, in each source/drain region 1030 of the fin structure 1010, along the first side 1010a but not along the directly opposite second side 1010b of the fin structure 1010. Openings or trenches 1051 have accordingly been formed in the cover material, along the first and second fin parts 1010s, 1010d, to expose each of the first and second fin parts 1010s, 1010d from only the first side 1010a.

FIG. 27a is a schematic top-down view of a cavity formed in a layer, e.g. layer 1006 or 1022. The cavity is formed by isotropic etching from a single-side of the layer 1006/1022 through from an opening e.g. in liner 1012 (the other side being masked by the liner 1012). Due to the isotropic etching, an inner wall of the cavity is curved. CD represents the width dimension of the layer 1006/1022 (along the Y direction). LID indicates an estimated maximum length dimension of the cavity (along the X direction) for an opening of longitudinal dimension A (along the X direction) assuming the etching is stopped after the etch front reaches the opposite side of the layer 1006/1022. VID indicates an estimated minimum length dimension of the cavity obtained at the side opposite the opening. Accordingly, a variation of longitudinal dimension of the cavity becomes 2CD.

FIG. 27b shows that by etching the layer 1006/1022 from both sides as described above, a variation of a longitudinal dimension of the cavity may be reduced to CD.

FIGS. 28a-28b show a fin structure 2010 may be formed by patterning a preliminary fin structure 2010 in a layer stack 2000 formed on a substrate 2102 (e.g. corresponding to substrate 1102) and comprising an alternating sequence of sacrificial layers 2002 and channel layers 2004.

FIGS. 35a-35b show that while masking the fin structure 2010 from the first side 2010a: forming a set of gate cavities 2060 in the non-channel layers 2022 in a third fin part 2010c by etching the third fin part 2010c laterally from the second side 2010b, and subsequently, forming a gate body 2140.

DETAILED DESCRIPTION OF THE PRESENT DISCLOSURE

In the following, embodiments of methods for forming a FET device of either of a first or second type will be described with reference to the drawings. More specifically, method embodiments for forming a FET device of the first type will be described with reference to FIGS. 4a-4b through 27a-27b. Method embodiments for forming a FET device of the second type will be described with reference to FIGS. 28a-28b through 35a-35b.

Figures 1, 2:
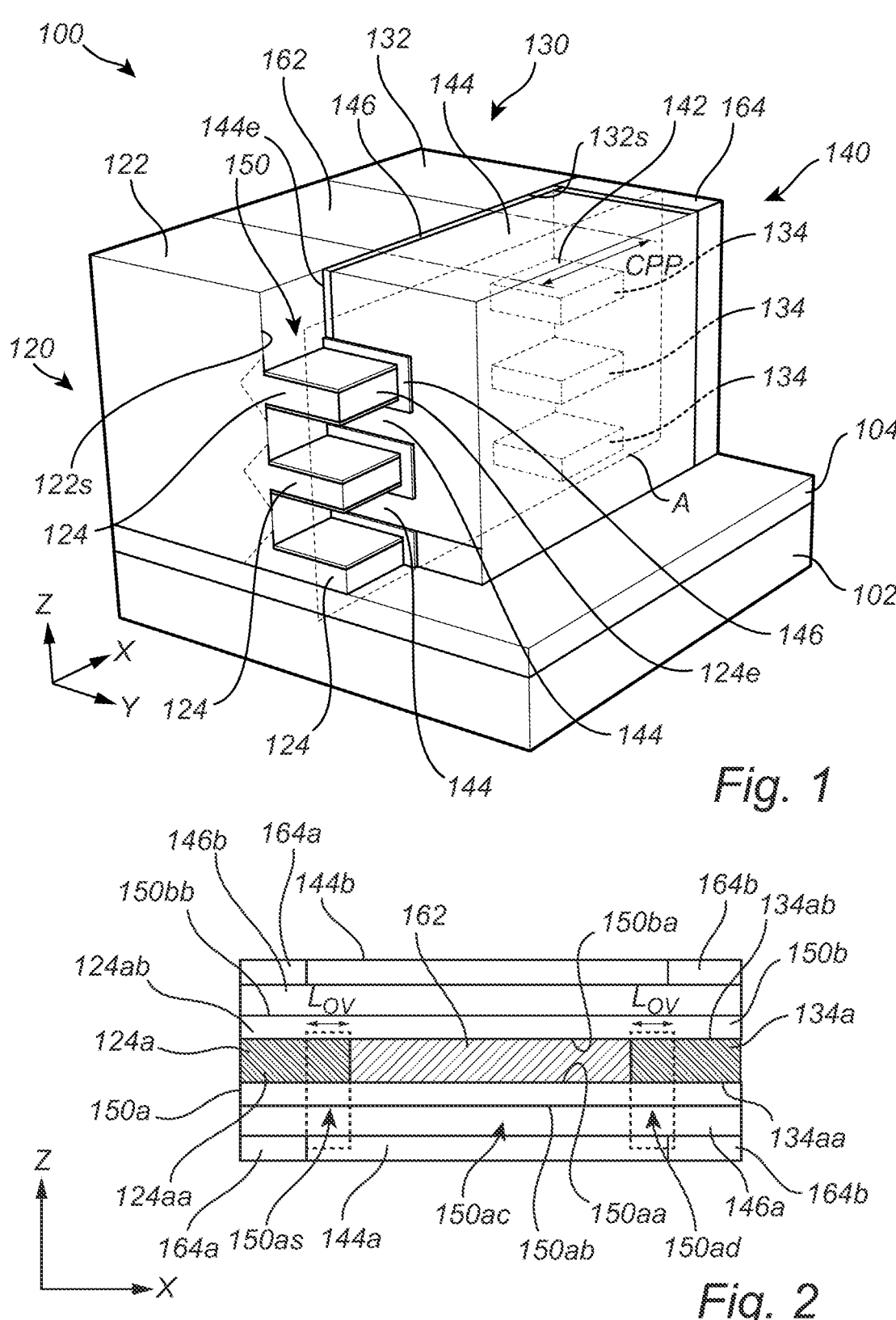
FIG. 1 is a perspective view of a first type of FET device which may be formed using a method according to some embodiments.
FIG. 2 is a cross-sectional view of the FET device of FIG. 1.

FIG. 1 shows in a schematic perspective view a FET device 100 of the first type. The FET device 100 comprises a substrate 102, a source body 120, a drain body 130, and a set of vertically spaced apart semiconductor channel layers, e.g. in the shape of nanosheets, commonly referenced 150. The channel layers 150 are stacked above each other. The channel layers 150 extend between the source body 120 and the drain body 130 in a first horizontal direction (denoted X in the figures) along the substrate 102. The first horizontal direction X corresponds to a channel direction of the FET device 100, i.e. a direction along which current flows between the source and drain bodies 120, 130 when the FET device 100 is in an active state.

The substrate 102 may be a semiconductor substrate, i.e. a substrate comprising at least one semiconductor layer, e.g. of Si, SiGe or Ge. The substrate 102 may be a single-layered semiconductor substrate, for instance, formed by a bulk substrate. A multi-layered/composite substrate 102 is however also possible, an epitaxially grown semiconductor layer on a bulk substrate, or a semiconductor-on-insulator (SOI) substrate. The substrate 102 of FIG. 1 is covered by an insulating layer 104 (e.g. silicon oxide or other conventional inter-layer dielectric material) which however may be omitted if the top surface of substrate 102 already is insulating.

The source body 120 comprises a common source body portion 122 and a set of vertically spaced apart source prongs 124 (vertical direction denoted Z in the figures) protruding from the common source body portion 122 in a second horizontal direction (denoted Y in the figures) transverse to the first horizontal direction X. The drain body 130 comprises a common drain body portion 132 and a set of vertically spaced apart drain layer prongs 134 protruding from the common drain body portion 132 in the second horizontal direction Y. The gate body 140 comprises a common gate body portion 142 and a set of vertically spaced apart gate prongs 144. Each gate prong 144 protrudes from the common gate body portion 142 in a third horizontal direction (opposite/negative Y) into a space above or underneath a respective one of the channel layers 150.

The common source body portion 122 and the common drain body portion 132 are both arranged at a first lateral side of the set of channel layers 150. The common gate body portion 142 is arranged at a second lateral side of the set of channel layers 150, opposite the first lateral side. FIG. 1 indicates a geometrical plane A. The plane A is a vertically oriented plane (i.e. parallel to the XZ-plane) and extends through the set of channel layers 150 along the first horizontal/channel direction X. The common source and drain body portions 122, 132 and the common gate body portion 142 are accordingly arranged at mutually opposite sides of the plane A, thereby establishing a lateral/horizontal offset between the common source and drain body portions 122, 132 and the common gate body portion 142.

Each channel layer 150 is arranged in abutment with and extends in the X direction between a respective pair of a source prong 124 and a drain prong 134, e.g. the source and drain prong 124, 134 being arranged at a same vertical level over the substrate 102. Each channel layer 150 comprises a first side arranged in abutment with the respective pair of source and drain prongs 124, 134, and a second side opposite the first side and facing a respective gate prong 144. More specifically, each channel layer 150 may as shown either be arranged with the first side (e.g. an underside of the channel layer) in abutment with a respective topside of a pair of source and drain prongs 124, 134, or with the first side (e.g. a topside of the channel layer) in abutment with a respective underside of a pair of source and drain prongs 124, 134. As may be appreciated from FIG. 1, a topside of a source or drain prong 124, 134, or a channel layer 150 may refer to a side of a prong/channel layer facing away from the substrate 102 while an underside may refer to a side of a prong/channel layer facing the substrate 102.

The source and drain bodies 120, 130 may be semiconductor bodies, e.g. comprising semiconductor common body portions 122, 132 and semiconductor source/drain prongs 124, 134. Epitaxially grown group IV (e.g. Si, Ge, SiGe) and group III-V (e.g. InP, InAs, GaAs, GaN) semiconductors are a few possible examples. The source and drain bodies 120, 130 may alternatively be metal bodies wherein the common source and drain body potions 122, 132 may be formed of metal and the source and drain prongs 124, 134 may be formed of metal. Example metals include W, Al, Ru, Mo or Co. The source and drain bodies 120, 130 may in this case additionally comprise a barrier metal layer, e.g. Ta, TiN or TaN, enclosing a bulk material of the respective bodies 120, 130 (such as any of the afore-mentioned metals). The source and drain bodies 120, 130 may also be combined metal and semiconductor bodies, e.g. comprising metal and semiconductor common body portions 122, 132 and semiconductor source and drain prongs 124, 134 (e.g. epitaxially grown). Such a configuration is depicted in FIG. 1 wherein the common source body portion 122 is shown to abut and enclose faceted (dashed lines) ends of the semiconductor source prongs 124. The shape of the facets is merely exemplary and will generally depend on the lattice structure of the semiconductor material and growth conditions of the epitaxy. As may be appreciated, semiconductor source and drain bodies 120, 130 may be obtained by continuing the growth such that the growth fronts of the source prongs 124 and drain prongs 134, respectively, merge to form the common source and drain body portions 122, 132. The source and drain prongs 124, 134 (and the common source and drain bodies 122, 132 if made of semiconductor material) may each be doped (e.g. in-situ during epitaxy) with a dopant appropriate for the intended type of the device (e.g. n-type FET or p-type FET).

The thickness of the source and drain prongs 124, 134 may for example be in the range of 2 nm to 5 nm. As may be appreciated, thinner prongs may enable stacking of more channel layers 150, which may be beneficial as the total height of the full device stack typically is constrained. Conversely, thicker prongs may reduce resistance which means that the thickness of the prongs tend to be a trade-off.

The channel layers 150 may be formed as thin-film layers. Each channel layer may be formed by a 2D material such as a transition metal dichalcogenide ($MX_2$) or IGZO. However, channel layers of semiconductor materials such as semiconductors of group IV (e.g. Si, Ge, SiGe) or group III-V (e.g. InP, InAs, GaAs, GaN) are also possible.

The gate body 140 may be a metal body. The common gate body 142 and the gate prongs 144 may be formed of metal. Example metals include one or more gate work function metal (WFM) layers and/or a gate electrode fill layer. Examples of gate WFM material include conventional n-type and p-type effect WFM metals, such as TiN, TaN, TiAl, TiAlC or WCN, or combinations thereof. Examples of gate fill material gate include W and Al. A gate dielectric layer 146 is provided, separating the gate body 140 from the channel layers 150 and the source and drain layer prongs 124, 134. The gate dielectric layer 146 may be a conventional gate dielectric of a high-k, such as $HfO_2$, LaO, AlO and ZrO.

As further shown in FIG. 1, a distal end 144e of each gate prong 144 may be separated from a respective side surface/ sidewall surface 122s, 132s of the common source and drain body portions 122, 132 by at least the thickness of the gate dielectric layer 146. Further separation may be provided by a further (not shown) dielectric spacer. The thickness (along the Y direction) of the dielectric material may by way of example be about 5 nm or greater. Meanwhile, a distal end 124e of each source prong 124 (and correspondingly the distal end of each drain prong 134) may be separated from a respective sidewall surface of the common gate body portion 142 by at least the gate dielectric layer 146 and possibly a further dielectric spacer. To accommodate for the respective dielectric separation, a horizontal separation, along the Y direction, between the common gate body portion 142 and the common source and drain body portions 122, 132 may exceed a respective length of the gate prongs 144 and source/drain layer prongs 124, 134.

FIG. 1 additionally shows an insulating layer 162 or "insulating wall" separating the source body 120 from the drain body 130 along the X direction.

FIG. 1 additionally shows an insulating layer 164 delimiting a length dimension of the gate body 140 along the X direction. The insulating layer 164 may separate the gate body 140 from the gate body of a further FET device provided after and aligned with the device 100, as viewed along the first horizontal direction X. A corresponding insulating layer may be provided at the source side. Accordingly, first and second dielectric layer portions (formed by the layer 164) may be arranged in the spaces between the source and drain layer prongs 124, 134 such that each gate prong 144 is arranged intermediate a respective pair of first and second dielectric layer portions (see portions 164a, b in FIG. 2). The insulating layers 162 and 164 may each be formed of an oxide or nitride, such as $SiO_2$, SiN, SiCBN, SiCON or SiCO.

Figure 3:
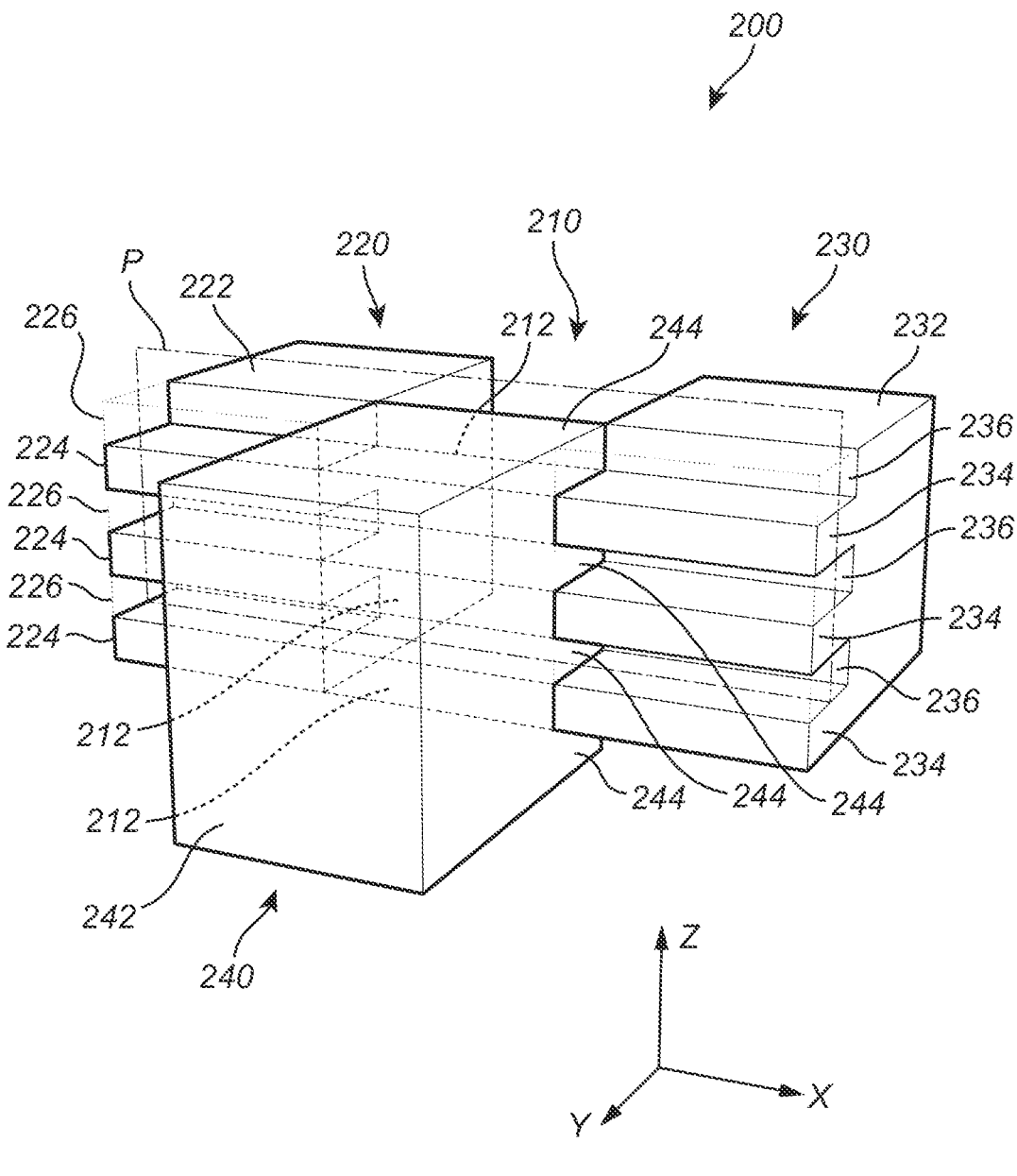
FIG. 3 is a perspective view of a second type of FET device which may be formed using a method according to some embodiments.

FIG. 3 shows in a schematic perspective view a FET device 200 of the second type. The definition of the axes X, Y and Z indicated in FIG. 3 correspond to those provided in FIG. 1. Although omitted from FIG. 3, the FET device 200 may comprise a substrate similar to any of the examples of substrates provided in connection with FIG. 1.

The device 200 comprises a source body 220. The source body 220 comprises a common source body portion 222 and a set of vertically spaced apart source prongs 224 protruding from the common source body portion 222 along the Y direction. The device 200 further comprises a drain body 230. The drain body 230 comprises a common drain body portion 232 and a set of vertically spaced apart drain prongs 234 protruding from the common drain body portion 232 along the Y direction. The source and drain prongs 224, 234 may each be formed of semiconductor material, e.g. epitaxially grown semiconductor material, such as of Si or SiGe, and doped with n-type or p-type dopants, in accordance with the conductivity type of the device 200. The common source and drain body portions 222, 232 may each comprise or be formed of semiconductor material. The common source and drain body portions 222, 232 may e.g. be formed as respective epitaxial semiconductor body portions, such as of a same material as the source and drain layer prongs 124, 134. The common source and drain body portions 222, 232 may alternatively be formed as metal-comprising body portions, in contact with and merging the source and drain prongs 224, 234, respectively. The common body portions 222, 232 may for example be formed of W, Al, Ru, Mo or Co. The common body portions 222, 232 may further comprise a barrier metal layer, e.g. Ta or TaN.

The device 200 comprises a set of vertically spaced apart channel layers 212. Each channel layer 212 extends horizontally (along the Y direction) between a respective pair of source and drain prongs 224, 234. The source and drain prongs 224, 234 and the channel layers 212 may each be formed with a nanosheet-shape. The channel layers 212 may be formed of a semiconductor, such as a Si-comprising semiconductor. The channel layer 212 may for example be formed Si or SiGe layers. These materials are however only examples and it is contemplated that also other semiconductors may be used, such as Ge.

The device 200 further comprises a gate body 240 comprising a common gate body portion 242 and a set of vertically spaced apart gate prongs 244. The gate prongs 244 protrude from the common gate body portion 242 in a direction opposite to the source and drain prongs 224, 234, i.e. along the negative Y direction. The gate prongs 244 extend to overlap the channel layers 212 such that the channel layer portions 212 are arranged in spaces between the gate prongs 244.

Dielectric layer portions 226, 236 are arranged in the spaces between the source and drain prongs 224, 234, respectively. Each gate prong 244 is thus formed (horizontally) intermediate a respective pair of dielectric layer portions 226, 236. The dielectric layer portions 226, 236 may comprise an oxide or a nitride material, such as $SiGeO_x$, $SiO_2$, SiN or SiCO.

As shown in FIG. 3, the common source and drain body portions 222, 232 and the common gate body portion 242 are accordingly arranged at mutually opposite sides of a geometrical vertical plane P, wherein the plane P is defined to extend through the channel layers 212 and source and drain prongs 224, 234. Accordingly, the first type of FET device 100 and the second type of FET device 200 have as a common feature a common gate body portion 142/242 arranged at a laterally opposite side to the common source and drain body portions 122/222, 132/232. Additionally, the gate prongs 144, 244 are offset vertically with respect to the source and drain prongs 124/224, 134/234. As discussed above, this design enables further CPP scaling (the CPP of device 100 being indicated in FIG. 1). The CPP of the devices 100, 200 may be, by way of example, in the range of 20 to 50 nm.

However, while the source and drain prongs 224, 234 of the FET device 200 are level with the channel layers 112, the source and drain prongs 124, 134 of the FET device 100 are offset vertically from both the gate prongs 144 and the channel layers 150. This facilitates a device design wherein a gate prong 144 and a source or drain prong 124, 134 may be arranged to overlap with a common region of a channel layer such that the first common region is located vertically between the source or drain prong and the gate prong. Such an overlap may be more readily seen in FIG. 2 which is a cross-sectional view of the device 100, showing a portion of a section taken along plane A and comprising a pair of source and drain prongs 124a, 134a and a pair of channel layers 150a, 150b. The pair of channel layers 150a, 150b are arranged in abutment/direct contact with the pair of source and drain prongs 124a, 134a from mutually opposite sides, such that the pair of prongs 124a, 134a are sandwiched between the pair of channel layers 150a, 150b. The pair of source and drain prongs 124a, 134a and the pair of channel layers 150a, 150b are in turn arranged in a space between a pair of gate prongs 144a, 144b.

The channel layer 150a (representing a lower channel layer of the pair) comprises a first side 150aa (e.g. forming a topside of the channel layer 150a) arranged in abutment with an underside 124aa of the source prong 124a and an underside 134aa of the drain prong 134a. The channel layer 150a comprises a second side 150ab (e.g. forming an underside of the channel layer 150a), oppositely oriented with respect to the first side 150aa, and facing a gate prong 144a. The gate prong 144a extends along the second side 150ab, i.e. in the X direction. The gate dielectric layer 146a is sandwiched between the gate prong 144a and the channel layer 150a. Correspondingly, the channel layer 150b comprises a first side 150ba (e.g. forming an underside of the channel layer 150b), arranged in abutment with a topside 124ab of the source prong 124a and a topside 134ab of the drain prong 134a. The channel layer 150b comprises a second side 150bb (e.g. forming a topside of the channel layer 150b), oppositely oriented with respect to the first side 150ba, and facing a gate prong 144b. The gate prong 144b extends along the second side 150bb, i.e. in the X direction. The gate dielectric layer 146b is sandwiched between the gate prong 144b and the channel layer 150b. Further shown in FIG. 2 is a spacer layer 162 arranged level with and between the pair of source and drain prongs 124a, 134a. The spacer layer 162 may be formed as an insulating layer such that the channel layers 150a, 150b may be electrically insulated from each other along the length of their respective channel regions 150ac, 150bc.

As indicated by the dashed line boxes in FIG. 2, the gate prong 144a and the source prong 124a may be arranged to overlap with a first common region 150as of the channel layer 150a such that the first common region 150as is located vertically between the source prong 124a and the gate prong 144a. Moreover, the gate prong 144a and the drain prong 134a may as shown be arranged to overlap with a second common region 150ad of the channel layer 150a, such that that the second common region 150ad is located vertically between the drain prong 134a and the gate prong 144a. $L_{ov}$ (also shown in FIG. 1) indicates the length of the common overlap regions 150as, 150ad, as seen along the X direction. The common overlap regions 150as, 150ad allows dynamic doping of the channel layers 150a, 150b during operation of the device 100, as described above. A corresponding configuration applies to the channel layer 150b wherein the gate prong 144b and the source prong 124a (drain prong 134a) are arranged to overlap with a first (second) common region of the channel layer 150b such that the first (second) common region is located vertically between the source prong 124a (drain prong 134a) and the gate prong 144a. Accordingly, also the channel layer 150b may like the channel layer 150a be dynamically doped during operation of the device 100.

The channel layers 150 may be formed with a uniform intrinsic doping level. Doping diffusion which may result during chemical doping may hence be mitigated. However, the channel layers 150 abutting the source and drain prongs 124, 134 may also be chemically doped to enable even greater source/drain doping concentrations in the active state and reduced contact resistance (e.g. with respect to the common source/drain body portions 122, 132).

As an example, an intrinsic doping level of the channel layers 150 may be $10^{10}$ cm$^{-3}$ to $10^{19}$ cm$^{-3}$, while a chemical (i.e. non-electrostatic) doping may e.g. be in the magnitude of $10^{20}$ cm$^{-3}$. The thickness (i.e. as seen along the vertical Z direction) of the channel layers 150 may, depending e.g. on the material selection, be about 10 nm or less. For example, a thickness in the range from 3 to 7 nm may be used for Si-, SiGe- or Ge-channel layers 150, while 1 nm or less may be appropriate for thin-film layers. If the thickness of the channel layers 150 is sufficiently low, the gate body 140 may induce a channel though the entire thickness of the channel layers 150.

In FIG. 2, the overlap length $L_{ov}$ is the same on the source and the drain side, and also for the channel layers 150a and 150b, but it is contemplated that the lengths $L_{ov}$ of the common overlap regions may be different from each other, e.g. due to process variations etc.

The overlap length $L_{ov}$ may for example be in the range from 1 nm (or less) to 4 nm (or greater). However, a zero overlap length ($L_{ov}=0$) is also envisaged. Such a configuration may be used e.g. in case dynamic doping is not desired or necessary, or in case a sufficiently strong dynamic doping is induced already by a fringing electrical field of the gate body. Regardless of the particular value of the overlap length $L_{ov}$, the design of the device 100 allows a reduced CPP (indicated in FIG. 1) compared to conventional finFET and nanosheet-based devices.

Embodiments of methods for forming a FET device of the first type, e.g. the FET device 100, will now be described with reference to FIGS. 4a-4b through 27a-27b.

FIGS. 4a-4b through 14a-14b depict method steps for forming a fin structure which may be used as a precursor for the subsequent method steps for completing the FET device, as depicted in FIGS. 15a-15b through 27a-27b.

Reference will in the following be made to a first fin part 1010s, a second fin part 1010d and a third fin part 1010c of a fin structure 1010, intermediate the first and second fin parts 1010s, 1010d (e.g. FIG. 10a). The first fin part 1010s corresponds to a part of the fin structure 1010 located in a source region of the FET device to be formed. The second fin part 1010d corresponds to a part of the fin structure 1010 located in a drain region of the FET device to be formed. The third fin part 1010c corresponds to a part of the fin structure 1010 located in a gate region of the FET device to be formed.

The following description will mainly refer to processing steps applied to one set of such first, second and third fin parts 1010s, 1010d, 1010c, to enable forming of one FET device along a fin structure 1010. However, corresponding processing steps may be applied to a number of such sets of fin parts along the fin structure 1010 to allow forming of a number of corresponding FET devices along a same fin structure 1010.

As will be described in further detail, the method comprises etching each of the first and the second fin part 1010s, 1010d of the fin structure 1010 laterally from a first side 1010a and second side 1010b such that a set of source cavities and a set of drain cavities 1048 are formed in the first fin part 1010s and the second fin part 1010d, respectively (e.g. FIGS. 16a-16b through 17a-17b). The cavities 1048 are filled with a dummy material 1049 (e.g. FIGS. 18a-18b through 19a-19b). The dummy material 1049 is then removed from the cavities 1048 while masking the fin structure from the second side 1010b (e.g. FIGS. 21a-21b). Subsequently, a source body 1120s and a drain body 1120d are formed, each comprising a respective common body portion 1122 along the first side 1010a and a set of prongs 1124 protruding from the respective common body portion into the source and drain cavities 1048, respectively (e.g. FIGS. 22a-22b). The method further comprises etching the third fin part 1010c laterally from the second side 1010b such that a set of gate cavities 1060 is formed in the third fin part 1010c (e.g. FIGS. 24a-24b). Subsequently, a gate body 1140 is formed comprising a common gate body portion 1142 along the second side and a set of gate prongs 1144 protruding from the common gate body portion into the gate cavities 1060 (e.g. FIGS. 25a-25b).

Figure 4A:
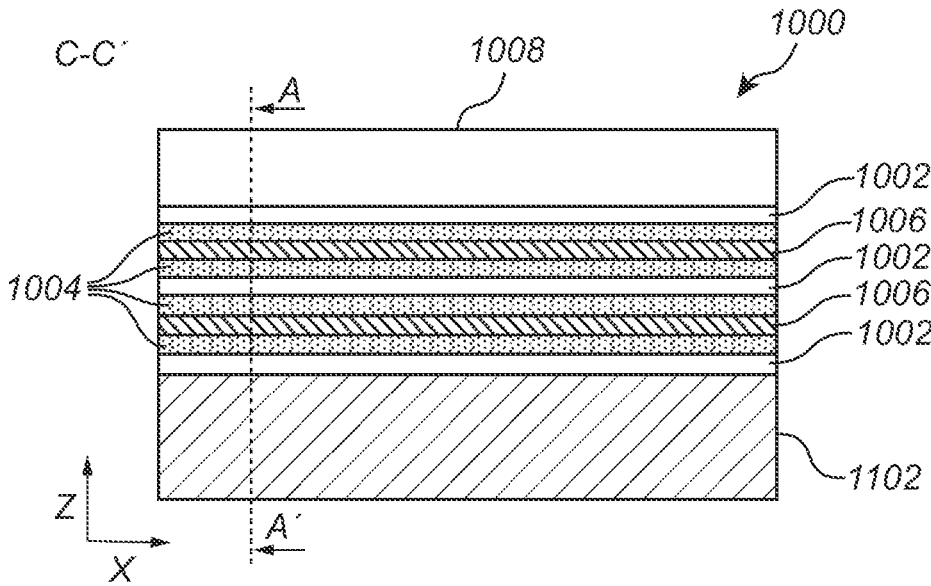
FIGS. 4a-4b through 27a-27b depict steps of a method for forming the first type of FET device.
Figure 4B:
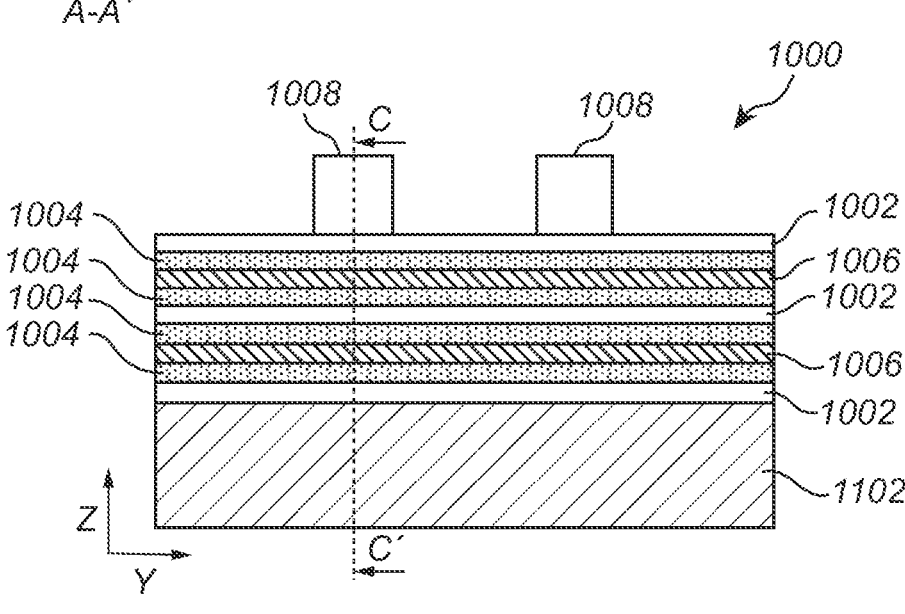

FIGS. 4a-4b depict cross sections of a layer stack 1000 along respective vertical planes C-C' and A-A'. The layer stack 1000 is formed on a substrate 1102. The substrate 1102 may, for instance, be a substrate in accordance with any of the examples provided in connection with substrate 102 of FIG. 1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

Each layer 1002, 1004, 1006 may be formed as a layer of epitaxial (i.e. epitaxially grown/formed/deposited) semiconductor material. The layers 1002, 1004, 1006 may be grown on the substrate 1102 in an epitaxy process, such as physical vapor deposition (PVD) or chemical vapor deposition (CVD).

According to the illustrated example, each first sacrificial layer 1002 is formed of a first semiconductor material, each second sacrificial layer 1006 is formed of a second semiconductor material, and each channel layer 1004 is formed of a third semiconductor material. The first through third semiconductor materials hereby refers to different semiconductor materials, e.g. different epitaxial semiconductor materials. The first semiconductor material may also be denoted "sacrificial semiconductor material". The second semiconductor material may also be denoted "second layer material". The third semiconductor material may also be denoted "channel material".

The first through third semiconductor materials may be chosen to provide an etch contrast between the layers 1002, 1004, 1006. The materials may in particular be chosen to facilitate selective removal of the first sacrificial layers 1002 to the channel layers 1004 and the second sacrificial layers 1006, and subsequently selective removal of the second sacrificial layers 1006 to the channel layers 1004. The term "selective" in connection with "removal" or "etching" of a layer or a material is herein to be understood as a removal of the layer or the material by a selective etching process, wherein a removal rate/etch rate of the layer or the material to be selectively removed/etched exceeds a removal rate/ etch rate of at least one other layer or material exposed to the etching process.

According to some examples, the channel layers 1004 may be formed of $SiGe_x$, the second sacrificial layers 1006 may be formed of $SiGe_y$, and the first sacrificial layers 1002 may be formed of $SiGe_z$, with $0 \leq x < y < z$. The compositions of the first and second sacrificial layers 1002, 1006 may more specifically be $y=x+d_1$ and $z=y+d_2$ with $d_1$, $d_2 \geq 0.25$. These relative proportions of Ge content may facilitate an efficient selective removal. According to some examples, the channel layers 1004 may be formed of Si (i.e. $SiGe_x=0$), the second sacrificial layers 1006 may be formed of $SiGe_{0.25}$ and the first sacrificial layers 1002 may be formed of $SiGe_{0.5}$. More generally, the layers 1002, 1004, 1006 may be formed of any combination of semiconductor materials compatible with the subsequent selective processing steps to be described. For example, the first and second sacrificial layers 1002, 1006 may be SiGe layers as set out above while the channel layers 1004 may be thin-film layers, e.g. formed by a 2D material such as a transition metal dichalcogenide ($MX_2$) or IGZO. Such a stack may be formed using e.g. CVD or layer transfer techniques as per se is known in the art. According to a further example, the layers 1002, 1004, 1006 may be formed of different group III-V semiconductor material.

The number of layers of the depicted layer stack 1000 is merely an example and the number may be smaller or greater than depicted. As may be appreciated from the following, the number of layers of the layer stack 1000 may be selected in accordance with the number of layers, source/ drain prongs and gate prongs desired in the finished FET device (c.f. e.g. channel layers 150, source/drain prongs 124/134 and gate prongs 144 of the device 100).

According to some examples, the layer stack 1000 may comprise, e.g. one or more units of (in the illustrated example one such unit), a consecutive sequence of a (lower) second sacrificial layer 1006, a (lower) channel layer 1004, a first sacrificial layer 1002, a(n) (upper) channel layer 1004 and a(n) (upper) second sacrificial layer 1006. This facilitates forming a FET device comprising a pair of gate prongs, and between the gate prongs, a pair of source and drain prongs and a pair of channel layers in abutment with the pair of source and drain prongs.

Figure 5A:
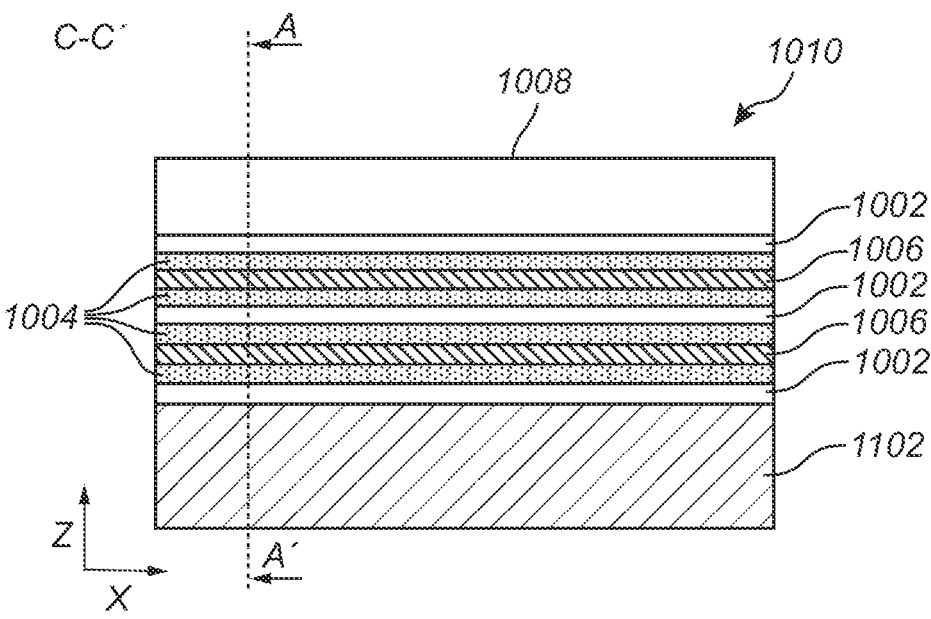
FIGS. 5a-5b show the layer stack 1000 patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the layer stack 1000. That is, each fin structure 1010 comprises an alternating sequence of sacrificial layers 1002, 1006 and channel layers 1004, wherein the sacrificial layers 1002, 1006 are alternatingly first sacrificial layers 1002 and second sacrificial layers 1006.
Figure 5B:
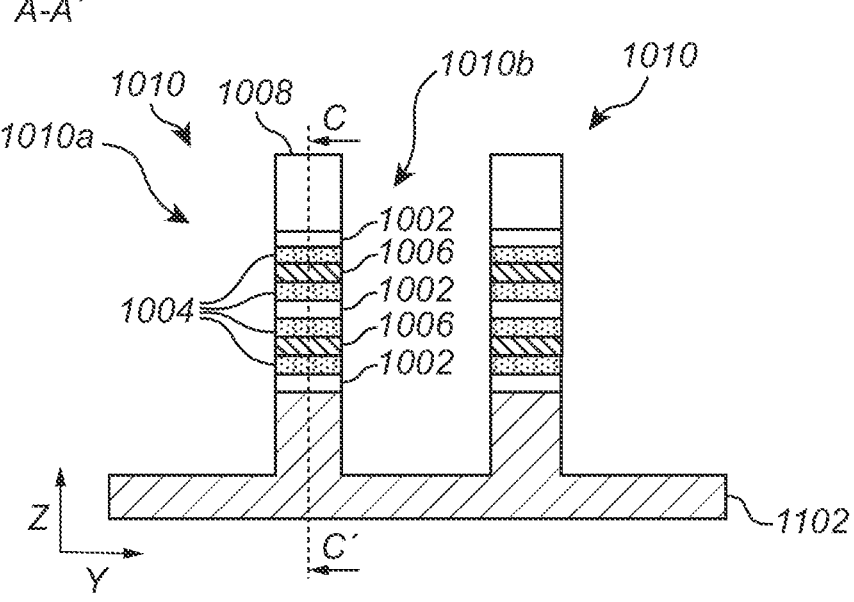

In FIGS. 5a-5b, the layer stack 1000 has been patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the alternating sequence of the layer stack 1000. That is, each fin structure 1010 comprises an alternating sequence of sacrificial layers 1002, 1006 and channel layers 1004, wherein the sacrificial layers 1002, 1006 are alternatingly first sacrificial layers 1002 and second sacrificial layers 1006. The layers 1002, 1004, 1006 may be patterned to define corresponding nanosheets of each fin structure 1010, and may accordingly be referred to as sacrificial nanosheets 1002, 1006 and channel nanosheets 1004. Reference signs 1010a and 1010b denote respectively a first side of the fin structure 1010 and a laterally opposite second side of the fin structure 1010. Reference may in the following also be made to a first/second side surface of the fin structure, which term is to be understood as a (physical) surface of the first/second side 1010a/1010b of the fin structure 1010. For convenience, reference signs 1010a, 1010b may be used to refer to either the first/second sides or the first/second side surfaces of the fin structure 1010, in accordance with the context.

The layer stack 1000 may as shown be patterned by etching the layer stack 1000 while using a mask 1008 (which may be denoted "fin patterning mask 1008" and also is shown in FIGS. 4a and 4b) as an etch mask. Example etching processes for the fin patterning include anisotropic etching (top-down) like reactive ion etching (RIE). The etching of the layer stack 1000 may as shown extend into the substrate 1102. The substrate 1102 may thus be recessed adjacent the fin structures 1010 such that a base portion of each fin structure 1010 is formed in the substrate 1102. Recessing the substrate 1102 in this manner may accommodate for a thicker bottom isolation underneath the source, drain and gate bodies.

The mask 1008 may be formed by a mask material deposited on the layer stack 1000 and then patterned. Example mask materials include nitride materials such as SiN, or another conventional hard mask material suitable for fin patterning, e.g. $SiO_2$ or a-Si. Example patterning techniques for the mask 1008 include single-patterning techniques, e.g. lithography and etching, and multiple patterning techniques, e.g. self-aligned double or quadruple patterning (SADP or SAQP).

The figures depict the mask 1008 as comprising two mask portions, commonly referenced 1008, such that two fin structures 1010 may be formed. The two fin structures 1010 may for example be used to form a complementary pair of FET devices, e.g. an n-type FET and a p-type FET as depicted in FIG. 3. As may be appreciated, mask portions may however be formed in a number corresponding to the number of fin structures 1010 to be formed. In any case, a mask portion 1008 may remain on each fin structure 1010 as a capping during subsequent stages of the method.

Reference will in the following mainly be made to one fin structure 1010 however the following description applies correspondingly to any further fin structures.

Figure 6A:
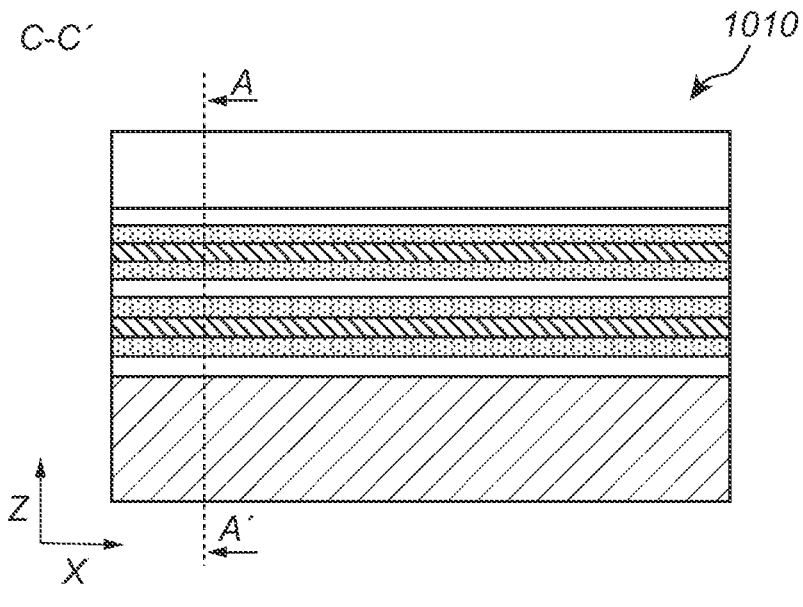
FIGS. 6a-6b show a cover material deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010. The fill layer 1014 may also be denoted "process layer".
Figure 6B:
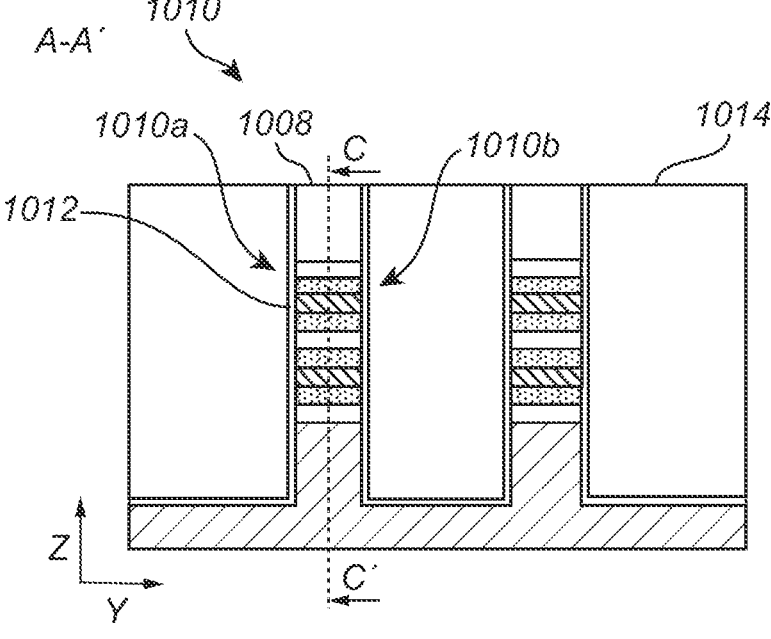

In FIGS. 6a-6b, a cover material has been deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010. The fill layer 1014 may also be denoted "process layer". The liner 1012 may be formed of a dielectric material, for instance, an oxide such as $SiO_2$, or a nitride such as SiN or another low-k dielectric such as SiCO. The liner 1012 may be conformally deposited, e.g. using atomic layer deposition (ALD). The liner 1012 may among others mask the fin structure 1010 from subsequent process steps, such as the formation of the fill layer 1014. The fill layer 1014 may be formed of a fill or process material in the form of a dielectric, e.g. an oxide such as $SiO_2$. The fill layer 1014 may be deposited over the substrate 1102, e.g. using CVD, to embed the fin structure 1010. For example, the fill layer 1014 may be formed of flowable CVD (FCVD) $SiO_2$. After the deposition the fill layer 1014 may be planarized, e.g. using Chemical Mechanical Planarization (CMP). As shown in FIG. 6b, the fill layer 1014 may further be recessed (e.g. by CMP or etch-back) to become flush with an upper surface of the mask portion 1008, or alternatively an upper surface of the fin structure 1010 if the mask portion 1008 is removed. According to some examples, a further recessing may however be omitted such that the fin structure 1010 (and mask portion 1008) remains completely covered by the fill layer 1014. According to some examples, the fill layer 1014 may also be formed by a self-planarizing spin-on layer, e.g. an organic spin-on layer such as spin-on-carbon (SOC), thus obviating the need for a CMP step after deposition.

Figure 7A:
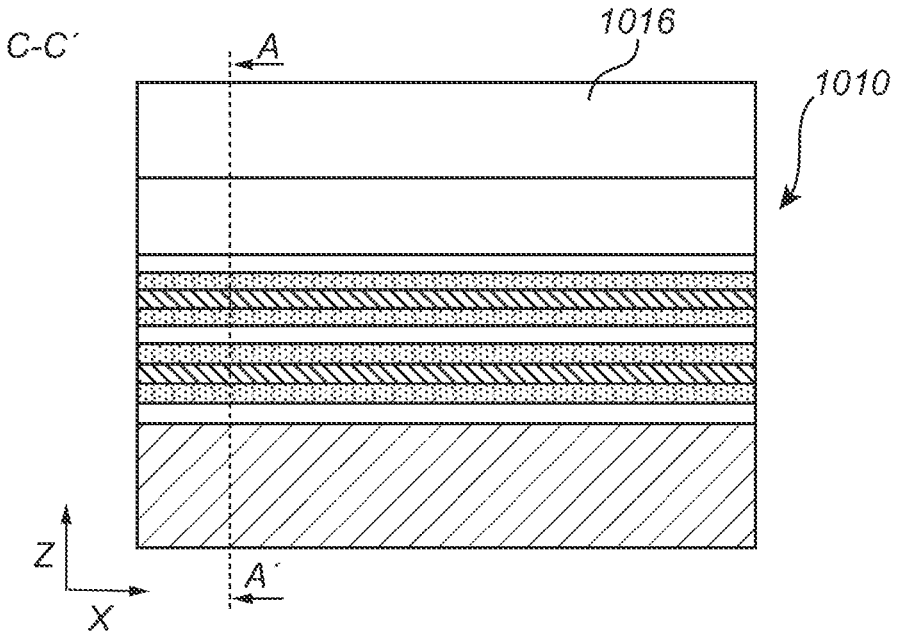
FIGS. 7a-7b show a trench 1018 has been formed alongside the fin structure 1010 to expose the fin structure 1010 from the second side 1010b. In particular, the trench 1018 is formed selectively along the second side 1010b of the fin structure 1010, i.e. along the second side 1010b but not along the directly opposite first side 1010a of the fin structure 1010.
Figure 7B:
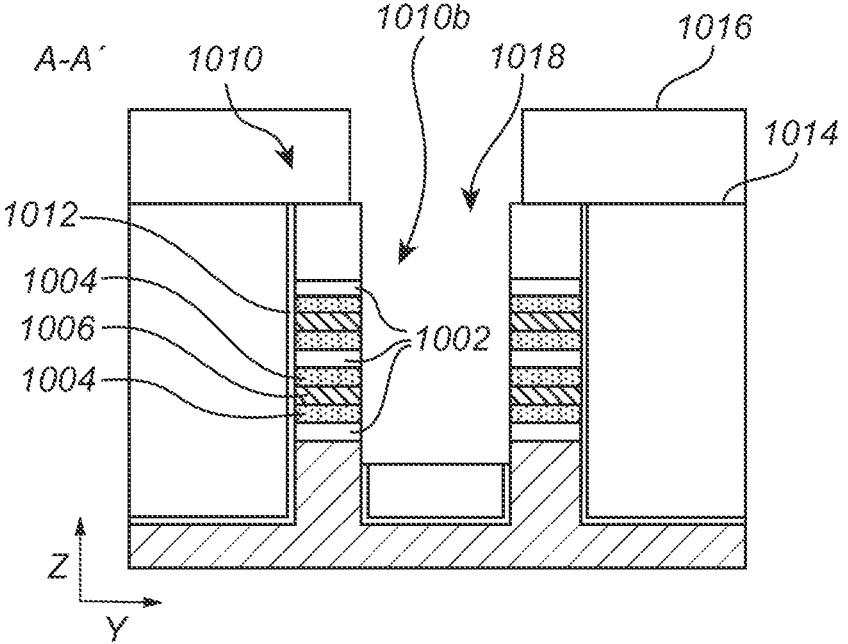

In FIGS. 7a-7b, a trench 1018 has been formed alongside the fin structure 1010 to expose the fin structure 1010 from the second side 1010b. In particular, the trench 1018 is formed selectively along the second side 1010b of the fin structure 1010, i.e. along the second side 1010b but not along the directly opposite first side 1010a of the fin structure 1010. As shown, the trench 1018 may be formed by etching the fill layer 1014 through an opening in a mask 1016 (a "trench etch mask 1016") formed over the fill layer 1014 and the fin structure 1010. More specifically, the opening may be defined to extend over and along the second side 1010b but not the first side 1010a of the fin structure 1010. The mask 1016 may for example be formed by a suitable hard mask material (e.g. oxide or nitride), wherein the opening may be defined by lithography and etching. Example etching processes for forming the trench 1018 include anisotropic etching (top-down) like RIE as well as isotropic (wet or dry) etching.

Depending on an etch contrast between the liner 1012 and the fill layer 1014 the liner 1012 may be removed from the second side surface 1010b during the etching of the fill layer 1014, or thereafter using a separate dedicated (e.g. isotropic) etch step.

Figure 8A:
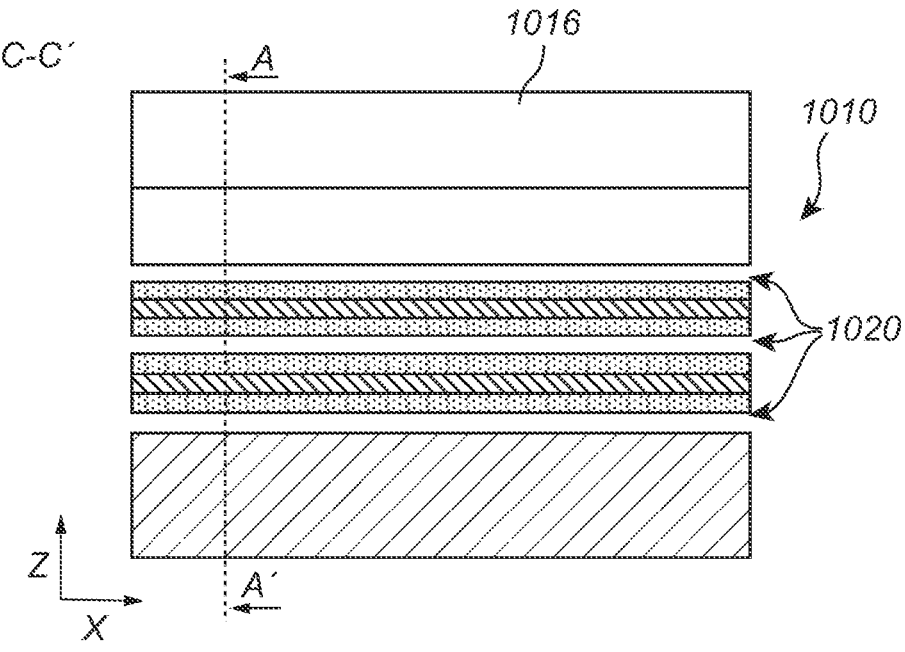
FIGS. 8a-8b show the first sacrificial layers 1002 removed from the fin structure 1010 to form a set of longitudinal gaps or cavities 1020 in the fin structure 1010 at locations previously occupied by the first sacrificial layers 1002.

The trench 1018 allows the first sacrificial layers 1002 to be accessed from the trench 1018 and etched laterally and selectively to the second sacrificial layers 1006 and the channel layers 1004. This is reflected in FIGS. 8a and 8b wherein the first sacrificial layers 1002 have been removed from the fin structure 1010 to form a set of longitudinal gaps or cavities 1020 in the fin structure 1010 at locations previously occupied by the first sacrificial layers 1002. The first sacrificial layers 1002 may, for instance, be removed from the fin structure 1010 by selective etching of the first semiconductor material to the second and third semiconductor material. A (wet or dry) isotropic etching process may be used. For example, selective etching of $SiGe_z$ to $SiGe_x$ and $SiGe_y$ (with $0<=x<y<z$) may be achieved using an HCl-based dry etch, wherein a greater difference in Ge-content among the layers 1002, 1004, 1006 may confer an increased etch contrast. A further example is selective etching using an ammonia-peroxide mixture (APM). However, other etching processes allowing selective etching of higher Ge-content SiGe-material to lower Ge-content SiGe layers (and Si-layers) are per se known in the art and may also be employed for this purpose.

To facilitate removal of the first sacrificial layers 1002 along its full length the trench 1018 may be formed to expose the side surface 1018b of the fin structure 1010 along the full longitudinal dimension thereof.

Figure 8B:
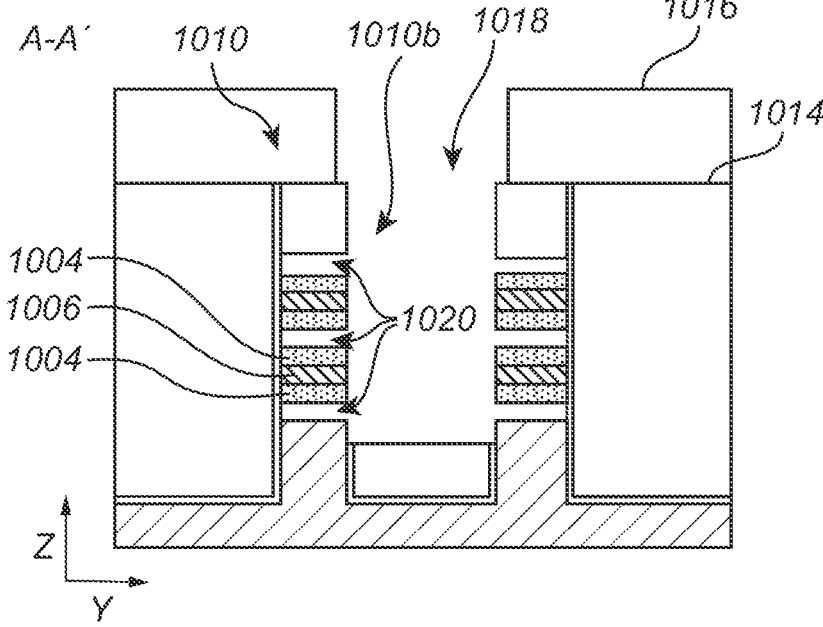

The liner 1012 and the fill layer 1014 may form a support structure supporting or tethering the fin structure 1010, thus counteracting collapse of the fin structure 1010 during and after the removal of the first sacrificial layers 1002. As shown in FIG. 8b, the mask 1016 may remain when forming the gaps 1020. However, according to alternative examples the mask 1016 may be removed, wherein the liner 1012 and the fill layer 1014 on their own may support the fin structure 1010 during removal of the first sacrificial layers 1002.

The trench 1018 may as shown be formed at a position between the pair of fin structures 1010 to expose the mutually facing side surfaces thereof. The sacrificial layers 1002 may hence be removed from two adjacent fin structures 1010 using a same trench 1018.

Figure 9A:
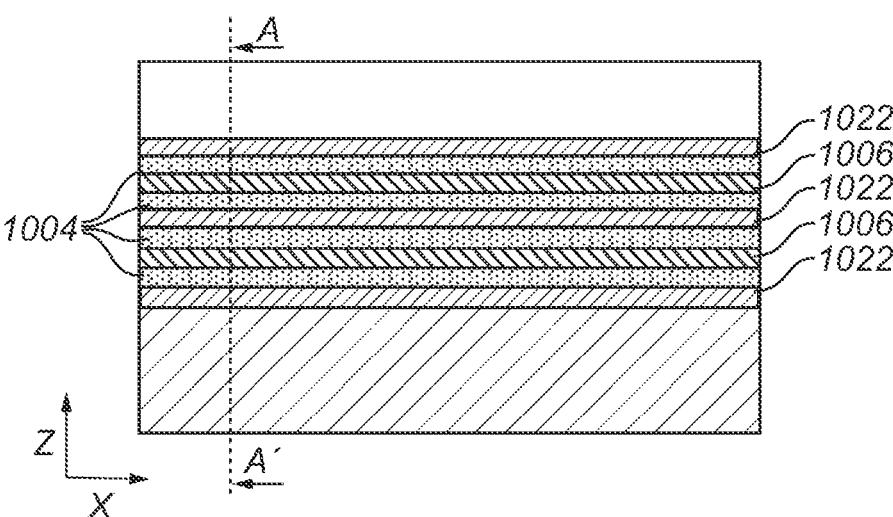
FIGS. 9a-9b show first dielectric layers 1022 (e.g. also in the shape of nanosheets) formed in the gaps 1020 by filling the cavities with a dielectric material. The first dielectric layers 1022 may also be denoted "first non-channel layers".
Figure 9B:
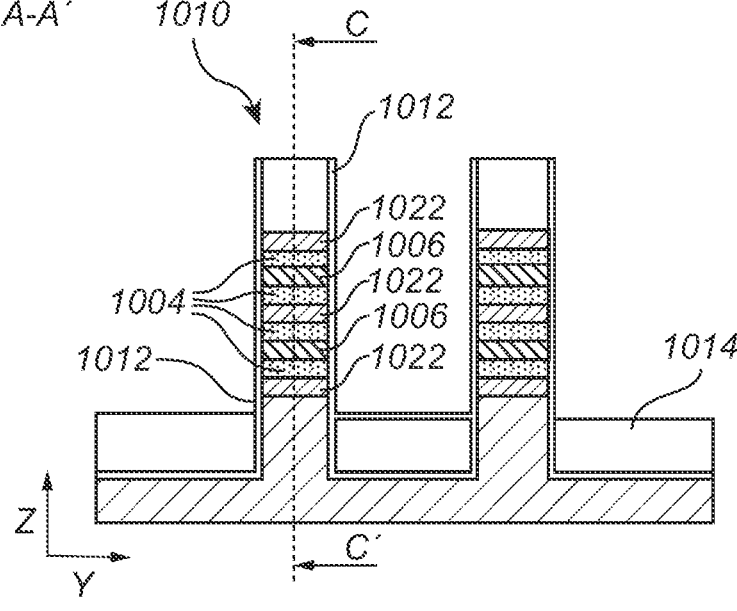

In FIGS. 9a and 9b, first dielectric layers 1022 (e.g. also in the shape of nanosheets) have been formed in the gaps 1020 by filling the cavities with a dielectric material. The first dielectric layers 1022 may also be denoted "first non-channel layers". The dielectric material may be, for instance, an oxide or a nitride material, such as $SiO_2$ or SiN or (low-k). Further examples include SiCO, SiOCN, SiCN, SiON, SiBCN and SiBCNO. To facilitate subsequent selective processing steps, to be described below, the first dielectric layers 1022 may be formed of a different material than the liner 1012. For example, the liner 1012 may be formed of a nitride (e.g. SiN) and the first dielectric layers 1022 may be formed of an oxide (e.g. $SiO_2$). The dielectric material may be conformally deposited, e.g. using atomic layer deposition (ALD), such that the gaps 1020 are completely filled with the dielectric material. The deposition may be followed by an etch step (wet or dry, isotropic or anisotropic top-down) to remove dielectric material deposited outside the gaps 1020.

After forming the first dielectric layers 1022 the cover material of the liner 1012 may as shown be re-deposited along the second side 1010b (e.g. by ALD). The mask 1016 may for example be removed prior to forming the first dielectric layers 1022, or subsequent thereto and prior to re-depositing the liner 1012.

After removing the mask 1016, the fill layer 1014 may be etched back to expose the liner 1012 along the first side 1010*a*, thus arriving at the structure shown in FIG. 9*b*. According to some examples, the fill layer 1012 may instead be completely removed/etched-back and a dielectric material (e.g. $SiO_2$) may be (re-deposited) to serve as a bottom dielectric layer.

As may be appreciated from the following, the first dielectric layers 1022 may be used to form dielectric spacers between pairs of source and drain prongs and additionally passivate surfaces of the channel layers 1004 of the finished FET device. Replacing the first (semiconductor) sacrificial layers 1002 by the first dielectric layers 1022 may additionally enable an increased etch selectivity among the layers of the fin structure 1010, thus facilitating subsequent process steps.

FIGS. 10*a* and 10*b* through 12*a* and 12*b* depict process steps which may be performed to additionally introduce a longitudinal etch contrast/etch selectivity in the layers 1004, 1006, 1022 by using an ion implantation process to introduce variable etch properties along the longitudinal dimension. More specifically, as will be set out below the ion implantation process may be adapted to introduce an increased concentration of dopants in each of the first fin part 1010*s* and the second fin part 1010*d*, compared to the third fin part 1010*c*.

Figure 10A:
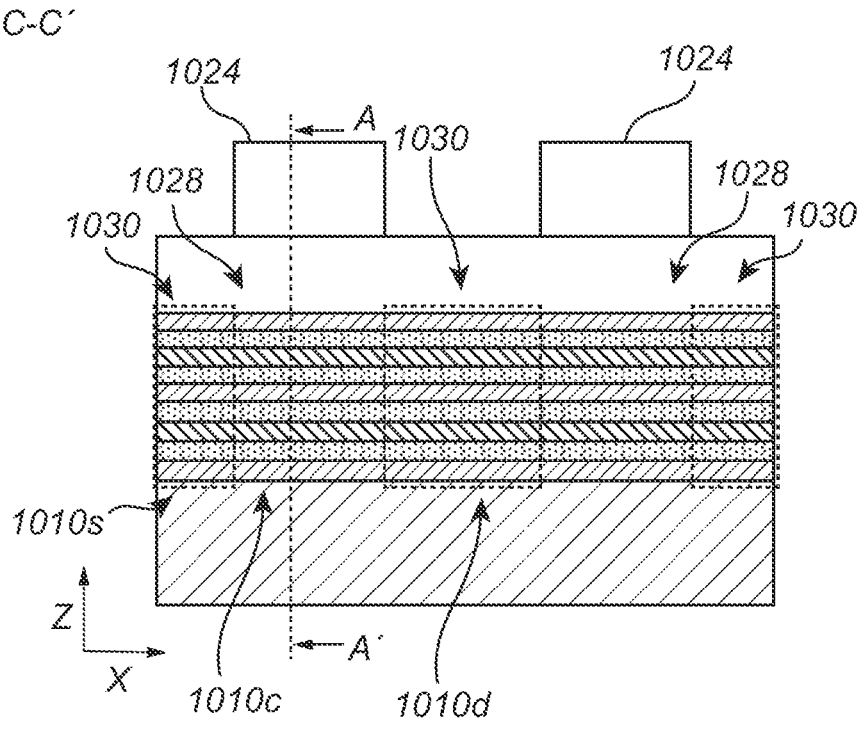
FIGS. 10a-10b show an ion implantation mask 1024 formed across the fin structure(s) 1010 to alternatingly define masked regions 1028 and non-masked regions 1030 along the fin structure 1010. The extension of the non-masked regions 1030 are indicated by dashed bounding boxes. As indicated in FIG. 10a, one of the masked regions 1028 is defined to overlap/comprise the third fin part 1010c, while a pair of the non-masked regions 1030 are defined to overlap/comprise the first and second fin parts 1010s, 1010d.
Figure 10B:
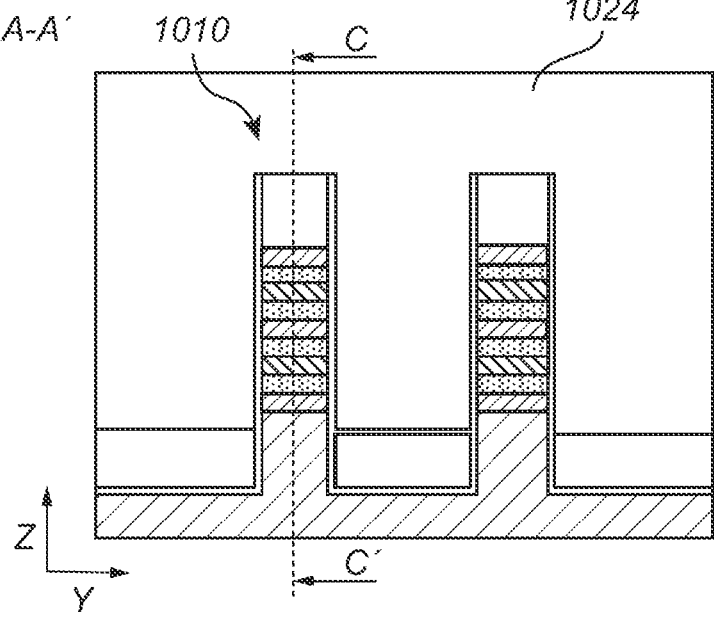

In FIGS. 10*a* and 10*b*, an ion implantation mask 1024 has been formed across the fin structure(s) 1010 to alternatingly define masked regions 1028 and non-masked regions 1030 along the fin structure 1010. The extension of the non-masked regions 1030 are indicated by dashed bounding boxes. As indicated in FIG. 10*a*, one of the masked regions 1028 is defined to overlap/comprise the third fin part 1010*c*, while a pair of the non-masked regions 1030 are defined to overlap/comprise the first and second fin parts 1010*s*, 1010*d*.

The masked regions 1028 correspond to source/drain regions of the FET to be formed, i.e. regions in which source/drain bodies will be formed. The masked regions 1030 correspond to the gate regions of the FET to be formed, i.e. regions in which gate bodies will be formed. Owing to this correspondence, each region 1028 may in the following be denoted "gate region 1028", and each region 1030 may be denoted "source/drain region 1030". In other words, the ion implantation mask 1024 is defined to mask each gate region 1028 and expose each source/drain region 1030.

As depicted in the figures, the mask 1024 may comprise a number of mask portions, commonly referenced 1024, to define a number of masked and non-masked regions 1028 such that ion implantation may be counteracted in a number of regions or fin parts like 1010*c*. The mask 1024 may be formed of one or more layers of a hardmask material, for example a nitride-comprising hardmask such as SiN or a-Si. However, any conventional material suitable to form part of an ion implantation mask may be used. The mask 1024 may be patterned using single- or multi-patterning techniques.

Figures 11A, 11B:
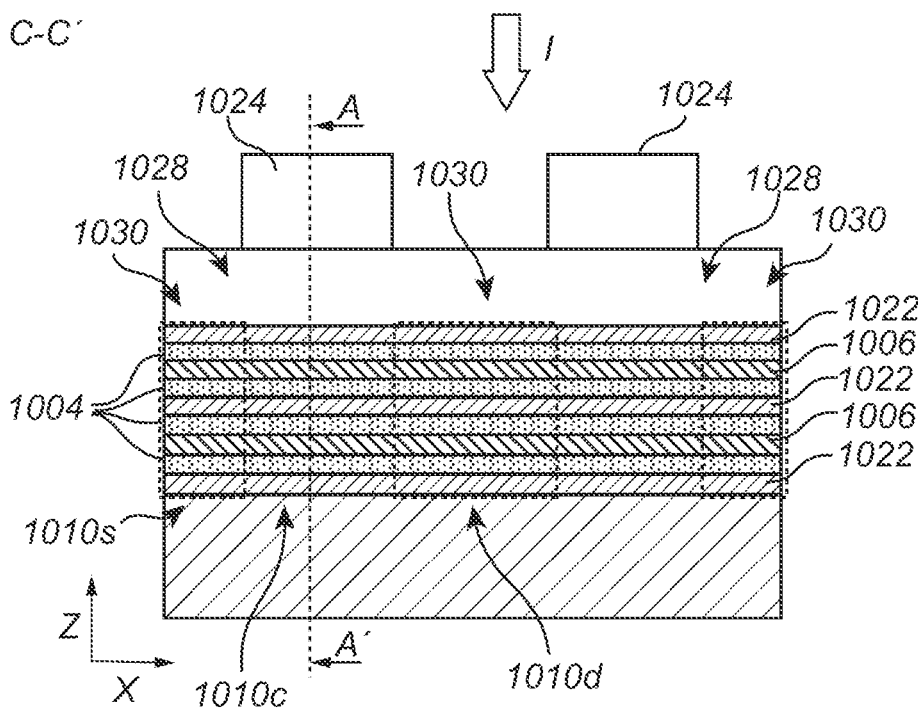
FIGS. 11a-11b show fin structure 1010 subjected to an ion implantation process (schematically indicated "I") wherein the first dielectric layers 1022, the second sacrificial layers 1006 and the channel layers 1004 have been provided with an increased concentration of dopants in the non-masked (source/drain) regions 1030 compared to the masked (gate) regions 1028. Accordingly, the first and second fin parts 1010s, 1010d have been provided with an increased concentration of dopants compared to the third fin part 1010c.

In FIGS. 11*a* and 11*b*, the fin structure 1010 has been subjected to an ion implantation process (schematically indicated "I") wherein the first dielectric layers 1022, the second sacrificial layers 1006 and the channel layers 1004 have been provided with an increased concentration of dopants in the non-masked (source/drain) regions 1030 compared to the masked (gate) regions 1028. Accordingly, the first and second fin parts 1010*s*, 1010*d* have been provided with an increased concentration of dopants compared to the third fin part 1010*c*. Any type of ion implant affecting the etch rate in the intended manner may be used.

Figure 12A:
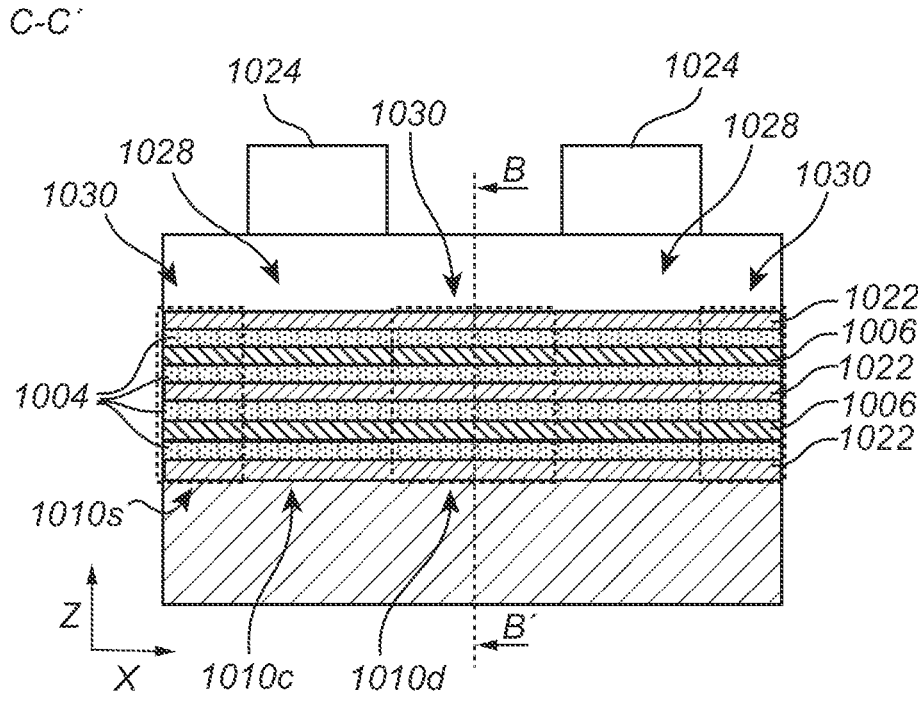
FIGS. 12a-12b show fin structure 1010 subjected to an ion implantation process (schematically indicated "I") wherein the first dielectric layers 1022, the second sacrificial layers 1006 and the channel layers 1004 have been provided with an increased concentration of dopants in the non-masked (source/drain) regions 1030 compared to the masked (gate) regions 1028. Accordingly, the first and second fin parts 1010s, 1010d have been provided with an increased concentration of dopants compared to the third fin part 1010c.
Figure 12B:
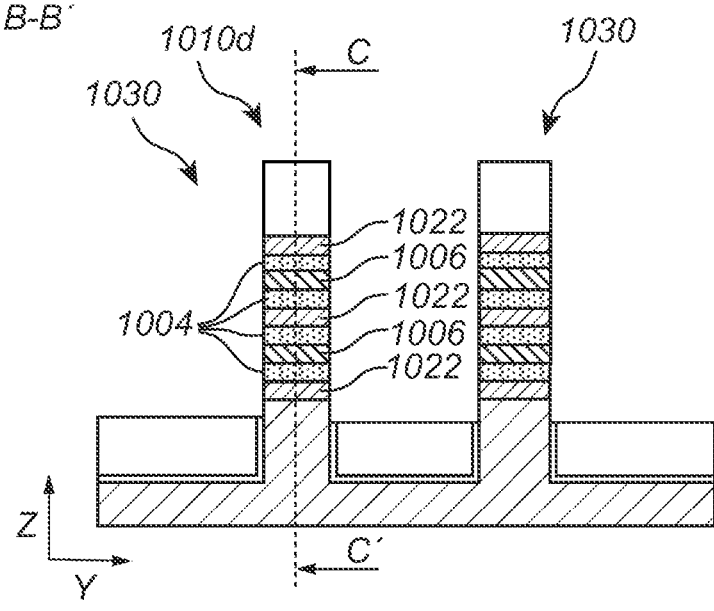

FIG. 12*b* depicts a cross section of the fin structure(s) 1010 along the vertical plane B-B' indicated in FIG. 12*a* after the liner 1012 has been partially opened to expose each of the first and second fin parts 1010*s*, 1010*d* from each of the first and second sides 1010*a*, 1010*b*. The third fin part 1010*c* remains covered from each of the first and second sides 1010*a*, 1010*b*. As shown, the liner 1012 may be etched while using the mask 1024 extending across the fin structure 1010 as an etch mask. The side surfaces 1010*a*, 1010*b* of the fin structure 1010 may thus be exposed in regions 1030 not covered by the mask 1024. The liner 1012 may be removed using an isotropic etching process, wet or dry. The cross section of FIG. 12*b* shows the second fin part 1010*d* but is representative also for the first fin part 1010*s*.

In FIGS. 12*a* and 12*b*, the "ion implantation mask" 1024 is used also as an etch mask while removing the liner 1012. However, the mask 1024 may according to other examples be removed after the ion implantation process and a new dedicated liner opening mask extending across the fin structure(s) 1010 may be formed. The mask 1024, or the liner opening mask, may be removed as shown after opening the liner 1012. However, the mask 1024 may alternatively remain also during the subsequent etching of the second sacrificial layers 1006 described below, to be removed thereafter.

Figure 13A:
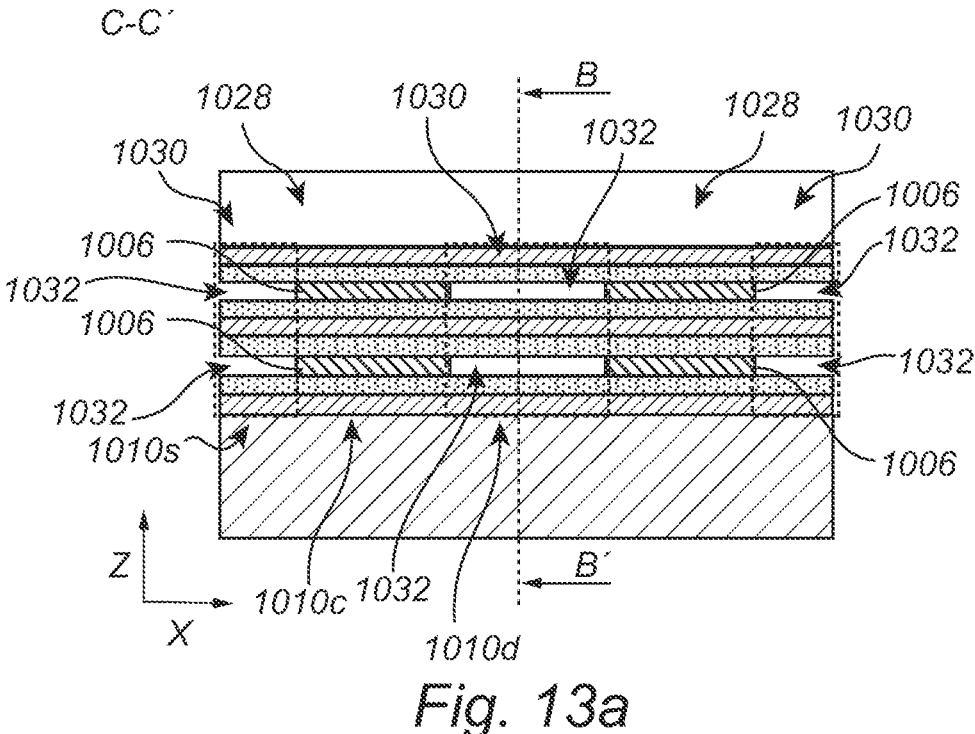
FIGS. 13a-13b show portions of each second sacrificial layer 1006 removed in regions 1030 to form the cavities 1032 by etching the second sacrificial layers 1006 from both sides 1010a, 1010b. The cavities 1032 may as shown extend completely through the fin structure 1010, along the Y direction. Portions of the channel layers 1002 and first dielectric layers 1022 may remain in the regions 1030, e.g. in the first and second fin parts 1010s, 1010d. The liner 1012 remaining in the regions 1028 may provide additional support to the fin structure 1010 during and after the forming of the cavities 1032.
Figure 13B:
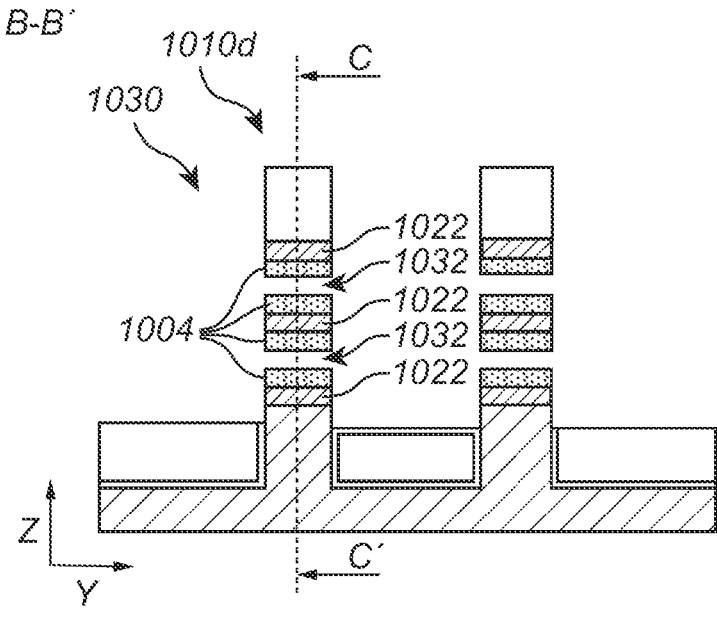

The partially opened liner 1012 may accordingly together with the capping 1008 define a mask structure covering the fin structure 1010 from both sides 1010*a*, 1010*b* in the gate regions 1028 (e.g. the third fin part 1010*c*), and defining openings exposing the fin structure 1010 from both sides 1010*a*, 1010*b* in the source/drain regions 1030 (e.g. the first and second fin parts 1010*s*, 1010*d*). The mask structure thus allows the second sacrificial layers 1006 to be accessed and etched laterally and selectively to form cavities 1032 in the source/drain regions 1030, e.g. in the first and second fin parts 1010*s*, 1010*d*. This is reflected in FIGS. 13*a* and 13*b*, wherein portions of each second sacrificial layer 1006 have been removed in regions 1030 to form the cavities 1032 by etching the second sacrificial layers 1006 from both sides 1010*a*, 1010*b*. The cavities 1032 may as shown extend completely through the fin structure 1010, along the Y direction. Portions of the channel layers 1002 and first dielectric layers 1022 may remain in the regions 1030, e.g. in the first and second fin parts 1010*s*, 1010*d*. The liner 1012 remaining in the regions 1028 may provide additional support to the fin structure 1010 during and after the forming of the cavities 1032. The second sacrificial layers 1006 may be etched selectively to the first dielectric layers 1022 and the channel layers (e.g. by selective etching of the second semiconductor material to the first dielectric material and the third semiconductor material). A (wet or dry) isotropic etching process may be used. For example, selective etching of $SiGe_y$ to $SiGe_{x<y}$, $SiO_2$ and SiN may be achieved using an HCl-based dry etch or APM.

Figure 14A:
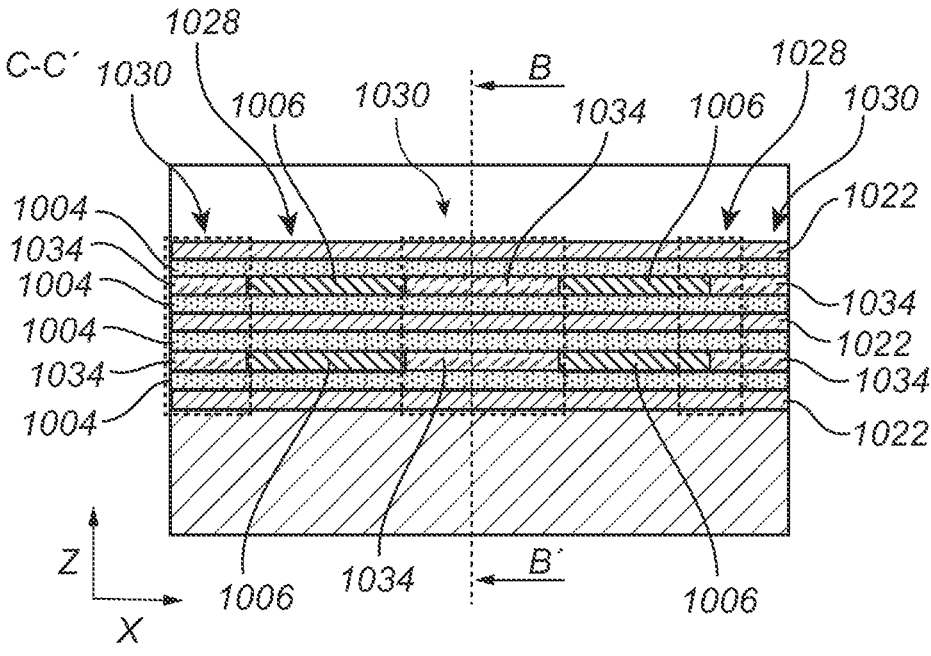
FIGS. 14a-14b show second dielectric layers 1034 (e.g. also in the shape of nanosheets) have been formed in the cavities 1032 by filling the cavities 1032 with a second dielectric material.
Figure 14B:
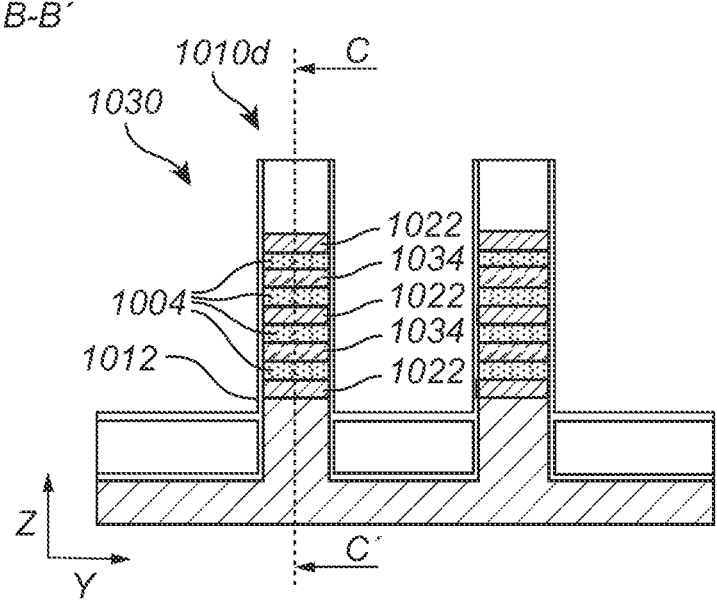

In FIGS. 14*a* and 14*b*, second dielectric layers 1034 (e.g. also in the shape of nanosheets) have been formed in the cavities 1032 by filling the cavities 1032 with a second dielectric material. The second dielectric material may e.g. be an oxide or a nitride material, such as any of the examples mentioned in connection with the liner 1012. The second dielectric layers 1034 may in particular be formed of a same material as the liner 1012. To facilitate subsequent selective processing steps, to be described below, the second dielectric layers 1034 may be formed of a different material than the first dielectric layers 1022. The (second) dielectric material may be conformally deposited, e.g. using ALD, such that the cavities 1032 are completely filled with the dielectric material. Although not reflected in FIG. 14*b*, the deposition may be followed by an etch step (wet or dry, isotropic or anisotropic top-down) to remove dielectric material deposited outside the cavities 1032. If the second dielectric layers are formed of different material than the liner 1012, the liner 1012 may be re-deposited along the sides of the fin structure 1010, e.g. using a separate ALD step.

Figure 15A:
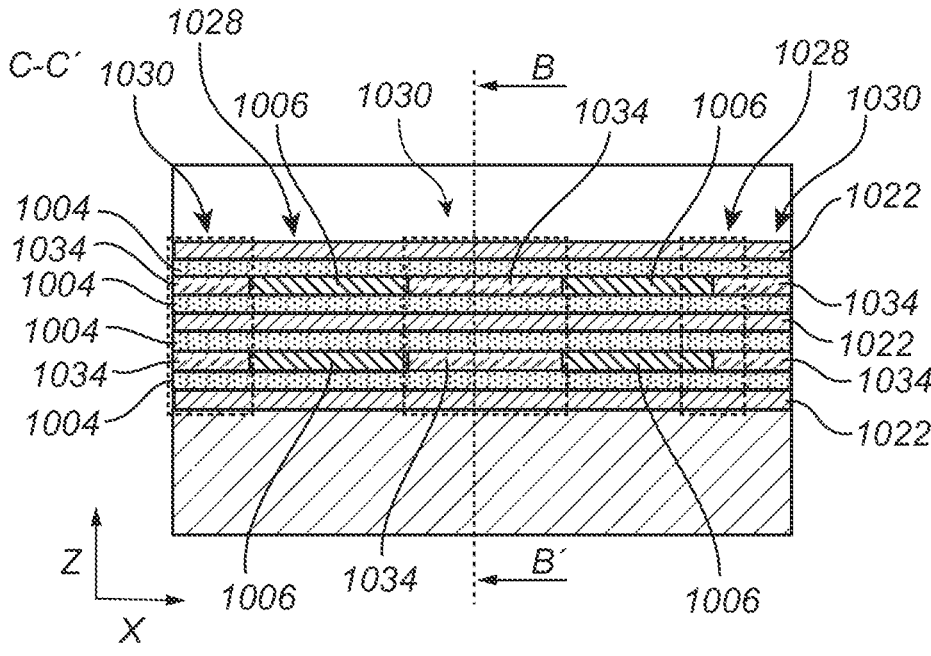
FIGS. 15a-15b show liner 1012 removed to expose the fin structure 1010 from both sides 1010a, 1010b, along the entire longitudinal dimension of the fin structure 1010.
Figures 22A, 22B:
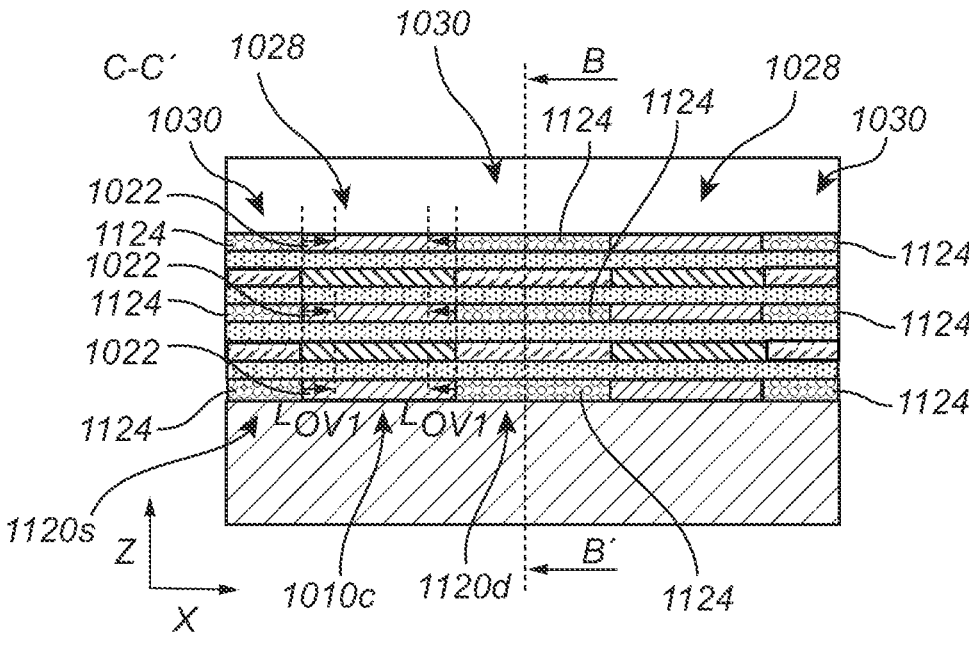
FIGS. 22a-22b show a source body 1120s and a drain body 1120d are formed, each comprising a respective common body portion 1122 along the first side 1010a and a set of prongs 1124 protruding from the respective common body portion into the source and drain cavities 1048, respectively.

FIGS. 15*a*-15*b* through FIGS. 22*a*-22*b* illustrate process steps for forming a respective source/drain body along each source/drain region 1030 of the fin structure 1010 (e.g. along the first and second fin parts 1010*s*, 1010*d*). Each source/drain body may form either a source body 1120*s* (e.g. corresponding to source body 120 of device 100) or a drain body 1120*d* (e.g. corresponding to drain body 130 of device 100). FIG. 22*a* includes the individual designations 1120*s* and 1120*d* while subsequent figures for illustrational clarity include only the common designation 1120. Each source/drain body 1120 may comprise a common semiconductor source/drain body portion 1122 arranged at the first side 1010*a* of the fin structure 1010, and a set of vertically spaced apart semiconductor source/drain layer portions or prongs 1124 protruding from the common source body portion 1122 in the Y direction. In FIGS. 15*a*, 16*a* and onwards the dashed bounding boxes indicating regions 1030 have been omitted to not obscure the figures.

Figure 15B:
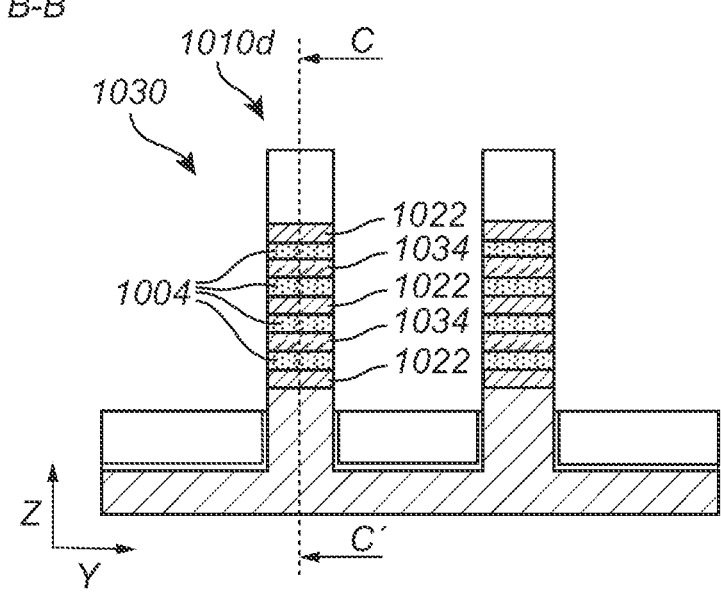
Figure 16A:
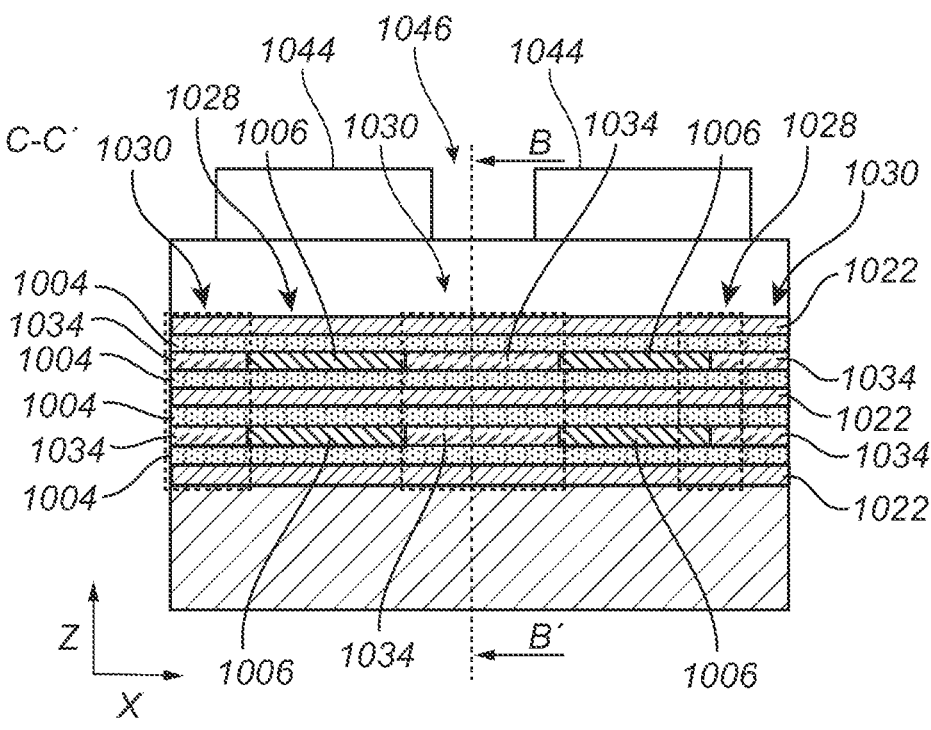
FIGS. 16a-16b show a cover material deposited along the first and second sides 1010a, 1010b of the fin structure 1010, thereby forming mask layer or cover layer 1044 embedding the fin structure 1010. An opening or trench 1046 (e.g. "source/drain trench") is formed in the cover layer 1044, in each source/drain region 1030 of the fin structure 1010, along each of the first side 1010a and the directly opposite second side 1010b of the fin structure 1010. Openings or trenches 1046 have accordingly been formed in the cover material, along the first and second fin parts 1010s, 1010d, to expose each of the first and second fin parts 1010s, 1010d from both the first and second sides 1010a, 1010b.

In FIGS. 15*a*-15*b*, the liner 1012 has been removed to expose the fin structure 1010 from both sides 1010*a*, 1010*b*, along the entire longitudinal dimension of the fin structure 1010. The liner 1012 may be removed, for instance, using a wet or dry isotropic etch.

Figure 16B:
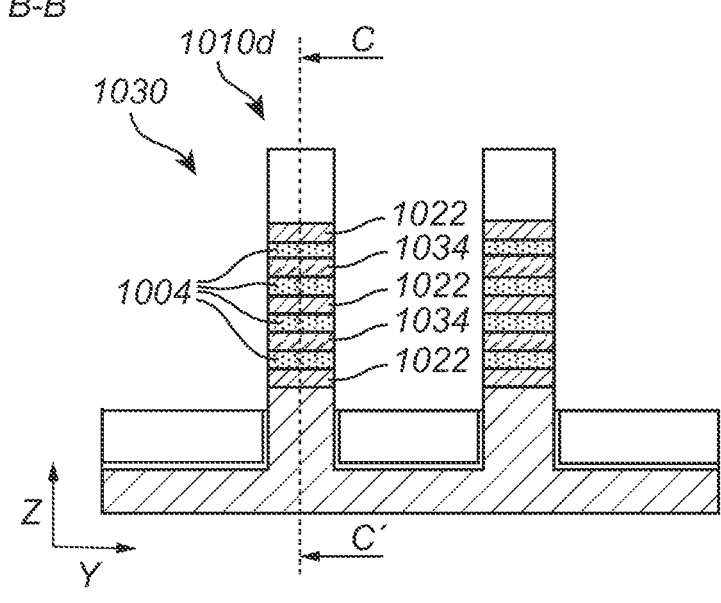

In FIGS. 16*a*-16*b*, a cover material is deposited along the first and second sides 1010*a*, 1010*b* of the fin structure 1010, thereby forming mask layer or cover layer 1044 embedding the fin structure 1010. The cover layer 1044 may be formed by a suitable cover material, such as a self-planarizing spin-on layer, e.g. an organic spin-on layer such as SOC. An opening or trench 1046 (e.g. "source/drain trench") is formed in the cover layer 1044, in each source/drain region 1030 of the fin structure 1010, along each of the first side 1010*a* and the directly opposite second side 1010*b* of the fin structure 1010. Openings or trenches 1046 have accordingly been formed in the cover material, along the first and second fin parts 1010*s*, 1010*d*, to expose each of the first and second fin parts 1010*s*, 1010*d* from both the first and second sides 1010*a*, 1010*b*.

The trenches 1046 may be formed by etching the cover layer 1044 through a respective opening in a mask (a "source/drain trench etch mask", not shown) formed over the cover layer 1044 and the fin structure 1010. Each opening may be defined to extend over and across the fin structure and thus along the first side 1010*a* and second side 1010*b*. The mask may for example be formed by a suitable hard mask material (e.g. oxide or nitride), wherein the opening may be defined by lithography and etching. Example etching processes for forming the trench 1046 include anisotropic etching (top-down) like RIE. By etching the cover layer 1044 selectively to the capping 1008 the trench 1046 may be etched self-aligned with respect to the side surfaces 1010*a*, 1010*b* of the fin structure 1010.

Figure 17A:
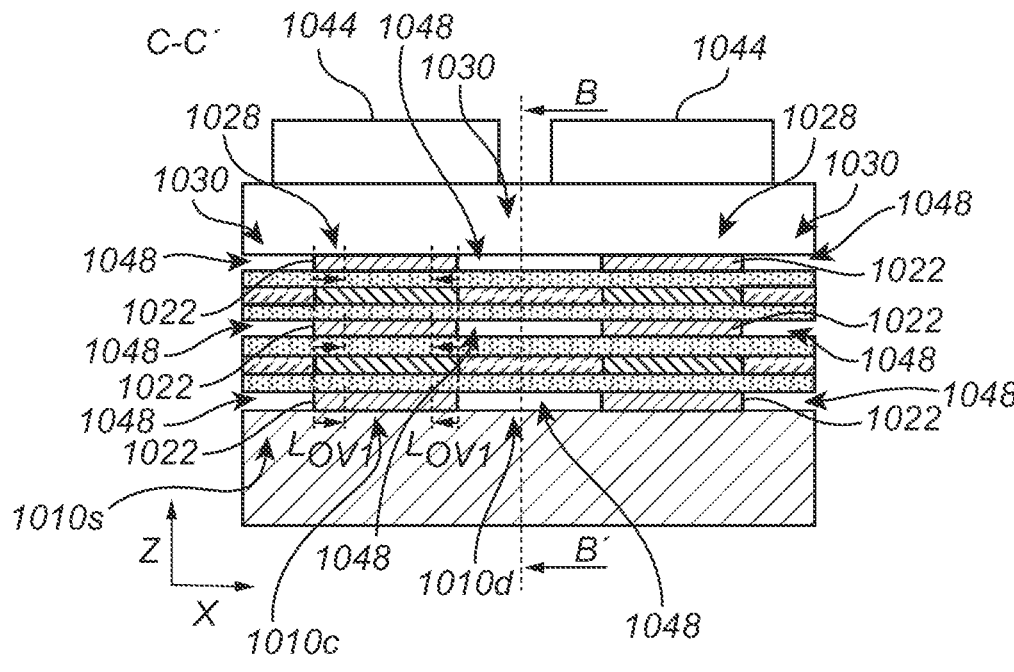
FIGS. 17a-17b show portions of the first dielectric layers 1022 to be accessed and etched laterally and selectively to form cavities 1048 (e.g. "source/drain cavities") in the source/drain regions 1030 along the fin structure 1010, e.g. in the first and second fin parts 1010s, 1010d.
Figure 17B:
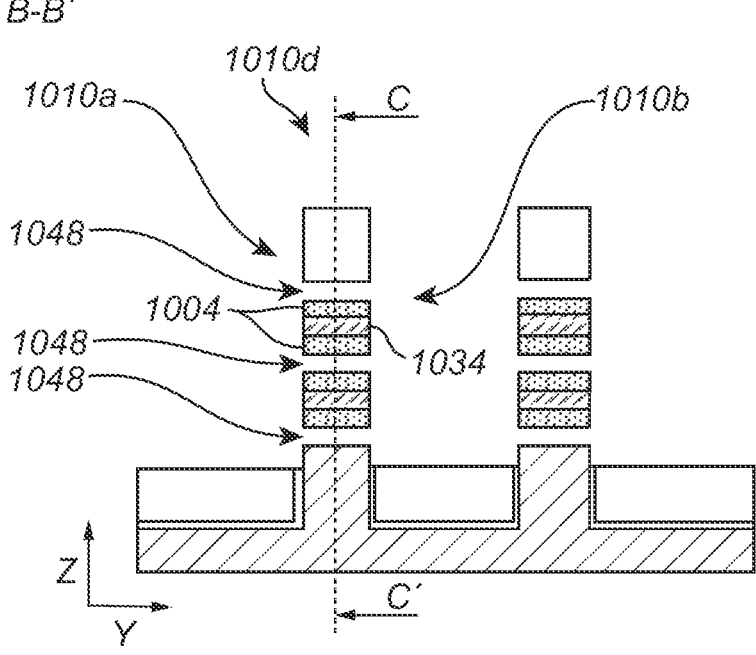
Figure 18A:
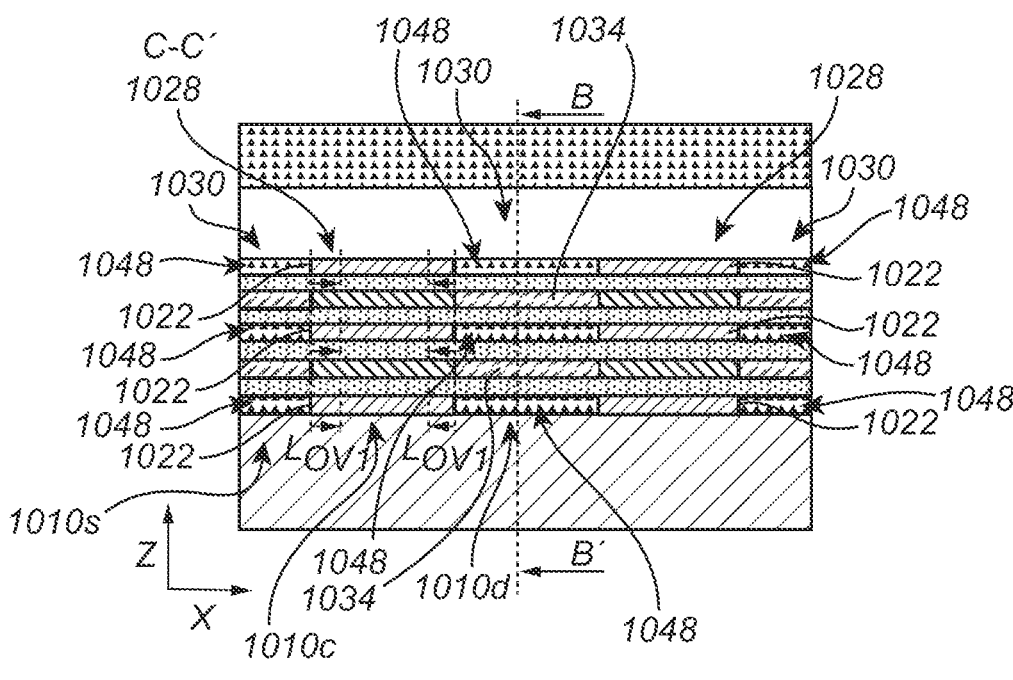
FIGS. 18a-18b show cavities 1048 filled with a dummy material 1049.
Figure 18B:
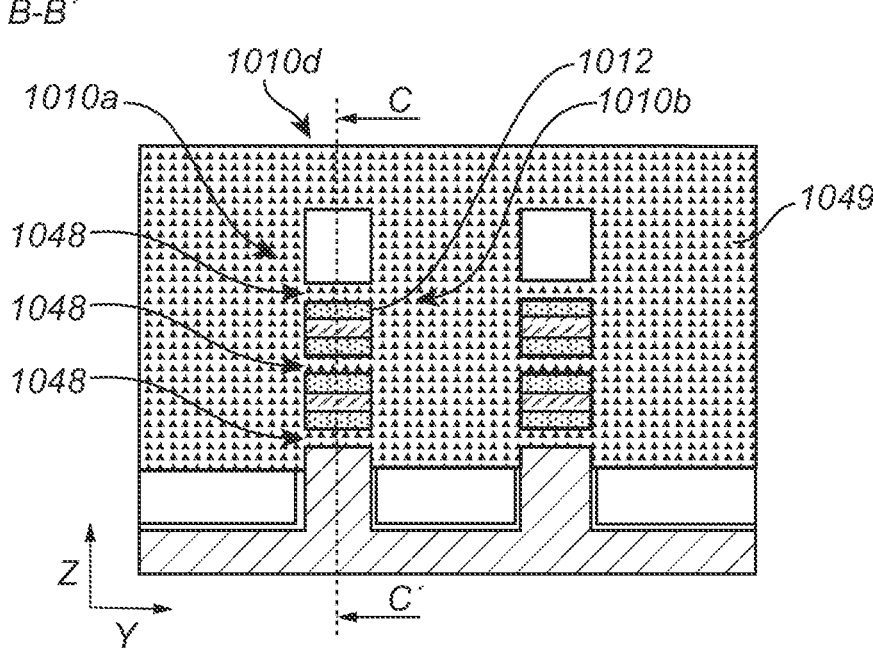
Figure 19A:
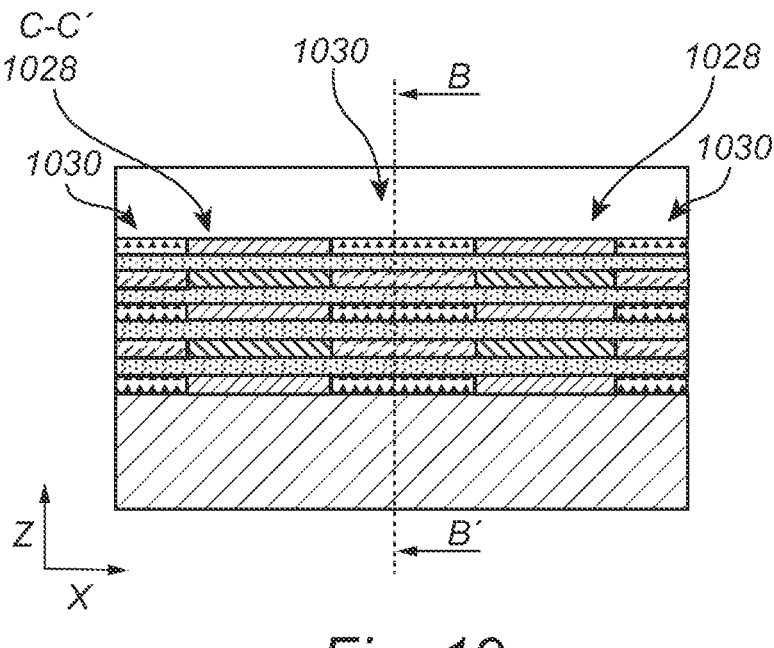
FIGS. 19a-19b show cavities 1048 filled with a dummy material 1049.
Figure 19B:
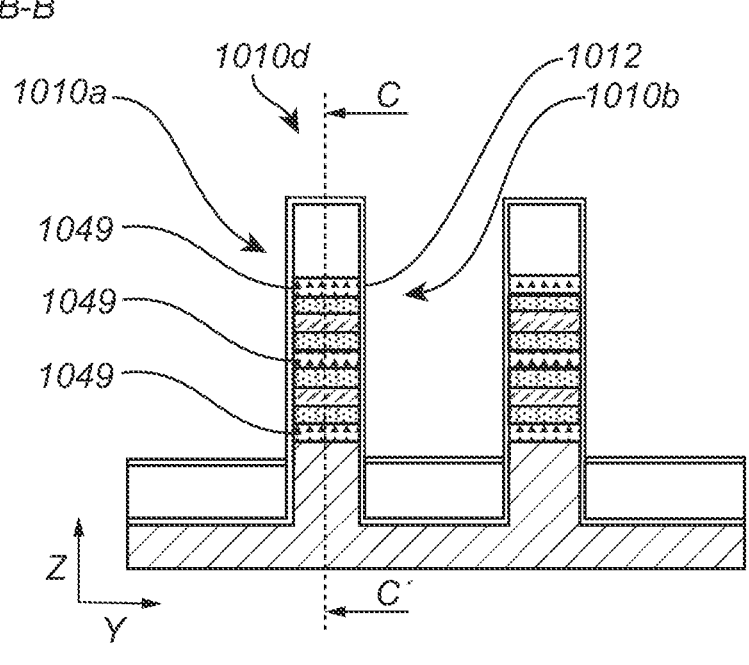

The cover layer 1044 may accordingly together with the capping 1008 define a mask structure covering the fin structure 1010 from the first and second sides 1010*a*, 1010*b* in the gate regions 1028 (e.g. the third fin part 1010*c*), and defining openings exposing the fin structure 1010 from the first and second sides 1010*a*, 1010*b* in the source/drain regions 1030 (e.g. the first and second fin parts 1010*s*, 1010*d*). The mask structure thus allows the portions of the first dielectric layers 1022 to be accessed and etched laterally and selectively to form cavities 1048 (e.g. "source/drain cavities") in the source/drain regions 1030 along the fin structure 1010, e.g. in the first and second fin parts 1010*s*, 1010*d*, as shown in FIGS. 17*a*-17*b*. The opposite side surface portions of the first dielectric layers 1022 exposed in the trenches 1046 may be laterally etched back (along the Y direction and −Y direction) from the trenches 1046. The first dielectric layers 1022 may be etched such that the cavities 1048 extend completely through the fin structure 1010, e.g. until the etch front progressing from the first side 1010*a* meets the etch front progressing from the second side 1010*b*. The first dielectric layers 1022 may accordingly be etched such that portions of the first dielectric layers 1022 remain in the gate regions 1028 on opposite sides of the cavities 1048, e.g. in the third fin part 1010*c*. The first dielectric layers 1022 may be etched selectively to the second dielectric layers 1034 and the channel layers 1004 (e.g. by selective etching of the first dielectric material to the second dielectric material and the third semiconductor material). A (wet or dry) isotropic etching process may be used.

In FIGS. 18*a*-18*b* and 19*a*-19*b*, the cavities 1048 are filled with a dummy material 1049. The dummy material 1049 may e.g. be a same material as the cover layer 1044, wherein the dummy material 1049 may be deposited to fil the cavities 1048 and the openings 1046. However, it is also possible to remove the cover layer 1044 prior to depositing the dummy material 1049. The dummy material 1049 is subsequently etched back top-down (along −Z direction), e.g. using an anisotropic etch, to remove dummy material deposited outside the cavities 1048. The liner 1012 is subsequently re-deposited to cover the fin structure 1010 along both sides 1010*a*, 1010*b*.

Figure 20A:
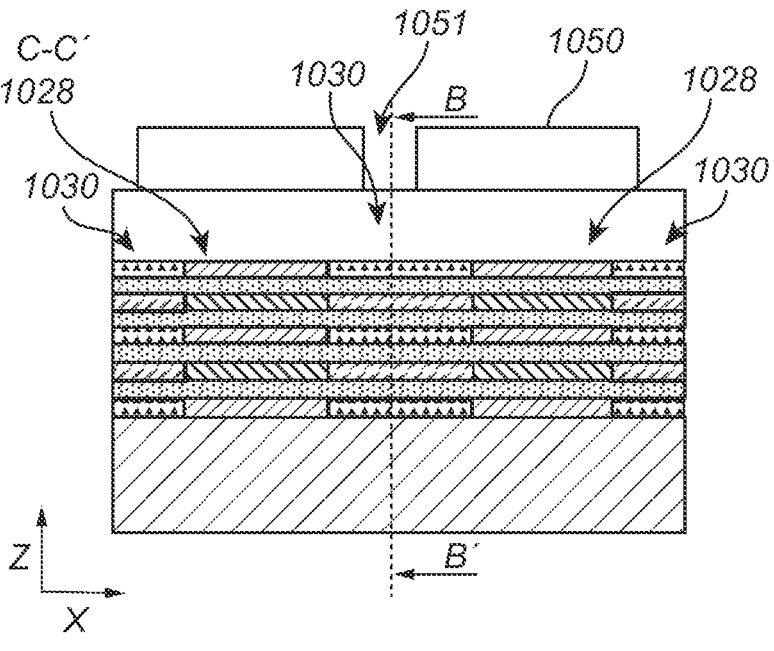
Figure 20B:
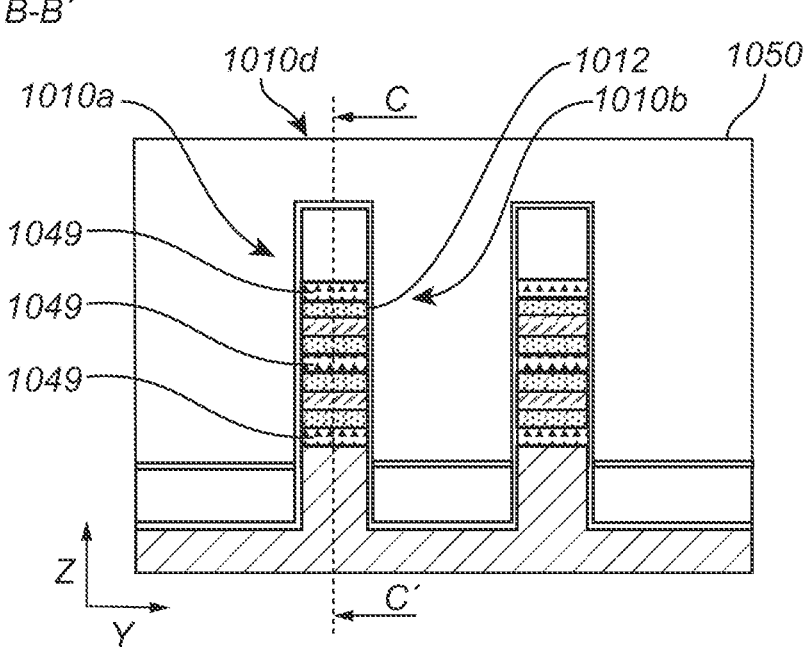

In FIGS. 20*a*-20*b* a cover material is deposited along the first and second sides 1010*a*, 1010*b* of the fin structure 1010, thereby forming a mask layer or cover layer 1050 embedding the fin structure 1010. The cover layer 1050 may be formed by a suitable cover material, such as any of the example materials discussed in connection with the cover layer 1044. An opening or trench 1051 (e.g. "dummy removal trench") is formed in the cover layer 1050, in each source/drain region 1030 of the fin structure 1010, along the first side 1010*a* but not along the directly opposite second side 1010*b* of the fin structure 1010. Openings or trenches 1051 have accordingly been formed in the cover material, along the first and second fin parts 1010*s*, 1010*d*, to expose each of the first and second fin parts 1010*s*, 1010*d* from only the first side 1010*a*.

The trenches 1051 may be formed by etching the cover layer 1050 through a respective opening in a mask (a "dummy removal trench etch mask", not shown) formed over the cover layer 1050 and the fin structure 1010. Each opening may be defined to extend over and along the first side 1010*a* but not the second side 1010*b* of the fin structure 1010. The mask may for example be formed by a suitable hard mask material (e.g. oxide or nitride), wherein the opening may be defined by lithography and etching. Example etching processes for forming the trench 1051 include anisotropic etching (top-down) like RIE. By etching the cover layer 1050 selectively to the capping 1008 (and/or liner 1012 which may be formed on the capping 1008) the trench 1051 may be etched self-aligned with respect to the liner 1012 on the side surface 1010*a* of the fin structure 1010.

After forming the trenches 1051, portions of the liner 1012 exposed in each trench 1051 may be removed from the first side surface 1010$a$ of the first and second fin parts 1010$s$, 1010$d$ of the fin structure 1010. The portions of the liner 1012 may be etched using a suitable isotropic etching process (wet or dry).

The partially opened liner 1012 may accordingly together with the capping 1008 and the cover layer 1050 (if not removed) define a mask structure covering the fin structure 1010 from the second side 1010$b$ in the source/drain regions 1030 and gate regions 1028 (e.g. the first, second and third fin parts 1010$s$, 1010$d$, 1010$c$), and defining openings exposing the fin structure 1010 from the first side 1010$a$ in the source/drain regions 1030 (e.g. the first and second fin parts 1010$s$, 1010$d$). The mask structure thus allows the dummy material 1049 to be accessed and etched laterally and selectively and accordingly be removed from the cavities 1048, as shown in FIGS. 21$a$-21$b$. The dummy material 1049 may be laterally etched back (along the Y direction) from the trenches 1051. The dummy material 1049 may be removed completely from the cavities 1048. The dummy material 1049 may be etched selectively to the second dielectric layers 1034 and the channel layers 1004 (e.g. by selective etching of the dummy material to the second dielectric material and the third semiconductor material). A (wet or dry) isotropic etching process may be used.

As set out above, the cavities 1032 as well as the cavities 1048 may be formed by etching the second sacrificial layers 1006 and the first dielectric layers 1022, respectively, from both sides 1010$a$, 1010$b$. A double-sided etching may facilitate control of the etching profile between the portions of the layer portions being removed those being preserved. This may be better understood from the schematic illustrations in FIGS. 27$a$ and 27$b$.

FIG. 27$a$ is a schematic top-down view of a cavity formed in a layer, e.g. layer 1006 or 1022. The cavity is formed by isotropic etching from a single-side of the layer 1006/1022 through from an opening e.g. in liner 1012 (the other side being masked by the liner 1012). Due to the isotropic etching an inner wall of the cavity is curved. CD represents the width dimension of the layer 1006/1022 (along the Y direction). $L_{1D}$ indicates an estimated maximum length dimension of the cavity (along the X direction) for an opening of longitudinal dimension A (along the X direction) assuming the etching is stopped after the etch front reaches the opposite side of the layer 1006/1022. VID indicates an estimated minimum length dimension of the cavity obtained at the side opposite the opening. Accordingly, a variation of longitudinal dimension of the cavity becomes 2CD. In contrast, as illustrated in FIG. 27$b$, by etching the layer 1006/1022 from both sides as described above, a variation of a longitudinal dimension of the cavity may be reduced to CD.

By additionally introducing a longitudinal etch contrast/etch selectivity in the second sacrificial layers 1006 using the aforementioned ion implantation process, a tendency of an isotropic etching of the layers 1006/1022 causing a curved or rounded etch front may be reduced. Moreover, the longitudinal etch contrast may facilitate localizing the forming of the cavities 1032/1048 to the regions 1030 (e.g. to the first and second fin parts 1010$s$, 1010$d$) by providing a reduced etch rate of the un-doped portions of the layers 1006/1022 in the regions 1028 (e.g. the third fin part 1010$c$) compared to the doped portions of the layers 1006/1022 in the regions 1030 (e.g. the first and second fin parts 1010$s$, 1010$d$). Accordingly, the selective etching may further be adapted to etch the doped second semiconductor material/ first dielectric material of the first and second fin parts 1010$s$, 1010$d$ selectively to the un-doped second semiconductor material/first dielectric material of the third fin part 1010$c$.

It is further to be noted that by using an isotropic etching process to form the cavities 1032/1048, a longitudinal dimension of the openings in the liner 1012/the mask 1044 (along the X direction) may be smaller than a longitudinal dimension of the source/drain regions 1030. In other words, the openings need not be coextensive with the regions 1030 (along the X direction).

With reference to FIGS. 22$a$-22$b$, subsequent to removing the dummy material 1049 from the cavities 1048, source/drain material may be deposited to form the source/drain bodies 1120. During the source/drain material deposition the cover layer 1050 and/or the liner 1012 may mask the fin structure 1010 from the second side 1010$b$. The cover layer 1050 may be removed prior to or subsequent to the source/drain material deposition.

The source/drain bodies 1120 may be formed by epitaxy of a semiconductor source/drain material. The epitaxy may seed from top and bottom surface portions of the channel layers 1004 exposed in the cavities 1048. The material deposited in the cavities 1048 may form prongs 1124 in contact/abutment with the channel layers 1004. The epitaxy may as shown be continued until the source/drain material protrudes from the cavities 1048 to form body portions along the first side 1010$a$. The epitaxay may subsequently be further continued such that the (individual) body portions merges to define the common body portions 1122 along the first side 1010$a$. For example, Si or SiGe may be epitaxially grown in contact with Si or SiGe channel layers 1004, e.g. using selective area epitaxy. The epitaxy may comprise an initial sub-step of depositing a seed layer on the channel layers 1004 in the cavities, to facilitate growth of a remainder of the source/drain bodies 1120. The source/drain material may be doped, e.g. by in-situ doping, with an n- or p-type dopant, to form doped source/drain bodies, in contact with the channel layers.

After the epitaxy, a contact etch stop layer (CESL) may be deposited (e.g. by ALD) on the source/drain bodies 1120. In the illustrated example, the CESL is formed of a same material as the liner 1012, and hence depicted as continuous with the liner 1012 and indicated with the same reference sign. However, the CESL may also be formed of a different suitable dielectric hard mask material. The CESL may serve as a mask for the source/drain bodies 1120 during subsequent process steps.

Figure 23A:
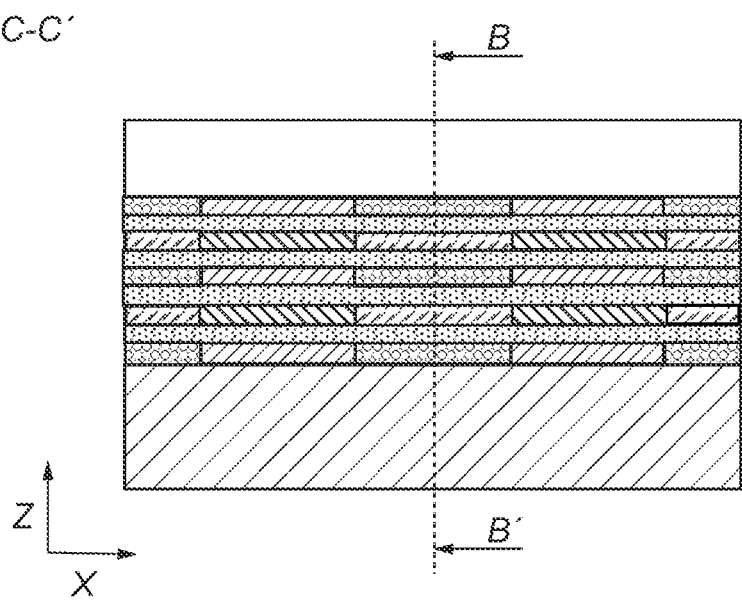
FIGS. 23a-23b show that process steps shown in FIGS. 21a-21b through FIGS. 22a-22b may be repeated at further fin structures, such as the second fin structure 1010 (the rightmost fin structure in FIG. 17b), to form corresponding source/drain bodies 1120 along the second fin structure. The source/drain bodies 1120 along the second fin structure 1010 may e.g. be formed with an opposite doping to the source/drain bodies 1120 along the first fin structure 1010.
Figure 23B:
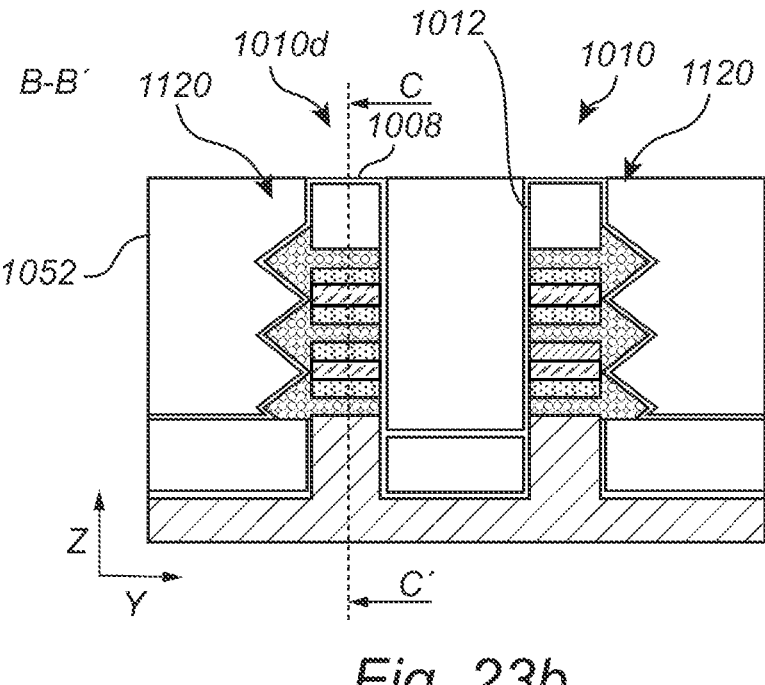

As shown in FIGS. 23$a$-23$b$, the process steps shown in FIGS. 21$a$-21$b$ through FIGS. 22$a$-22$b$ may be repeated at further fin structures, such as the second fin structure 1010 (the rightmost fin structure in FIG. 17$b$), to form corresponding source/drain bodies 1120 along the second fin structure. The source/drain bodies 1120 along the second fin structure 1010 may e.g. be formed with an opposite doping to the source/drain bodies 1120 along the first fin structure 1010.

After depositing the source/drain material, the fin structure 1010 may be embedded in a dielectric layer 1052, e.g. an oxide such as CVD or FCVD $SiO_2$. The dielectric layer 1052 may be recessed (e.g. by CMP and/or etch back) to bring its upper surface flush with an upper surface of the capping 1008 or (as shown) the liner 1012/CESL thereon.

FIGS. 24$a$-24$b$ and FIGS. 25$a$-25$b$ illustrate process steps for forming a gate body 1140 in each gate region 1028, e.g. along the third fin part 1010$c$. The gate body 1140 comprises a common gate body portion 1142 arranged at the second side 1010$b$ of the fin structure 1010, and a set of vertically spaced apart gate prongs 1144. Each gate prong 1144 protrudes from the common gate body portion 1142 in the opposite direction to the prongs 1124 (along the −Y direction) into a space above or underneath a respective channel layer 1004. In the illustrated example, the prongs 1144 in particular extend into a space between a respective pair of channel layers 1004.

Figure 24A:
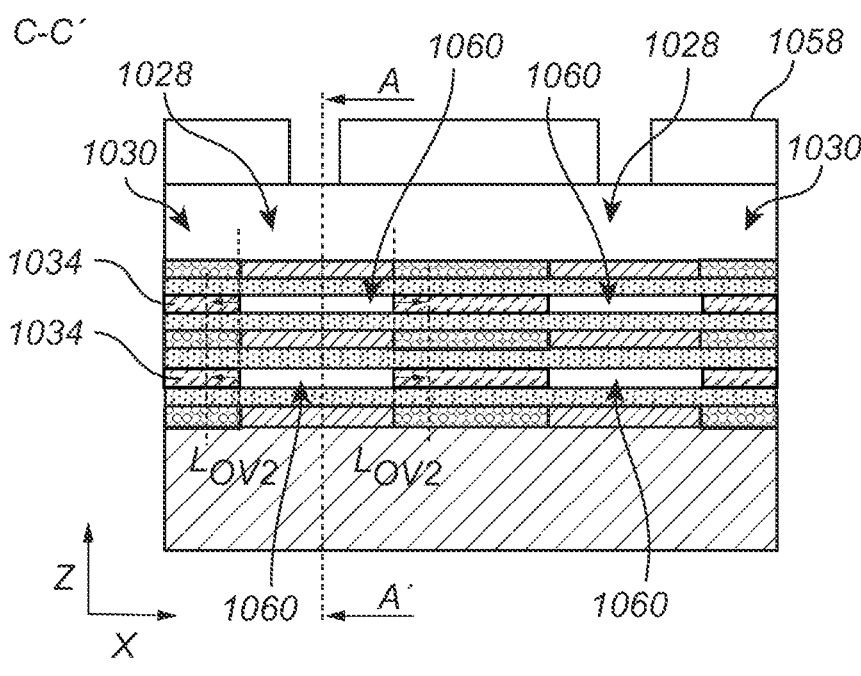
FIGS. 24a-24b show a trench 1056 (e.g. "gate trench") has been formed alongside the fin structure 1010 in each gate region 1028, along the second side 1010b thereof. An opening or trench 1056 has accordingly been formed in the dielectric layer 1052 along the third fin part 1010c, to expose the third fin part 1010c from only the second side 1010b.
Figure 24B:
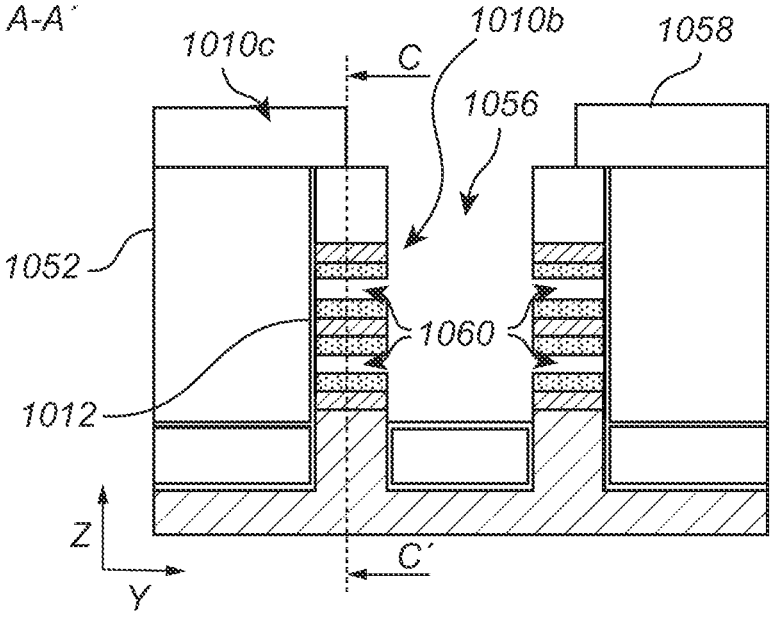

In FIGS. 24a-24b, a trench 1056 (e.g. "gate trench") has been formed alongside the fin structure 1010 in each gate region 1028, along the second side 1010b thereof. An opening or trench 1056 has accordingly been formed in the dielectric layer 1052 along the third fin part 1010c, to expose the third fin part 1010c from only the second side 1010b.

The trench 1056 may as shown be formed by etching the dielectric layer 1052 through an opening in a mask 1058 (a "gate trench etch mask 1058") formed over the dielectric layer 1052 and the fin structure 1010. More specifically, the opening may be defined to extend over and along the second side 1010b but not the first side 1010a of the fin structure 1010. The mask 1058 and trench 1056 may be formed and etched respectively in a same manner as the source/drain trench etch mask and the source/drain trench 1046, respectively.

Depending on an etch contrast between the liner 1012 and the dielectric layer 1052 the liner 1012 may be removed from the second side surface 1010b during the etching of the dielectric layer 1052, or thereafter using a separate dedicated (e.g. isotropic) etch step.

The partially opened liner 1012 may accordingly together with the capping 1008, the dielectric layer 1052 and the gate trench etch mask 1058 (if not removed) define a mask structure covering the fin structure 1010 from the first side 1010b in the source/drain regions 1030 and gate regions 1028 (e.g. the first, second and third fin parts 1010s, 1010d, 1010c), and defining openings exposing the fin structure 1010 from the second side 1010b in the gate regions 1028 (e.g. the third fin part 1010c). The mask structure thus allows the portions of the second sacrificial layers 1006 remaining in the gate regions 1028 (e.g. the third fin part 1010c) to be accessed from the trench 1056 and etched laterally and selectively form cavities 1060 (e.g. "gate cavities") in the gate regions 1028, e.g. the third fin part 1010c. The side surfaces of the portions of the second sacrificial layers 1006 exposed in the trench 1056 may be laterally etched back (along the −Y direction) from the trench 1056. The portions of the second sacrificial layers 1006 may be etched such that the cavities 1060 extend completely through the fin structure 1010, along the −Y direction. The etch may continue until the portions of the second sacrificial layers 1006 are removed from the fin structure 1010 (i.e. completely).

As may be appreciated from the above, the remaining portions of the second sacrificial/non-channel layers 1006 correspond to portions of the second sacrificial layers 1006 which have not been replaced by second dielectric layers 1034 and may hence be of the second semiconductor material, and in particular be undoped. The portions 1006 may hence be removed from the fin structure 1010 by selective etching of the second semiconductor material (e.g. being un-doped) to the first dielectric material and the third semiconductor material.

As the portions of the second sacrificial layers 1006 remaining prior to forming the cavities 1060 are surrounded by the second dielectric layers 1034 on either side (as viewed along the longitudinal direction of the fin structure 1010, i.e. the X direction) the cavity etch may be confined to the regions 1028, e.g. the third fin part 1010c. The second semiconductor material may hence be further etched selectively to the second dielectric material such that the second dielectric layers 1034 may be used as etch stop layers along the longitudinal direction X of the fin structure 1010. A (wet or dry) isotropic etching process may be used. For example, selective etching of $SiGe_y$ to $SiGe_x$ (with $0 \leq x < y$) may as discussed above be achieved e.g. using an HCl-based dry etch.

Figure 25A:
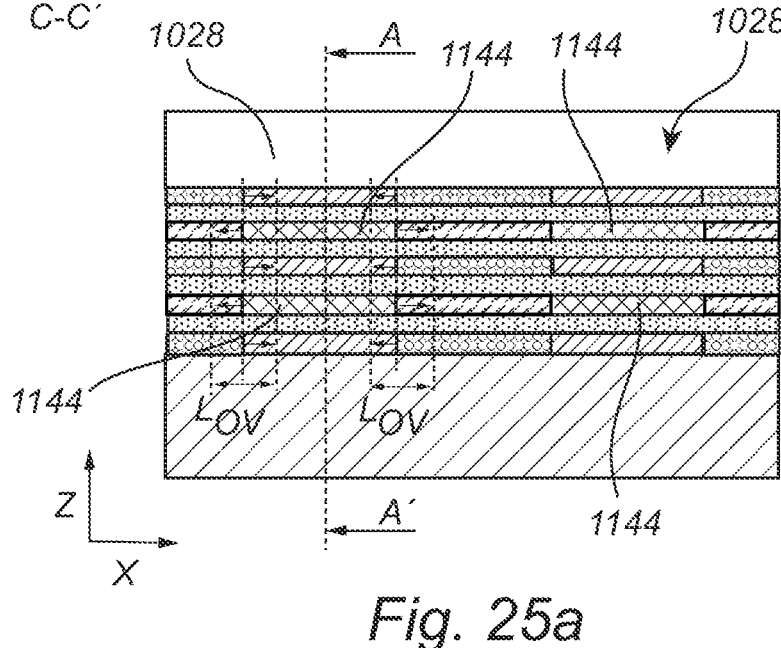
FIGS. 25a-25b show gate body 1140 has been formed, comprising the set of gate prongs 1144 in the cavities 1060, and the common gate body portion 1142 in the trench 1056, merging the gate prongs 1144.
Figure 25B:
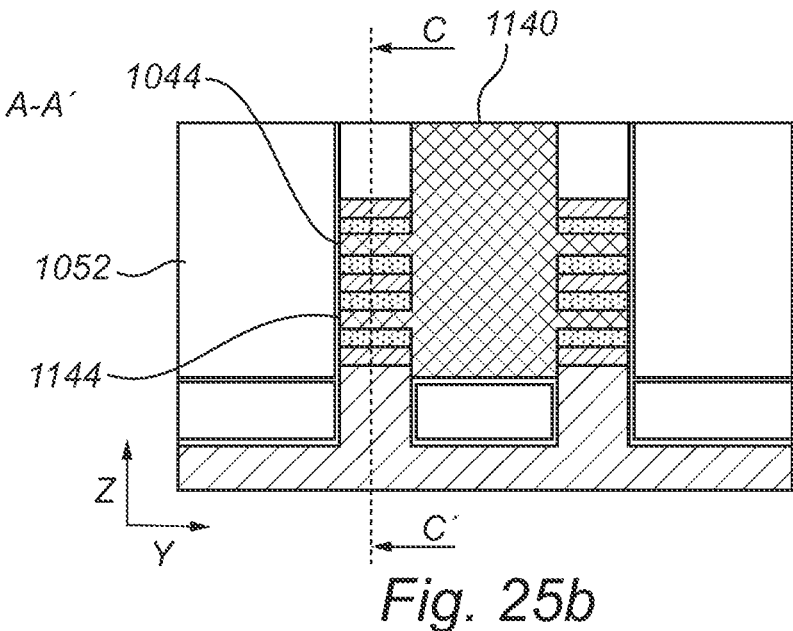

In FIGS. 25a-25b, the gate body 1140 has been formed, comprising the set of gate prongs 1144 in the cavities 1060, and the common gate body portion 1142 in the trench 1056, merging the gate prongs 1144. The gate body 1140 is for illustrational clarity depicted as a single piece-body, however may be formed by depositing a stack of gate materials (a "gate stack") comprising a gate dielectric layer, and one or more gate metals. The gate dielectric layer may be a conventional gate dielectric of a high-k, such as $HfO_2$, LaO, AlO and ZrO. Examples of gate metals include conventional work function metals, such as TiN, TaN, TiAl, TiAlC or WCN, or combinations thereof, and gate fill materials such as W and Al. At least the gate dielectric layer and the WFM layer(s) may be conformally deposited, e.g. by ALD, to facilitate deposition within the cavities 1060. During the gate formation, the fin structure 1010 is masked from the first side 1010a by the dielectric layer 1052, such that the common gate body portion 1142 is formed selectively along the second side 1010b.

The gate metal(s) may be recessed using e.g. CMP and/or a metal etch back process to form recessed gates 1140. The gates 1140 may as shown be recessed to bring its upper surface flush with an upper surface of the dielectric layer 1052. According to other examples, the gates 1140 may be recessed to a level below the upper surface of the dielectric layer 1052 and then then be covered by a dielectric to restore the dielectric layer 1052 over the gates 1140.

As shown in FIG. 24b, the trench 1056 may be formed at a position between the pair of fin structures 1010 to expose the mutually facing side surfaces thereof. Cavities 1060 may hence be formed in two adjacent fin structures 1010 using a same trench 1056 wherein the gate body 1140 may be shared by the adjacent fin structures 1010.

As discussed with reference to the FET device 100, the gate prongs 144 and source/drain prongs 124/34 may be arranged to overlap respective common regions 150as/150ad of each channel layer 150a. According to the example process, such a configuration may be facilitated by forming the cavities 1048 to extend into the gate regions 1028/the third fin part 1010c and/or the cavities 1060 to extend into the source/drain regions 1030/the first and second fin parts 1010s, 1010d. As schematically indicated by the dashed lines in FIGS. 17a and 18a, the cavities 1048 may be extended by etching the first dielectric layers 1022 by an additional amount $L_{ov1}$ along the X and −X directions, thereby enabling forming of correspondingly extended/elongated source/drain prongs 1124, as shown in FIG. 22a. Correspondingly, as schematically indicated by the dashed lines in FIG. 24a, the cavities 1060 may be extended by partially etching the second dielectric layers 1034 by an additional amount $L_{ov2}$ along the X and −X directions, thereby enabling forming of correspondingly extended/elongated gate prongs 1144, as shown in FIG. 25a. FIG. 25a schematically indicates the combined length $L_{ov} = L_{ov1} + L_{ov2}$ of the common overlap regions which may be obtained in this manner. As discussed above, the isotropic nature of these etching processes may result in rounded profiles of the cavities 1048, 1060. Hence, the overlap lengths $L_{ov}$, $L_{ov1}$ and/or $L_{ov2}$ may each be understood as denoting maximum overlap lengths within the fin structure 1010, and that the precise overlap lengths may vary along the width direction Y of the fin structure 1010.

Figures 26A, 26B:
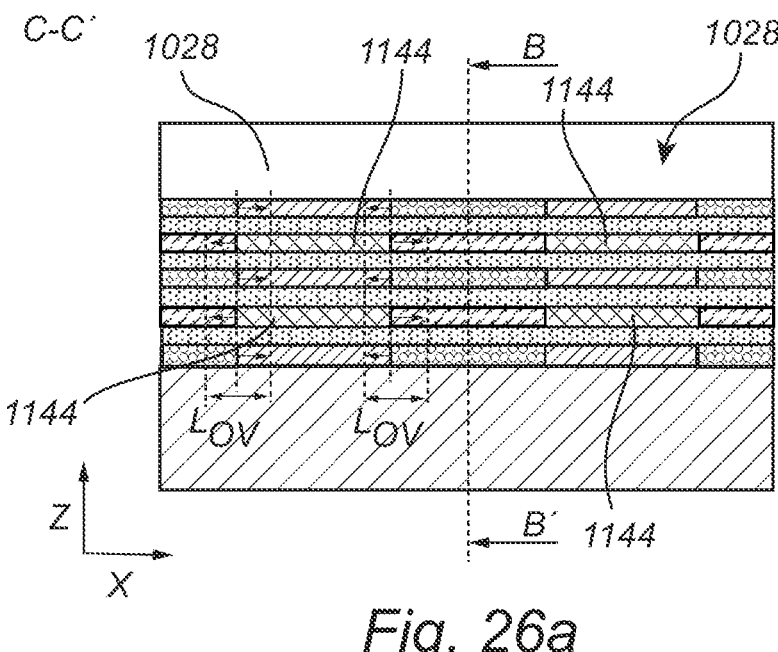
FIGS. 26a-26b show source/drain contacts 1054 have been formed on the source/drain bodies 1120. The contacts 1054 may be formed as shown as wrap-around contacts, i.e. wrapping around the common body portions 1122.
Figure 27A:
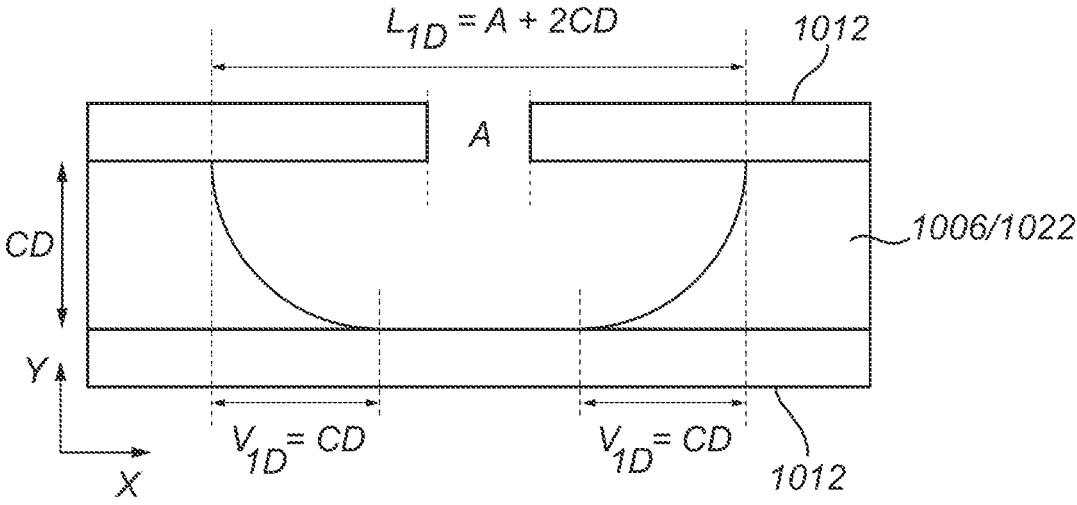
Figure 27B:
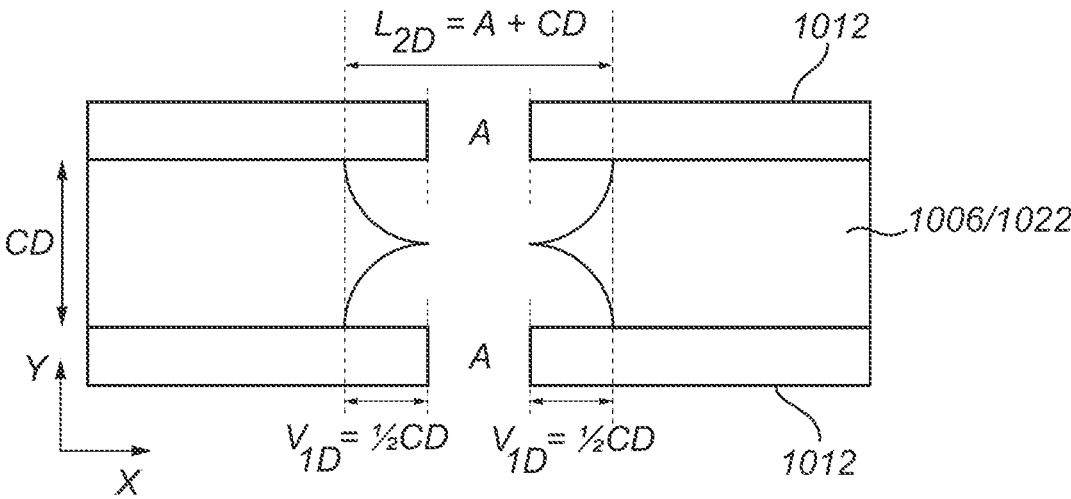
Figure 28A:
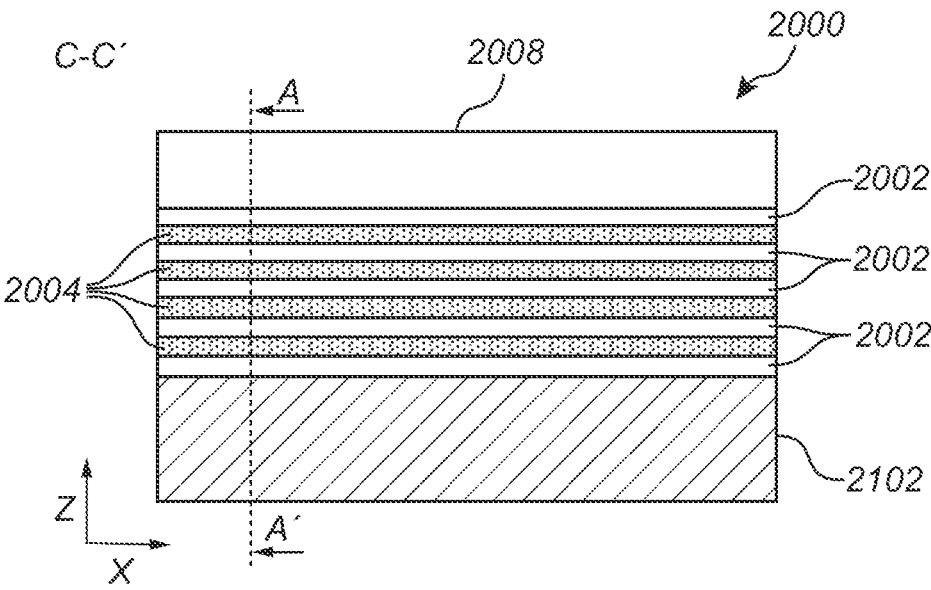
FIGS. 28a-28b through 35a-35b depict steps of a method for forming the second type of FET device.
Figure 28B:
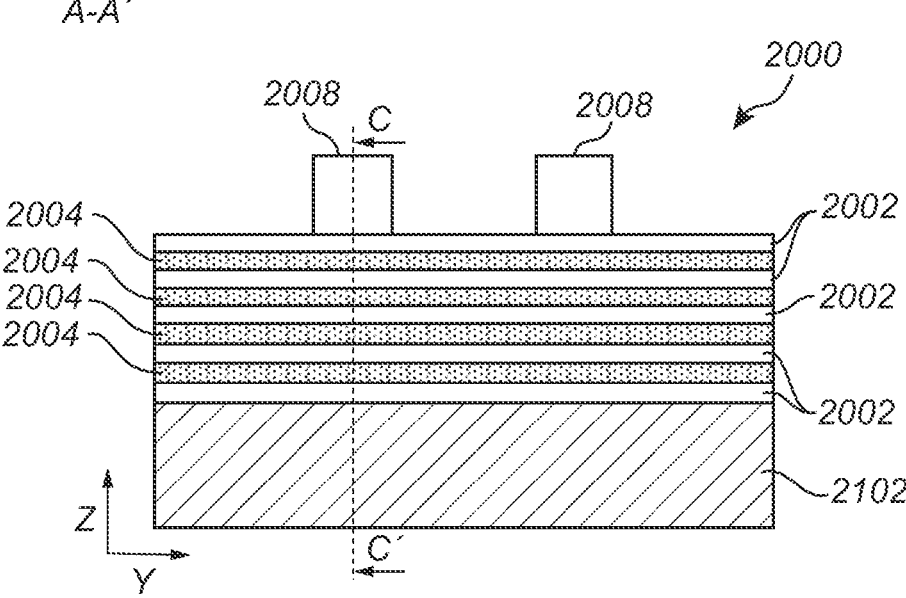
Figure 29A:
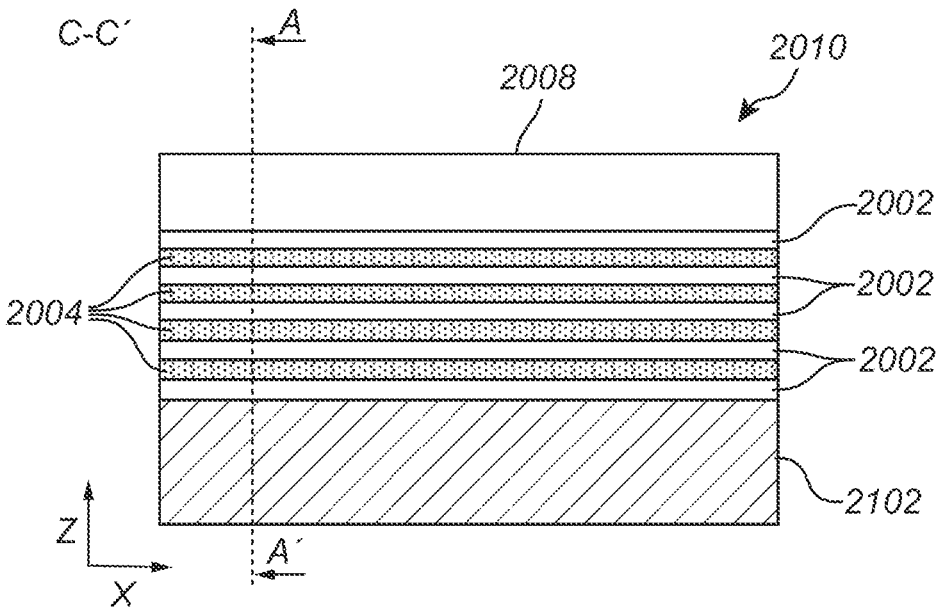
FIGS. 29a-29b show a fin structure 2010 may be formed by patterning a preliminary fin structure 2010 in a layer stack 2000 formed on a substrate 2102 (e.g. corresponding to substrate 1102) and comprising an alternating sequence of sacrificial layers 2002 and channel layers 2004.
Figure 29B:
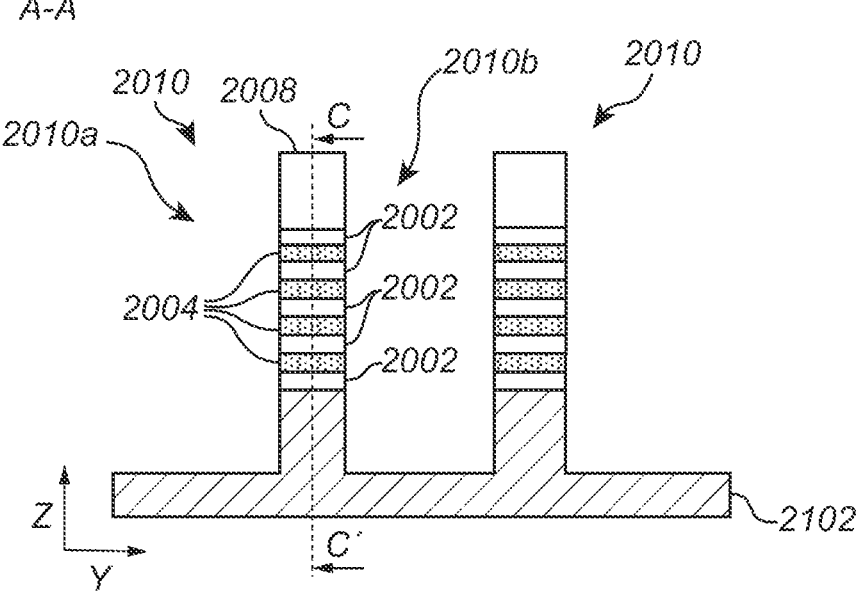

In FIGS. 26a-26b, source/drain contacts 1054 have been formed on the source/drain bodies 1120. The contacts 1054 may be formed as shown as wrap-around contacts, i.e. wrapping around the common body portions 1122. Source/drain contact trenches may be patterned in the dielectric layer 1052 and the liner 1012/CESL may be opened along the first side 1010a (e.g. using lithography and etching) and one or more contact metals may be deposited therein to form the source/drain contacts 1054. Examples of contact metals include W, Al, Ru, Mo and Co. The contact metal(s) may be recessed using a metal etch back process to form recessed contacts 1054. The recessed contacts 1054 may then be covered by a dielectric to restore the dielectric layer 1052 over the source/drain contacts 1054. CMP may be applied to the dielectric layer 1052. The dielectric layer 1052 may as shown be recessed (e.g. by CMP and/or etch back) to bring its upper surface flush with an upper surface of the capping 1008.

In the above a process for forming a FET device of the first type, e.g. FET device 100, has mainly been described with reference to a limited number of examples. However, as is readily appreciated by a person skilled in the art, other examples than the ones disclosed above are equally possible.

For example, the epitaxy of the source/drain bodies 1120 discussed with reference to FIGS. 22a-22b may be stopped before forming merged common semiconductor body portions 1122. In this case, the (metal) source/drain contacts 1054 may define common (metal) body portions 1122, wrapping around ends of the prongs 1124. Also in a case where merged common semiconductor body portion 1122 are formed, the contacts 1054 may be considered to form part of the common body portions 1122, wherein the common body portions 1112 may be formed as combined semiconductor-metal common body portions.

According to a further example, instead of epitaxial source/drain body portions and/or prongs, metal source/drain bodies 1120 comprising metal source/drain prongs 1124 and metal source/drain body portions 1122 may be formed, e.g. by depositing metal in the cavities 1048 and trenches 1051. Metal source/drain prongs 1124 may for example be combined with channel layers formed by thin-film or 2D materials, such as a transition metal dichalcogenide (MX$_2$) or IGZO.

According to a further example, an ion implantation process may be omitted. This may result in an overall reduction of process complexity, albeit at a cost of less precise control during e.g. the etching of the cavities 1032, 1048 and 1060. The method may according to such an example proceed directly from the stage depicted in FIGS. 9a and 9b to the stage depicted in FIGS. 12a and 12b wherein the liner 1012 has been partially opened. The liner 1012 may in this case be opened using the above discussed dedicated liner opening mask defined for the purpose of opening the liner 1012 to expose each of the first and second fin parts 1010s, 1010d in a respective source/drain region 1030 on opposite sides of a gate region 1028. The method may then proceed as further outlined above in connection with FIGS. 13a and 13b and onwards with the difference that there will be no difference in doping concentrations between the first, second and third parts 1010s, 1010d, 1010c.

According to an alternative to the process steps discussed with reference to FIGS. 8a-8b and 9a-9b, comprising replacing the first sacrificial layers 1002 of the first semiconductor material with the first dielectric layers 1022 of the first dielectric material shown, a fin structure 1010 with the layer structure shown in FIGS. 9a-9b may instead be formed by patterning such a fin structure in a multi-layered SOI structure formed by epitaxy and/or layer transfer techniques (e.g. Si/SiO$_2$/Si/SiGe/SiO$_2$/Si/SiGe . . . ).

Figure 21A:
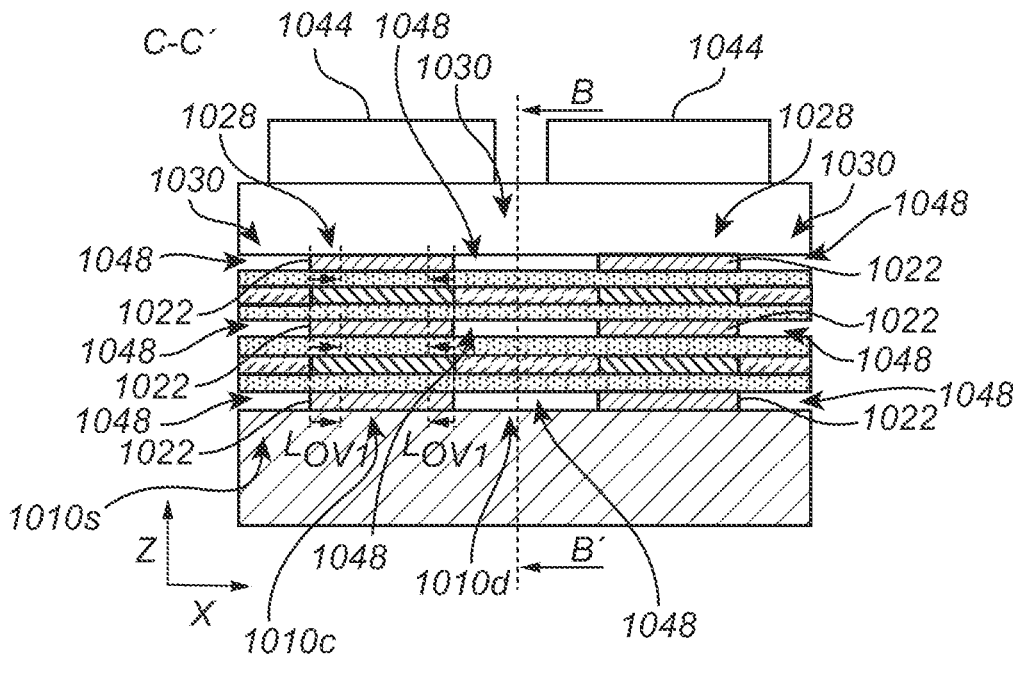
FIGS. 21a-21b show dummy material 1049 removed from the cavities 1048 while masking the fin structure from the second side 1010b.
Figure 21B:
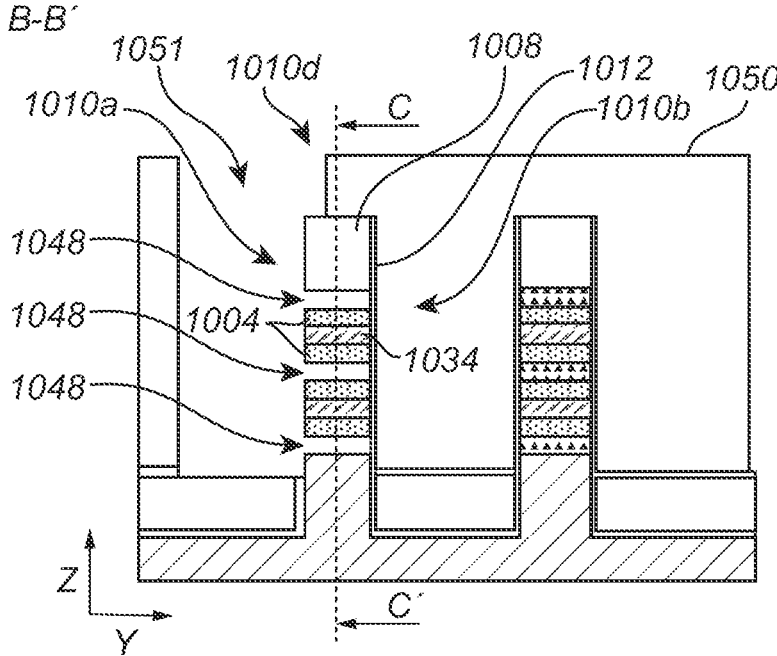

According to an alternative to the process steps discussed with reference to FIGS. 21a-21b and onwards, a dielectric cover layer corresponding to layer 1052 may be formed instead of the cover layer 1050. Trenches corresponding to trenches 1051 may then be formed in the dielectric cover layer, the dummy material 1049 may be removed and source/drain bodies 1120 may be formed in the cavities 1048 and the trenches. The trenches may be filled with dielectric to restore the cover layer. Contact trenches may subsequently be formed and source/drain contacts may be formed therein (e.g. after repeating the processing at further fin structures).

Embodiments of methods for forming a FET device of the second type, e.g. the FET device 200, will now be described with reference to FIGS. 28a-28b through 35a-35b. In the following figures, elements are numbered 2NNN, respectively, wherein the last three digits NNN corresponds to an element 1NNN discussed in connection with FIGS. 4a-4b through 27a-27b. To avoid undue repetition, a description of like elements will not be repeated.

As discussed above, the FET device 200 differs from the FET device 100 among others in that while the source and drain prongs 224, 234 of the FET device 200 are level with the channel layers 112, the source and drain prongs 124, 134 of the FET device 100 are offset vertically from both the gate prongs 144 and the channel layers 150. In view of this, the FET device 200 may be formed by applying many of the process steps discussed with reference to the FET device 100 to a fin structure 2020 comprising a layer stack of an alternative composition. The layer stack may comprise channel layers 2004 (e.g. corresponding to channel layers 1004) and non-channel layers 2022 (e.g. corresponding to the first dielectric layers 1022) alternating the channel layers 2004, wherein each non-channel layer 2022 is formed of a same first layer material, e.g. a first dielectric material.

With reference to FIGS. 28a-28b and 29a-29b, such a fin structure 2010 may be formed by patterning a preliminary fin structure 2010 in a layer stack 2000 formed on a substrate 2102 (e.g. corresponding to substrate 1102) and comprising an alternating sequence of sacrificial layers 2002 and channel layers 2004. The sacrificial layers 2002 may be formed of a sacrificial semiconductor material different from a channel material of the channel layers 2004 and the first layer material of the non-channel layers 2022 to be formed. The sacrificial layers and channel layers 2002, 2004 may similar to the first sacrificial layers 1002 and the channel layers 1004 be formed of epitaxial semiconductor material, e.g. SiGe$_y$ and SiGe$_x$, respectively, wherein $0 \leq x < y$, for example y=x+d with d≥0.25.

Figure 30A:
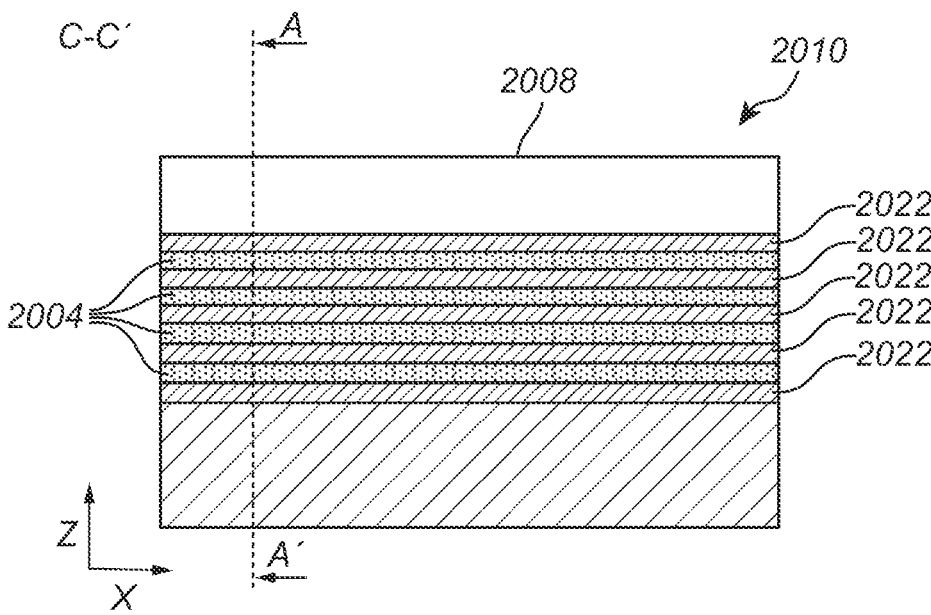
FIGS. 30a-30b show a resulting fin structure 2010 wherein a liner 2012 (e.g. corresponding to liner 1012) has been formed along the first and second sides 2010a, 2010b of the fin structure 2010. A fill layer 2014 (e.g. corresponding to fill layer 1014) has further been formed, embedding the fin structure 2010.
Figure 30B:
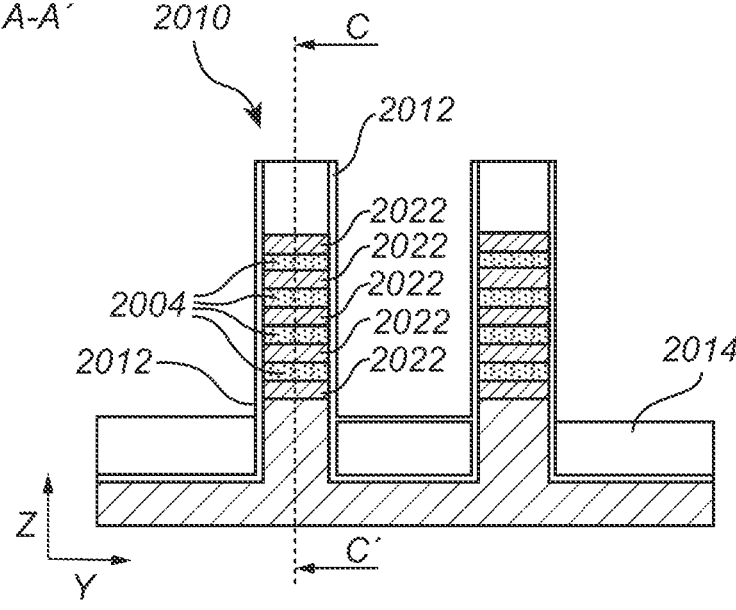

The sacrificial layers 2002 may subsequently be replaced with the non-channel layers 2022 by applying process steps to the fin structure 2010 corresponding to the process steps described above in connection with FIGS. 7a-7b and 8a-8b for replacing the sacrificial layers 1002 with the first dielectric layers 1022: depositing a process material embedding the preliminary fin structure 2010, forming a trench in the process material, alongside the preliminary fin structure 2010, removing the sacrificial layers 2002 by selectively laterally etching the sacrificial material from the trench to form longitudinal gaps in the fin structure 2010, and subsequently filling the gaps with the first layer/dielectric material to form the non-channel layers 2022 alternatingly with the channel layers 2004. A resulting fin structure 2010 is shown in FIGS. 30a-30b, wherein additionally a liner 2012 (e.g. corresponding to liner 1012) has been formed along the first and second sides 2010a, 2010b of the fin structure 2010. A fill layer 2014 (e.g. corresponding to fill layer 1014) has further been formed, embedding the fin structure 2010.

Figure 31A:
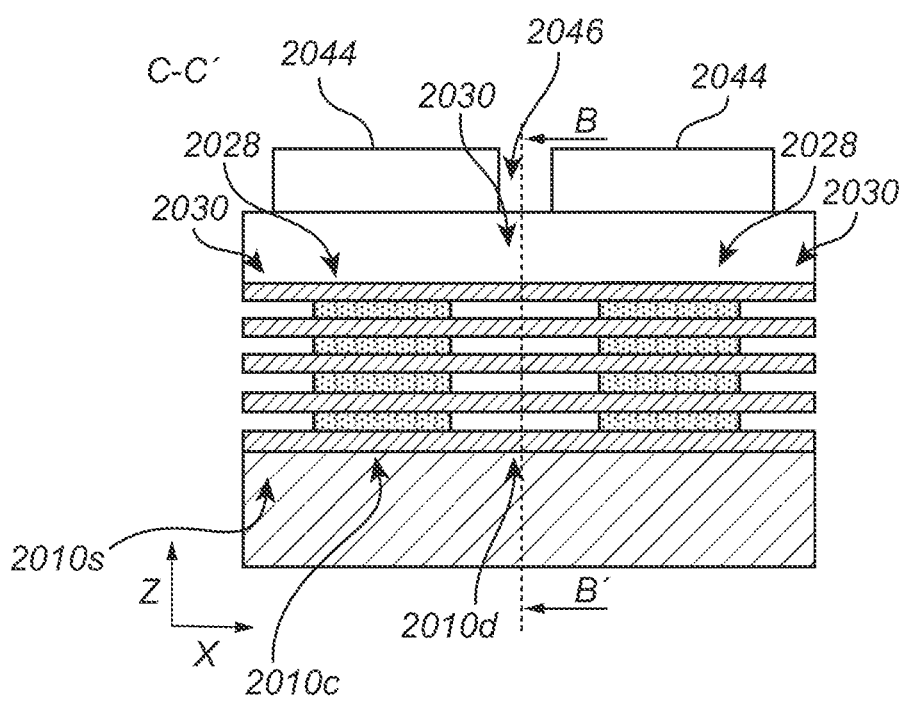
FIGS. 31a-31b shows forming source and drain cavities 2048 in the channel layers 2004 in a first and a second fin part 2010s, 2010d in respective source/drain regions 2030 by etching each of the first and second fin parts 2010s, 2010d laterally from each of first and second sides 2010a, 2010b.
Figure 31B:
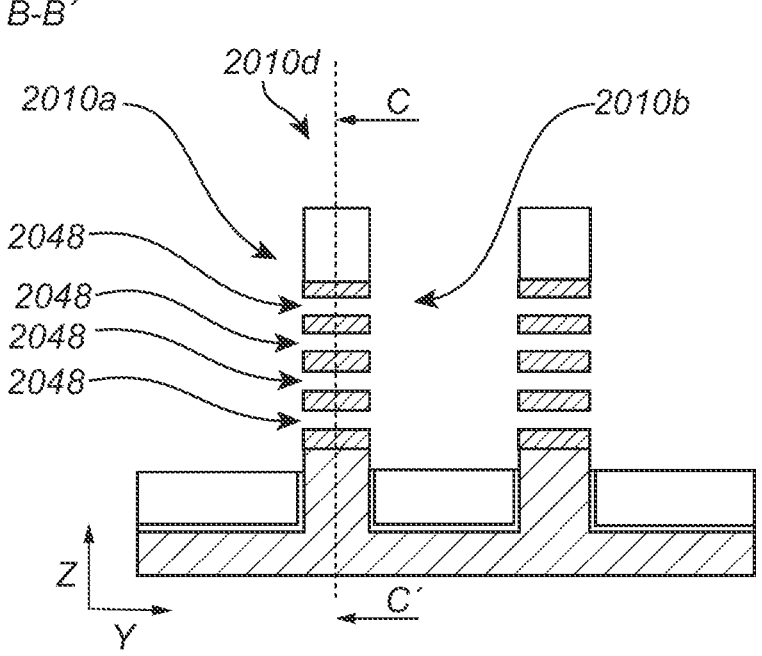
Figure 32A:
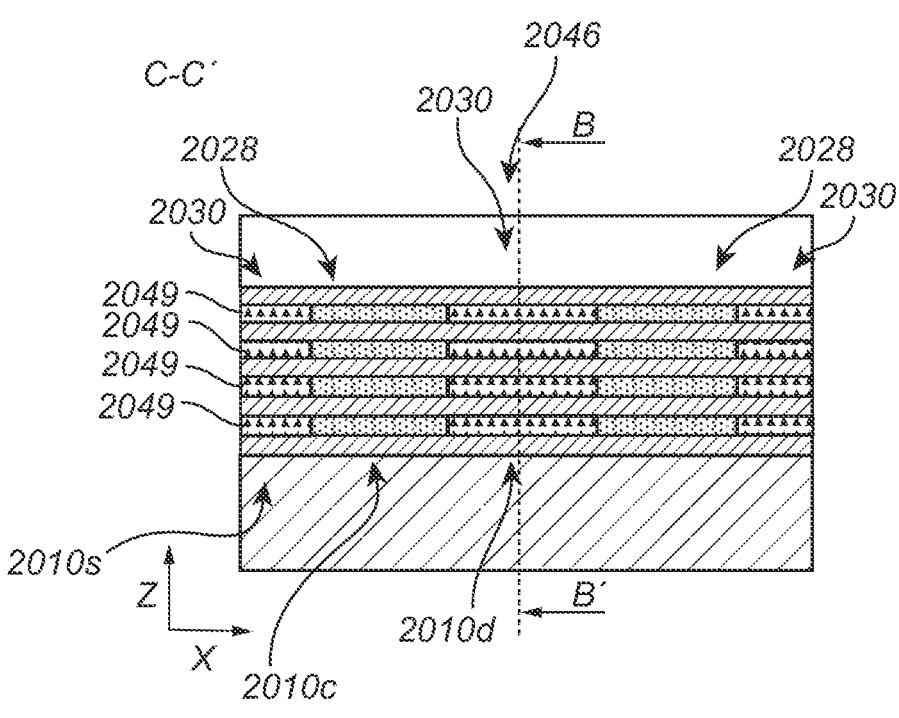
FIGS. 32a-32b show filling the source and drain cavities 2048 of FIGS. 31a-31b with a dummy material 2049.
Figure 32B:
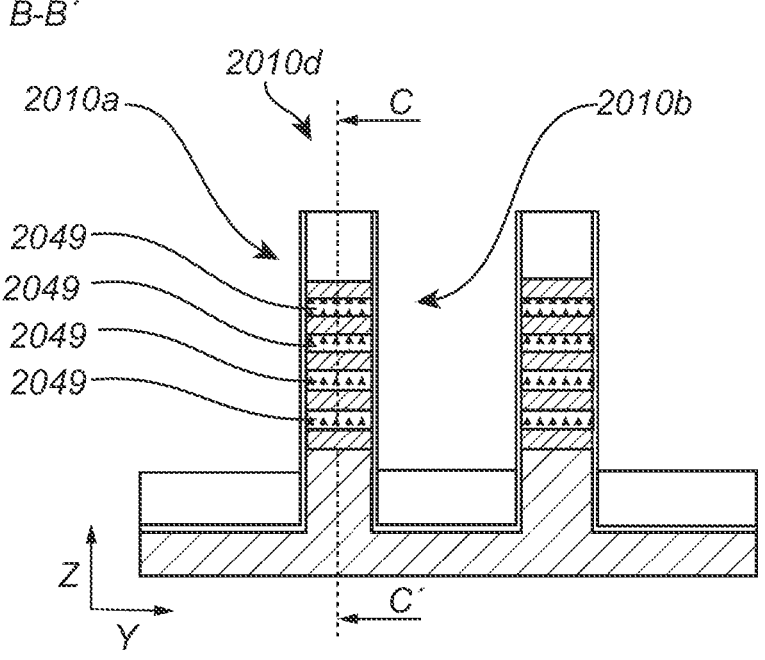
Figure 33A:
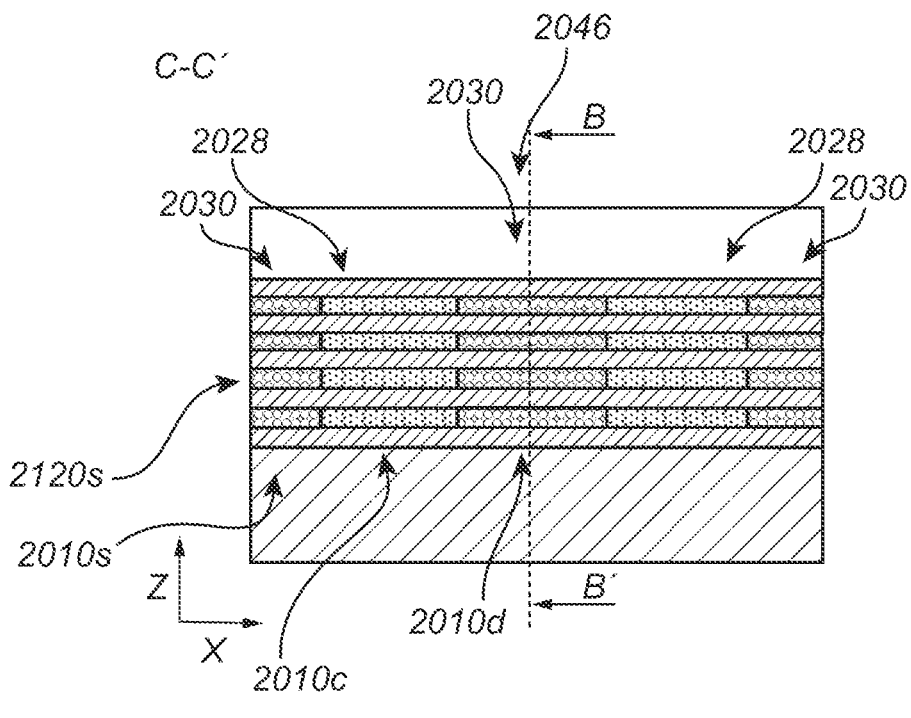
FIGS. 33a-33b show masking the fin structure 2010 from the second side 2010b: removing the dummy material from the source and drain cavities by etching from the first side 2010a and subsequently forming a source body and a drain body 2120s, 2120d.
Figure 33B:
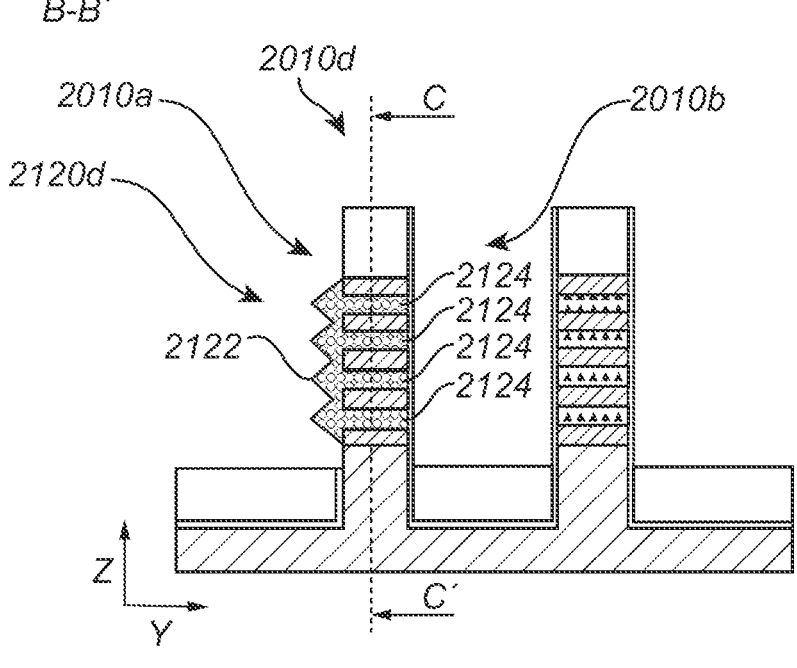
Figure 34A:
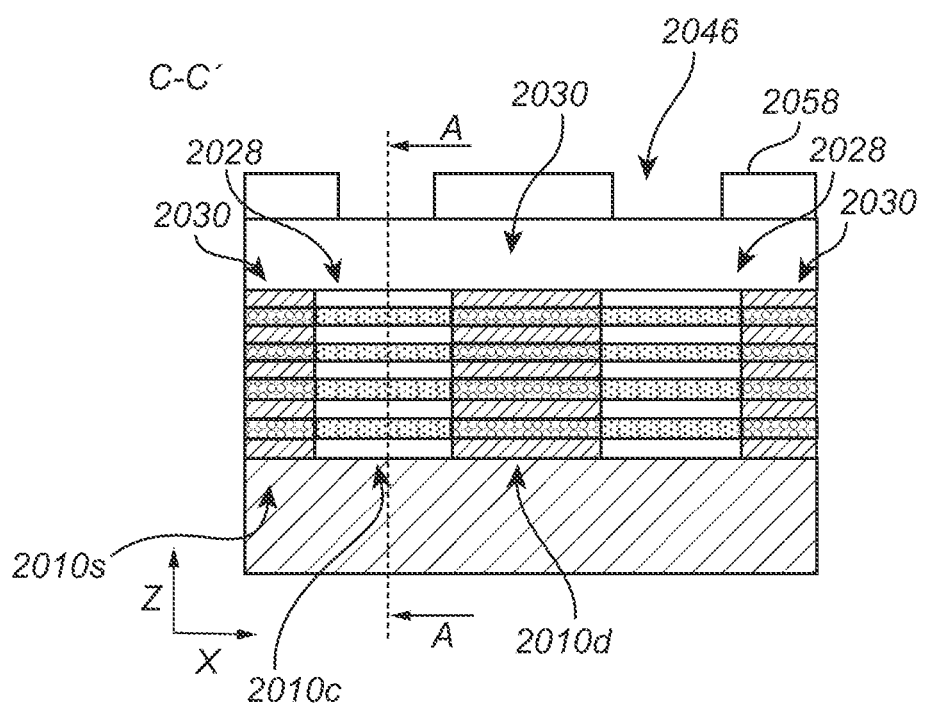
FIGS. 34a-34b show that while masking the fin structure 2010 from the first side 2010a: forming a set of gate cavities 2060 in the non-channel layers 2022 in a third fin part 2010c by etching the third fin part 2010c laterally from the second side 2010b, and subsequently, forming a gate body 2140.
Figure 34B:
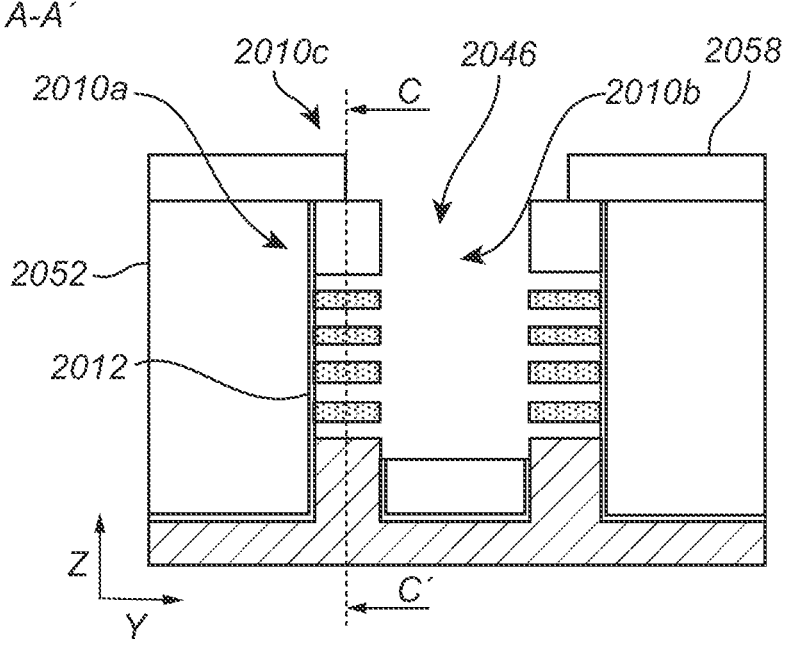
Figure 35A:
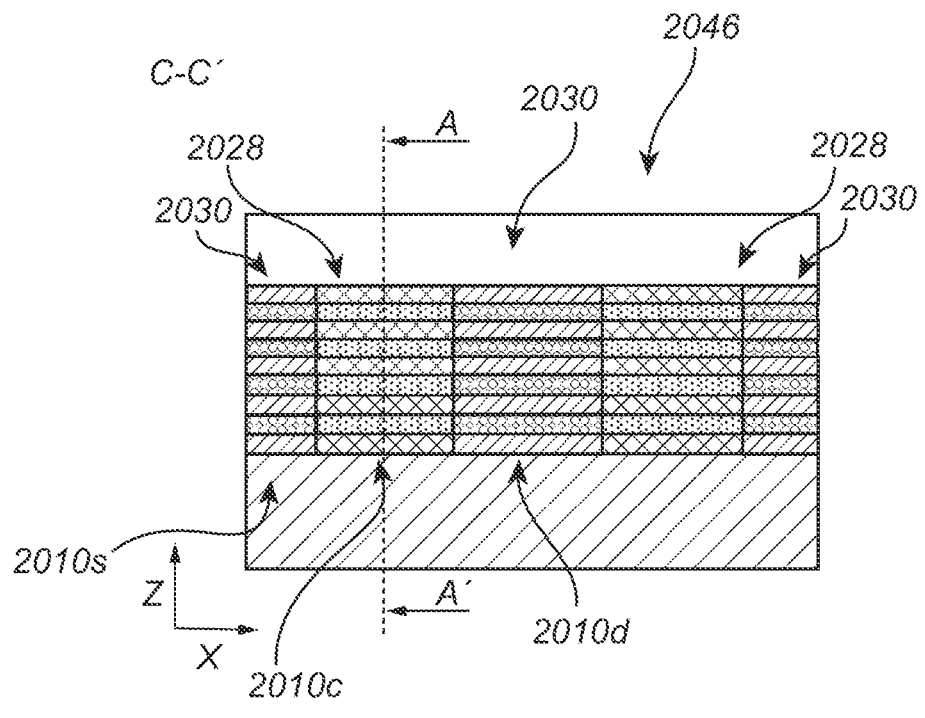
Figure 35B:
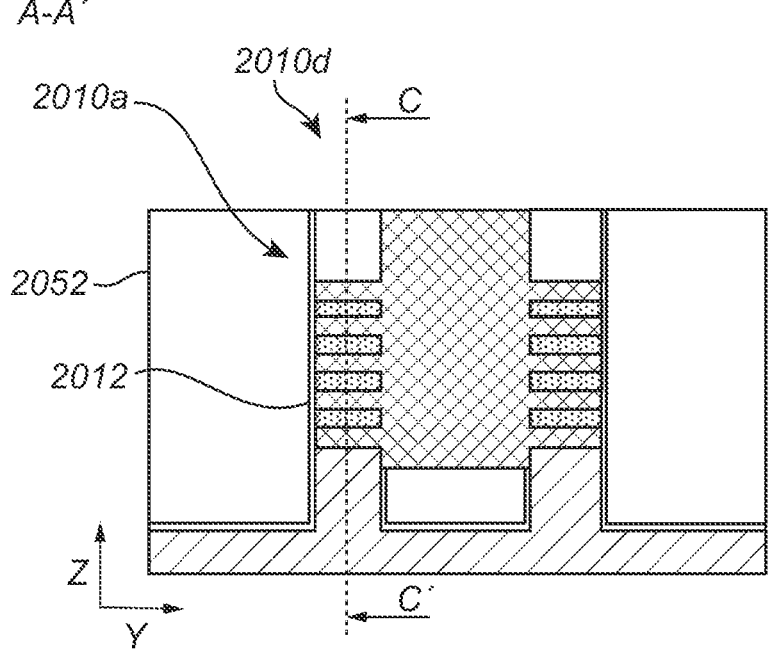

After an optional ion implantation step as described in connection with FIGS. 10a-10b through 12a-12b, the method may subsequently proceed with:

forming source and drain cavities 2048 in the channel layers 2004 in a first and a second fin part 2010s, 2010d in respective source/drain regions 2030 by etching each of the first and second fin parts 2010s, 2010d laterally from each of first and second sides 2010a, 2010b (e.g. FIGS. 31a-31b);

filling the source and drain cavities 2048 with a dummy material 2049 (e.g. FIGS. 32a-32b);

while masking the fin structure 2010 from the second side 2010b: removing the dummy material from the source and drain cavities by etching from the first side 2010a and subsequently forming a source body and a drain body 2120s, 2120d (e.g. FIGS. 33a-33b); and while masking the fin structure 2010 from the first side 2010a: forming a set of gate cavities 2060 in the non-channel layers 2022 in a third fin part 2010c by etching the third fin part 2010c laterally from the second side 2010b, and subsequently, forming a gate body 2140 (e.g. FIGS. 34a-34b and FIGS. 35a-35b).

Source/drain contacts may subsequently be formed on the source/drain bodies 2120s, 2120d as described in connection with FIGS. 26a-26b. The additional variations of the above method for forming the FET device of the first type apply correspondingly to the present method, e.g. the epitaxy may be stopped before forming merged common semiconductor body portions 2122, metal source/drain bodies instead of semiconductor-comprising source/drain bodies may be formed, non-Si-based channel layers may be used, and/or the fin structure 2010 may alternatively be formed by patterning a multi-layered SOI structure formed by epitaxy and/or layer transfer techniques (e.g. $SiO_2/Si/SiO_2/Si/SiO_2/$).

The invention claimed is:

1. A method for forming a field-effect transistor device, the method comprising:

forming a fin structure comprising a layer stack comprising channel layers and non-channel layers alternating the channel layers, the fin structure comprising a first fin part, a second fin part and a third fin part intermediate the first and second fin parts;

etching each of the first and second fin parts laterally from each of first and second opposite sides of the fin structure such that a set of source cavities extending through the first fin part is formed in a first set of layers of the layer stack, and such that a set of drain cavities extending through the second fin part is formed in the first set of layers of the layer stack;

filling the source and drain cavities with a dummy material;

while masking the fin structure from the second side:

removing the dummy material from the source and drain cavities by etching from the first side, and subsequently, forming a source body and a drain body, each comprising a respective common body portion along the first side and a set of prongs protruding from the respective common body portion into the source and drain cavities, respectively, and abutting the channel layers; and while masking the fin structure from the first side:

etching the third fin part laterally from the second side such that a set of gate cavities extending through the third fin part is formed in a second set of layers defined by the non-channel layers of the layer stack, the first set of layers are of a material that is different than that of the second set of layers, and subsequently, forming a gate body comprising a common gate body portion along the second side and a set of gate prongs protruding from the common gate body portion into the gate cavities.

2. The method according to claim 1, wherein the channel layers are of a channel material and the non-channel layers are alternatingly first non-channel layers of a first layer material and second non-channel layers of a second layer material, and wherein the etching of the first fin part and the second fin part to form the source and drain cavities comprises selectively etching the first layer material, and wherein the etching of the third fin part to form the gate cavities comprises selectively etching the second layer material.

3. The method according to claim 2, wherein the first layer material is a first dielectric material.

4. The method according to claim 3, wherein forming the fin structure comprises:

forming a preliminary fin structure comprising the channel layers and non-channel layers alternating the channel layers, the non-channel layers being alternatingly sacrificial layers of a sacrificial semiconductor material and the second non-channel layers of the second layer material;

forming a support structure in abutment with the preliminary fin structure; and while the support structure supports the preliminary fin structure, replacing the sacrificial layers with the first non-channel layers.

5. The method according to claim 2, further comprising, prior to forming the source and drain cavities:

etching each of the first and second fin parts laterally from each of the first and second sides such that a set of cavities extending through the first and second fin parts is formed in the second non-channel layers, and filling the cavities with a second dielectric material to form second dielectric layers in the cavities.

6. The method according to claim 5, wherein the etching of the third fin part to form the gate cavities comprises selectively etching the second layer material from the second side to remove the second layer material remaining between the second dielectric layers.

7. The method according to claim 2, wherein at least one of the source and drain cavities are etched to extend partly into the third fin part or the gate cavities are etched to extend partly into the first and second fin parts.

8. The method according to claim 1, wherein the non-channel layers are of a first layer material and the channel layers are of a channel material, wherein the etching of the first fin part and the second fin part to form the source and drain cavities comprises selectively etching the channel material, and a wherein forming the set of gate cavities comprises selectively etching the first layer material.

9. The method according to claim 8, wherein the first layer material is a first dielectric material.

10. The method according to claim 1, further comprising, subsequent to the filling of the source and drain cavities with the dummy material:

depositing a cover material along the first and second sides of the fin structure; and forming openings in the cover material along the first and second fin parts to expose each of the first and second fin parts from only the first side; and wherein the method subsequently comprises conducting the removing of the dummy material and the forming of the source and drain bodies via the openings in the cover material.

11. The method according to claim 10, wherein the cover material is conformally deposited.

12. The method according to claim 1, further comprising forming a gate trench along the third fin part to expose the third fin part from only the second side, wherein the gate trench is formed in an insulating material deposited along the first and second sides of the fin structure, and wherein the etching of the third fin part and the forming of the gate body are conducted via the gate trench.

13. The method according to claim 12, wherein the etching of the third fin part and the forming of the gate body are conducted subsequent to forming the source and drain bodies, and wherein the method comprises depositing the insulating material to embed the fin structure and the source and drain bodies.

14. The method according to claim 1, wherein forming the source and drain bodies comprises epitaxially growing a source/drain material in the set of source cavities and the set of drain cavities to form prongs therein, and further growing the source/drain material on the prongs such that the source/drain material merges to form a respective common body portion of the source and drain bodies.

15. The method according to claim 1, further comprising subjecting the first and second fin parts to an ion implantation process while masking the third fin part from the ion implantation process.

* * * * *